US011296052B2

United States Patent
Meyers et al.

(10) Patent No.: US 11,296,052 B2
(45) Date of Patent: Apr. 5, 2022

(54) TSV-LESS DIE STACKING USING PLATED PILLARS/THROUGH MOLD INTERCONNECT

(71) Applicant: Intel Corporation, Santa Clara, CA (US)

(72) Inventors: Preston T. Meyers, Chandler, AZ (US); Javier A. Falcon, Chandler, AZ (US); Shawna M. Liff, Scottsdale, AZ (US); Joe R. Saucedo, Phoenix, AZ (US); Adel A. Elsherbini, Chandler, AZ (US); Albert S. Lopez, Tempe, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/639,085

(22) PCT Filed: Sep. 30, 2017

(86) PCT No.: PCT/US2017/054670
§ 371 (c)(1),
(2) Date: Feb. 13, 2020

(87) PCT Pub. No.: WO2019/066986
PCT Pub. Date: Apr. 4, 2019

(65) Prior Publication Data
US 2020/0212012 A1    Jul. 2, 2020

(51) Int. Cl.
*H01L 25/065*    (2006.01)
*H01L 25/00*    (2006.01)

(52) U.S. Cl.
CPC .......... *H01L 25/0657* (2013.01); *H01L 25/50* (2013.01); *H01L 2225/06513* (2013.01);
(Continued)

(58) Field of Classification Search
CPC ................. H01L 25/0657; H01L 25/50; H01L 2225/06513; H01L 2225/06524; H01L 2225/06548; H01L 2225/06562
See application file for complete search history.

(56) References Cited

U.S. PATENT DOCUMENTS 9,685,429 B2    6/2017    Hu
2008/0054437 A1    3/2008    Hwang
(Continued)

FOREIGN PATENT DOCUMENTS

WO    WO-2017-039581        3/2017
WO    WO-2017039581 A    *    3/2017    ............. H01L 24/24

OTHER PUBLICATIONS

International Search Report and Written Opinion for International Patent Application No. PCT/US2017/054670 dated Jun. 28, 2018, 14 pgs.
(Continued)

*Primary Examiner* — Timor Karimy
(74) *Attorney, Agent, or Firm* — Schwabe, Williamson & Wyatt, P.C.

(57) ABSTRACT

A device package has substrates disposed on top of one another to form a stack, and pads formed on at least one of the top surface and the bottom surface of each of the substrates. The device package has interconnects electrically coupling at least one of the top surface and the bottom surface of each substrate to at least one of the top surface and the bottom surface of another substrate. The device package has pillars disposed between at least one of the top surface and the bottom surface of one or more substrates to at least one of the top surface and the bottom surface of other substrates. The device package also has adhesive layers formed between at least one of the top surface and the
(Continued)

bottom surface of one or more substrates to at least one of the top surface and the bottom surface of other substrates.

14 Claims, 35 Drawing Sheets

(52) U.S. Cl.
CPC ............... *H01L 2225/06524* (2013.01); *H01L 2225/06548* (2013.01); *H01L 2225/06562* (2013.01)

(56) References Cited

U.S. PATENT DOCUMENTS

| | | | |
|---|---|---|---|
| 2012/0106117 A1* | 5/2012 | Sundaram | ............... H01L 25/18 361/808 |
| 2014/0141566 A1 | 5/2014 | Schuetz | |
| 2017/0141088 A1* | 5/2017 | Zhai | ................... H01L 23/5389 |

OTHER PUBLICATIONS

International Preliminary Report on Patentability for International Patent Application No. PCT/US2017/054670 dated Apr. 9, 2020, 11 pgs.

\* cited by examiner

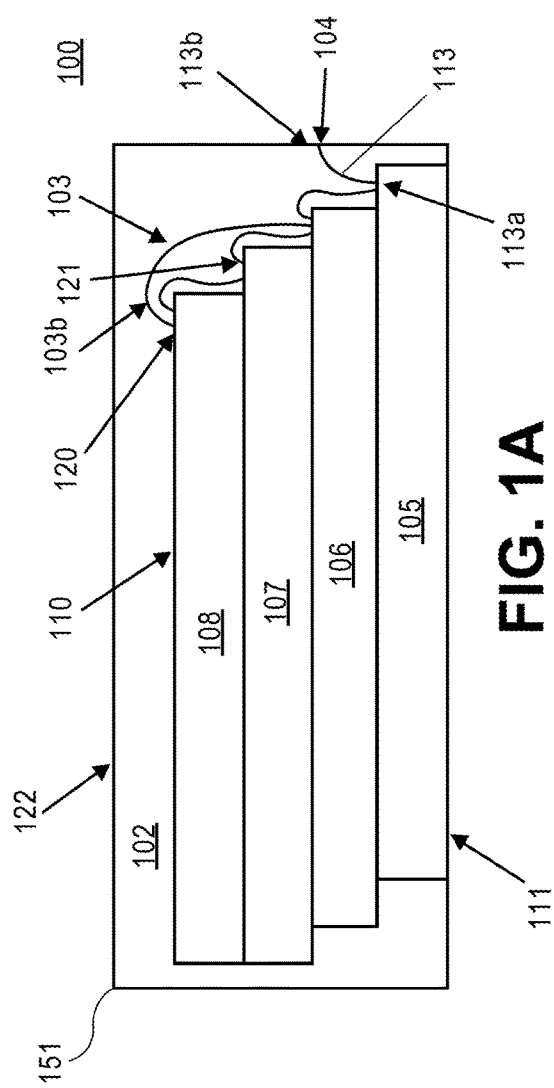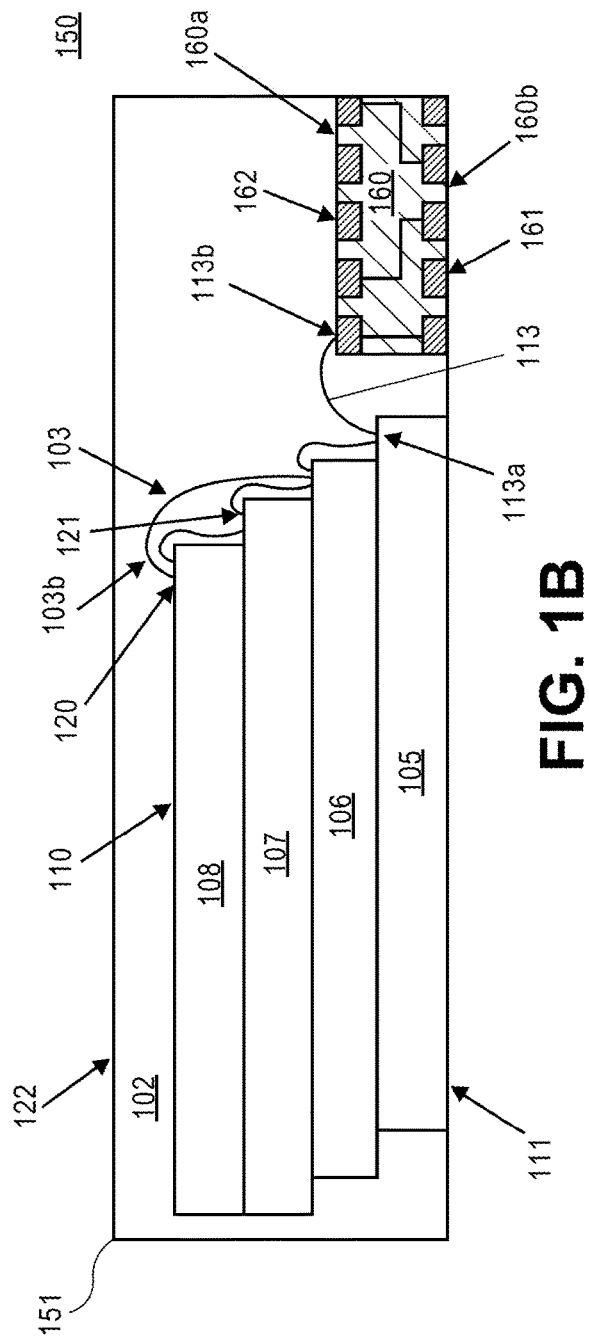
FIG. 1A
FIG. 1B

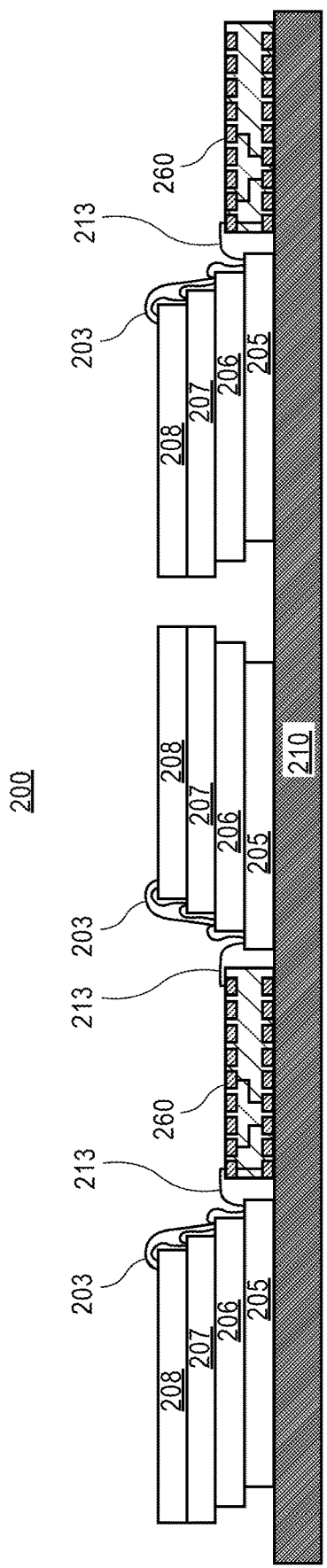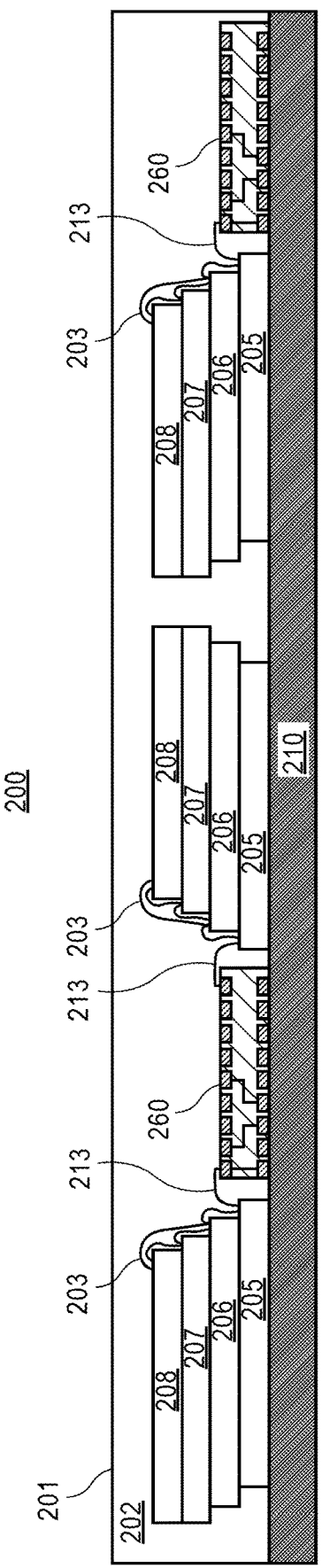

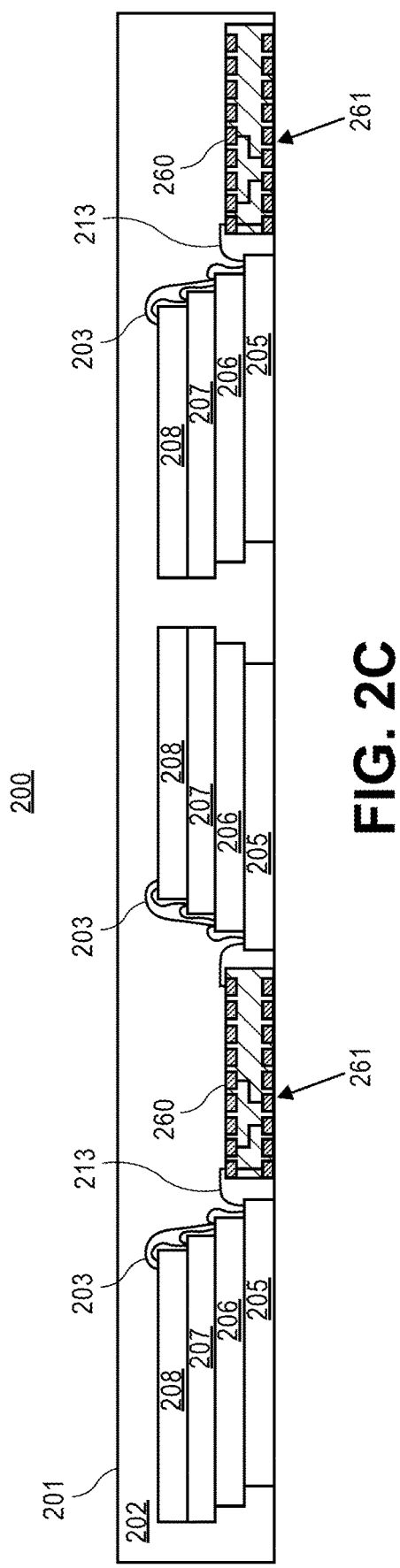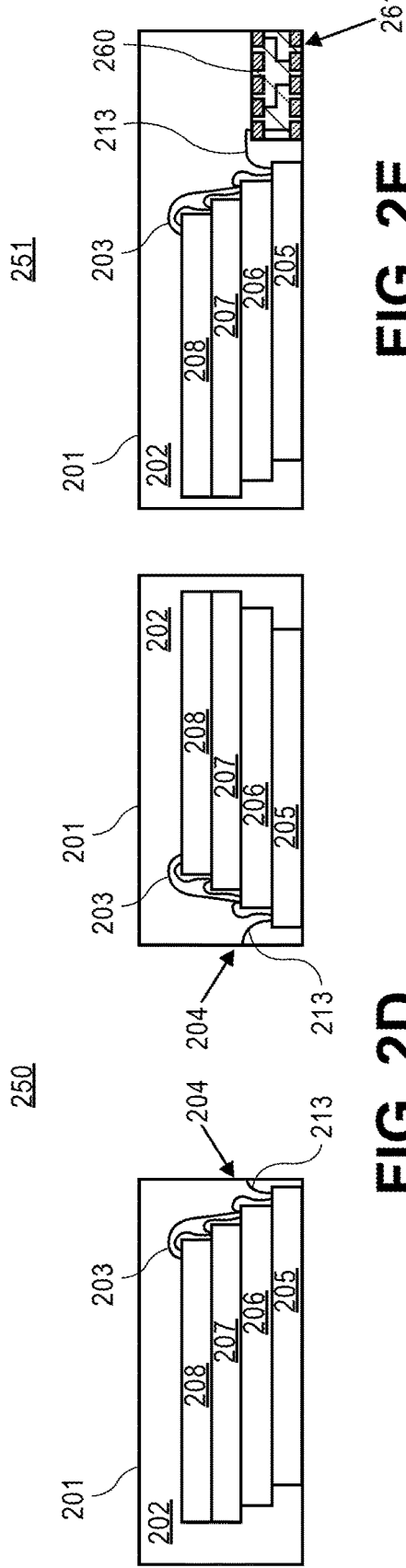

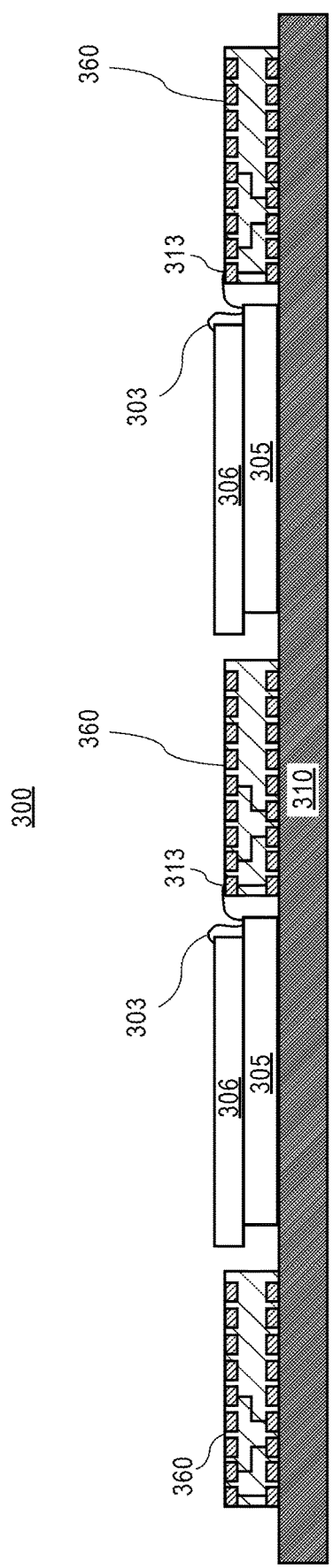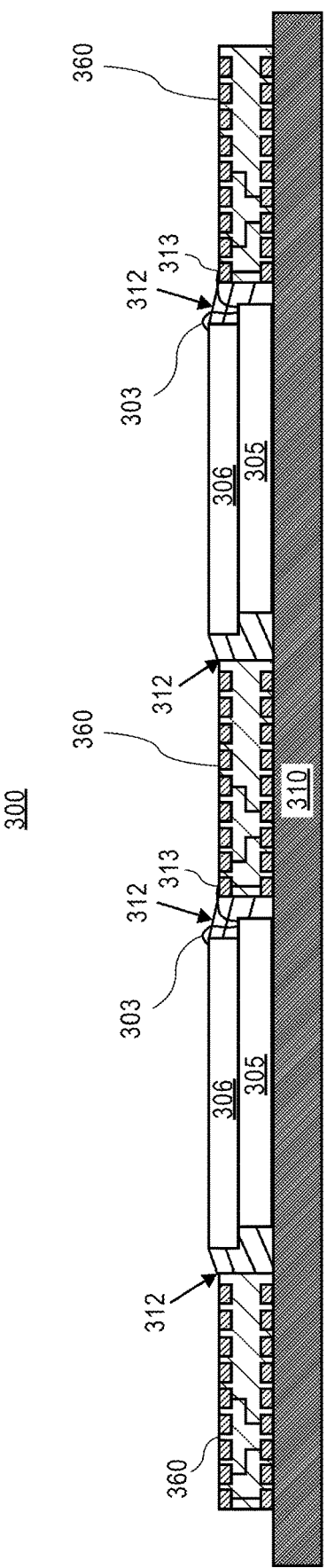
FIG. 3A
FIG. 3B

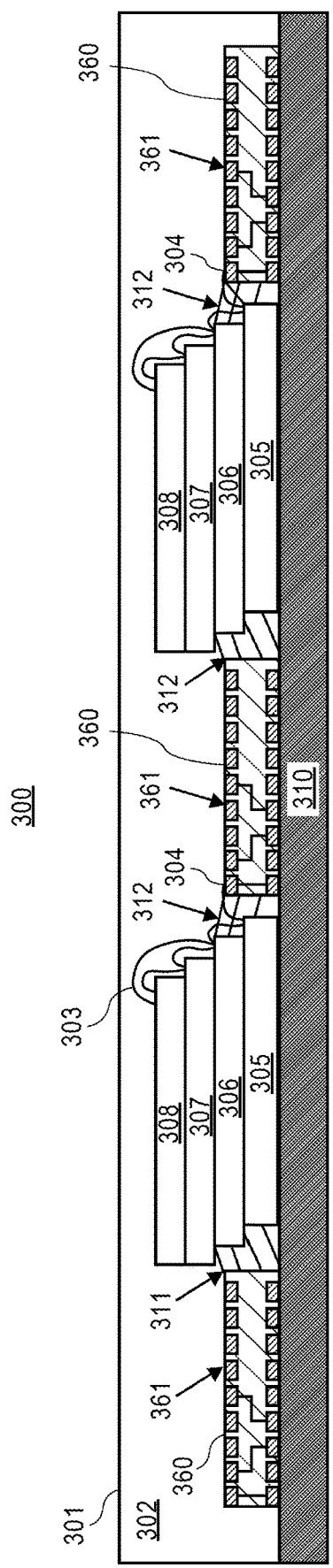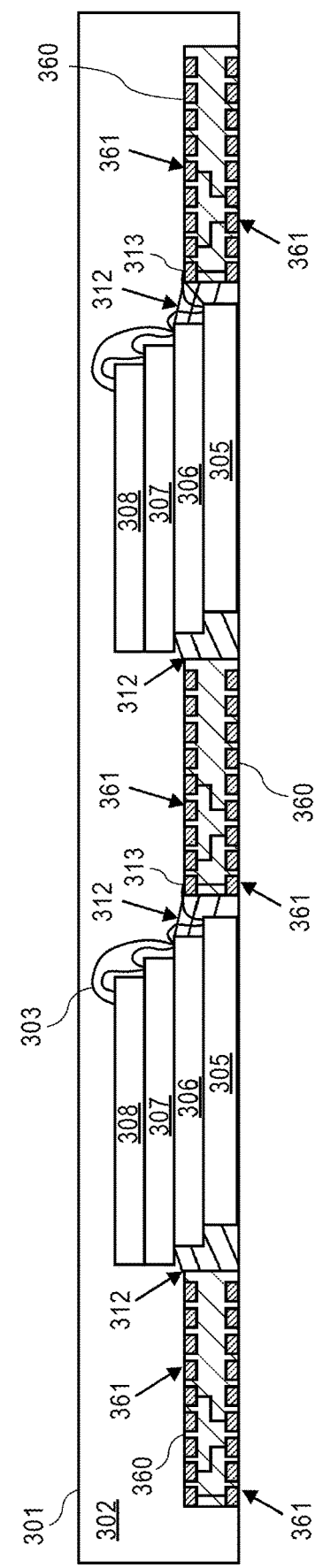

1000

```
┌─────────────────────────────────────────────────────────────┐
│ ELECTRICALLY COUPLE AT LEAST ONE DIE CONTACT TO A PAD ON A  │
│ SUBSTRATE WITH AT LEAST ONE OF THE INTERCONNECTS, WHEREIN THE│
│     SUBSTRATE IS ADJACENT TO THE PLURALITY OF DIES.         │
│                         1005                                │
└─────────────────────────────────────────────────────────────┘
                              │
                              ▼
┌─────────────────────────────────────────────────────────────┐
│ DISPOSE A PLURALITY OF DIES ON TOP OF ONE ANOTHER TO FORM A STACK, │
│ WHEREIN EACH DIE HAS A TOP SURFACE AND A BOTTOM SURFACE, WHEREIN │
│ EACH DIE HAS ONE OR MORE DIE CONTACTS ON THE TOP SURFACE AND/OR THE │
│ BOTTOM SURFACE THAT ARE EACH ELECTRICALLY COUPLED TO AT LEAST ONE │
│   DIE CONTACT OF ANOTHER DIE WITH ONE OR MORE INTERCONNECTS.│
│                         1010                                │
└─────────────────────────────────────────────────────────────┘
                              │
                              ▼
┌─────────────────────────────────────────────────────────────┐
│   FORM A MOLD LAYER OVER AND AROUND THE PLURALITY OF DIES, THE │
│       ONE OR MORE INTERCONNECTS, AND THE SUBSTRATE.         │
│                         1015                                │
└─────────────────────────────────────────────────────────────┘
                              │
                              ▼
┌─────────────────────────────────────────────────────────────┐
│  SEVER THE MOLD LAYER AND THE INTERCONNECT TO THE PAD ON THE │
│ SUBSTRATE TO FORM A SURFACE OF THE INTERCONNECT THAT IS COPLANAR │
│           WITH A SURFACE OF THE MOLD LAYER.                 │
│                         1020                                │
└─────────────────────────────────────────────────────────────┘
```

DISPOSE A FIRST SET OF DIES ON TOP OF ONE ANOTHER TO FORM A STACK, WHEREIN EACH DIE HAS A TOP SURFACE AND A BOTTOM SURFACE THAT IS OPPOSITE FROM THE TOP SURFACE, WHEREIN EACH DIE HAS ONE OR MORE DIE CONTACTS ON THE TOP SURFACE THAT ARE EACH ELECTRICALLY COUPLED TO AT LEAST ONE DIE CONTACT OF ANOTHER DIE WITH ONE OR MORE INTERCONNECTS.
1105

↓

DISPOSE A SUBSTRATE ADJACENT TO THE PLURALITY OF DIES, WHEREIN THE SUBSTRATE INCLUDES A FIRST SET OF PADS ON A TOP SURFACE AND A SECOND SET OF PADS ON A BOTTOM SURFACE THAT ARE OPPOSITE FROM THE TOP SURFACE.
1110

↓

ELECTRICALLY COUPLE AT LEAST ONE DIE CONTACT TO AT LEAST ONE PAD OF THE FIRST SET OF PADS ON THE SUBSTRATE WITH AT LEAST ONE OF THE INTERCONNECTS.
1115

↓

FORM A MOLD LAYER OVER AND AROUND THE PLURALITY OF DIES, THE ONE OR MORE INTERCONNECTS, AND THE SUBSTRATE, WHEREIN THE SECOND SET OF PADS ON THE BOTTOM SURFACE OF THE SUBSTRATE ARE EXPOSED.
1120

```
┌─────────────────────────────────────────────────────────────────┐
│ DISPOSE A SUBSTRATE HAVING A PLURALITY OF CAVITIES, A FIRST SET │
│           OF PADS, AND A SECOND SET OF PADS ON THE SUBSTRATE.   │
│                              1205                                │
└─────────────────────────────────────────────────────────────────┘
                                  ↓
┌─────────────────────────────────────────────────────────────────┐
│  DISPOSE A PLURALITY OF DEVICE PACKAGES ON THE PLURALITY OF     │
│                  CAVITIES OF THE SUBSTRATE.                      │
│                              1210                                │
└─────────────────────────────────────────────────────────────────┘
                                  ↓
┌─────────────────────────────────────────────────────────────────┐
│  FORM A PLURALITY OF INTERCONNECTS ON THE PLURALITY OF DEVICE   │
│  PACKAGES, WHEREIN EACH OF THE DEVICE PACKAGES IS ELECTRICALLY  │
│   COUPLED TO AT LEAST ONE PAD OF THE FIRST SET OF PADS BY ONE   │
│                      OF THE INTERCONNECTS.                       │
│                              1215                                │
└─────────────────────────────────────────────────────────────────┘
```

DISPOSE A SUBSTRATE HAVING A CAVITY AND ONE OR MORE PADS ON AT LEAST ONE OF A TOP SURFACE AND A BOTTOM SURFACE THAT IS OPPOSITE FROM THE TOP SURFACE.
1905

↓

EMBED A FIRST DIE IN THE CAVITY OF THE SUBSTRATE.
1910

↓

DISPOSE A SECOND DIE HAVING AN ADHESIVE LAYER ON A BOTTOM SURFACE OF THE SECOND DIE, WHEREIN THE SECOND DIE AND THE ADHESIVE LAYER ARE DISPOSED ON THE FIRST DIE AND THE SUBSTRATE.
1915

↓

DISPOSE A PLURALITY OF DIES DISPOSED ON THE SECOND DIE AND ON TOP OF ONE ANOTHER TO FORM A STACK, WHEREIN EACH DIE HAS A TOP SURFACE AND A BOTTOM SURFACE THAT IS OPPOSITE FROM THE TOP SURFACE, WHEREIN EACH DIE HAS ONE OR MORE DIE CONTACTS ON THE TOP SURFACE AND/OR THE BOTTOM SURFACE THAT ARE EACH ELECTRICALLY COUPLED TO AT LEAST ONE OF THE DIE CONTACTS OF ANOTHER DIE AND THE PADS OF THE SUBSTRATE WITH ONE OR MORE INTERCONNECTS.
1920

↓

FORM A MOLD LAYER OVER AND AROUND THE PLURALITY OF DIES, THE ONE OR MORE INTERCONNECTS, THE ONE OR MORE PADS OF THE SUBSTRATE, AND THE TOP SURFACE OF THE SUBSTRATE.
1925

FIG. 19

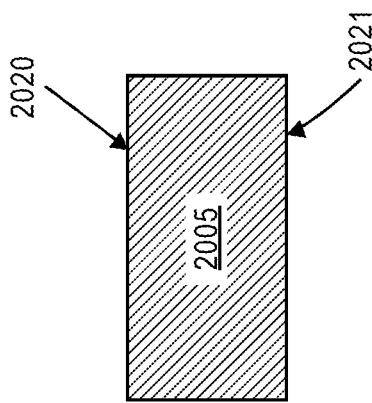
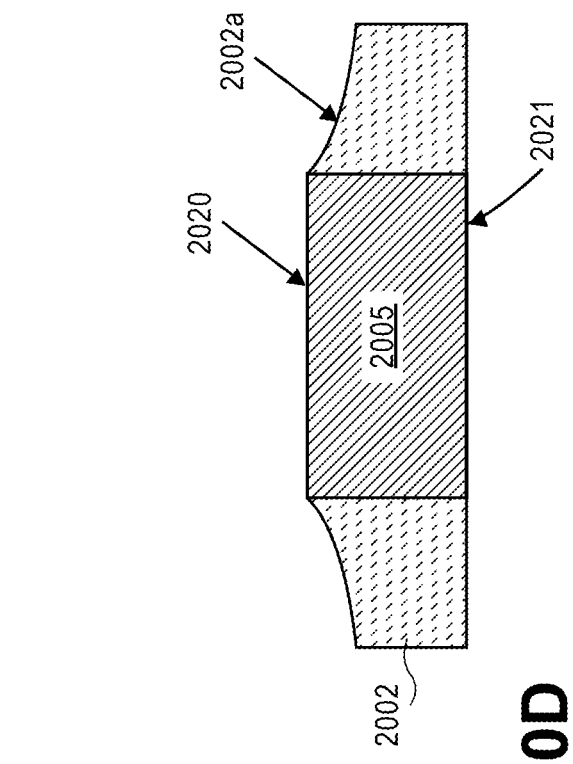
FIG. 20C
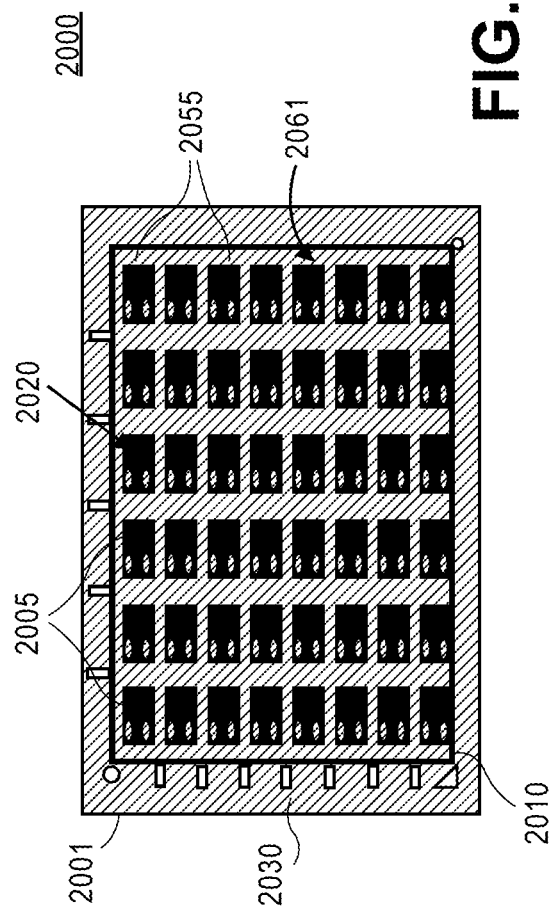
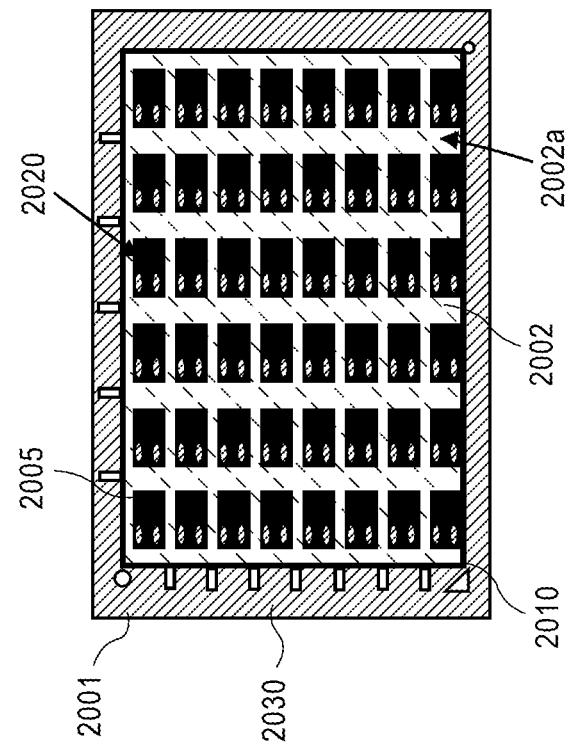
FIG. 20D

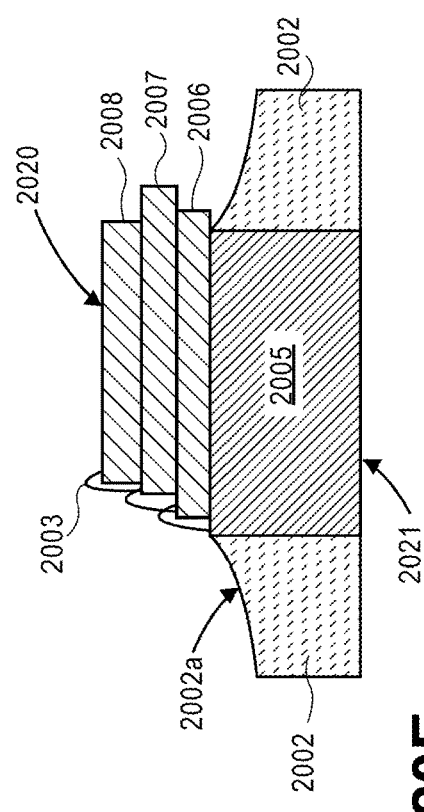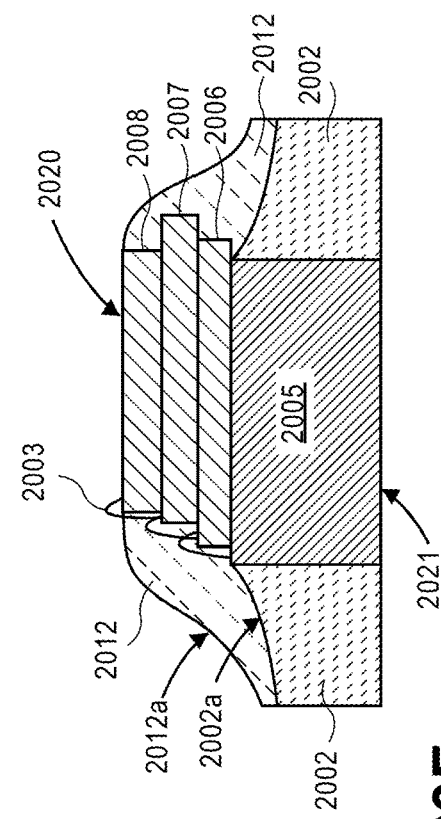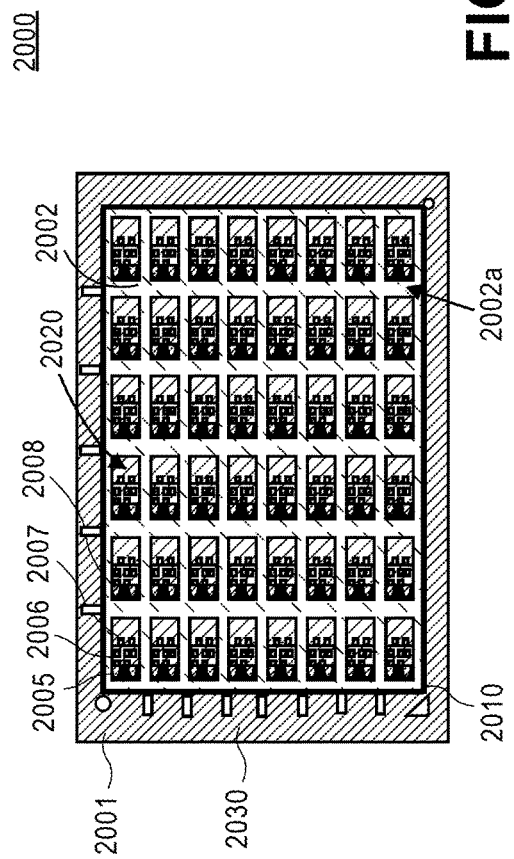
FIG. 20E
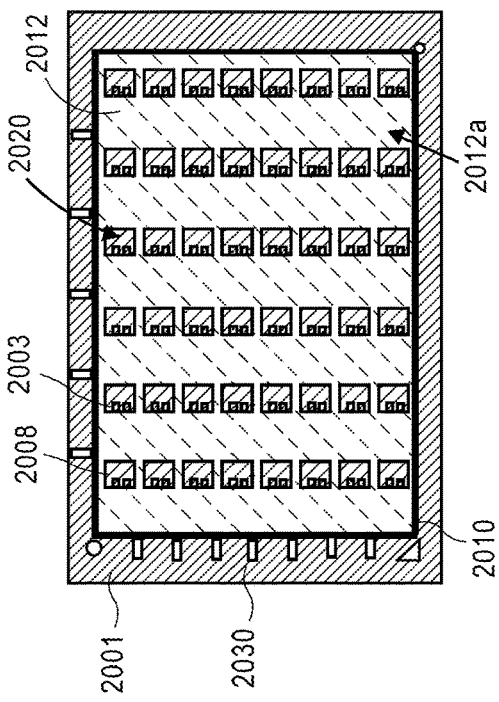
FIG. 20F

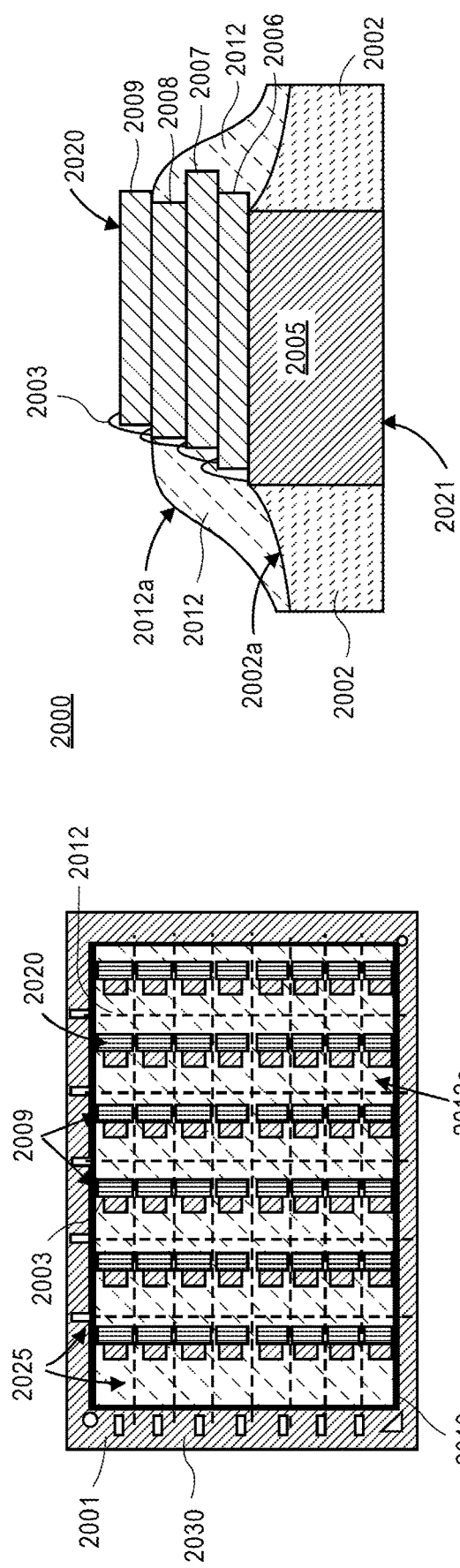
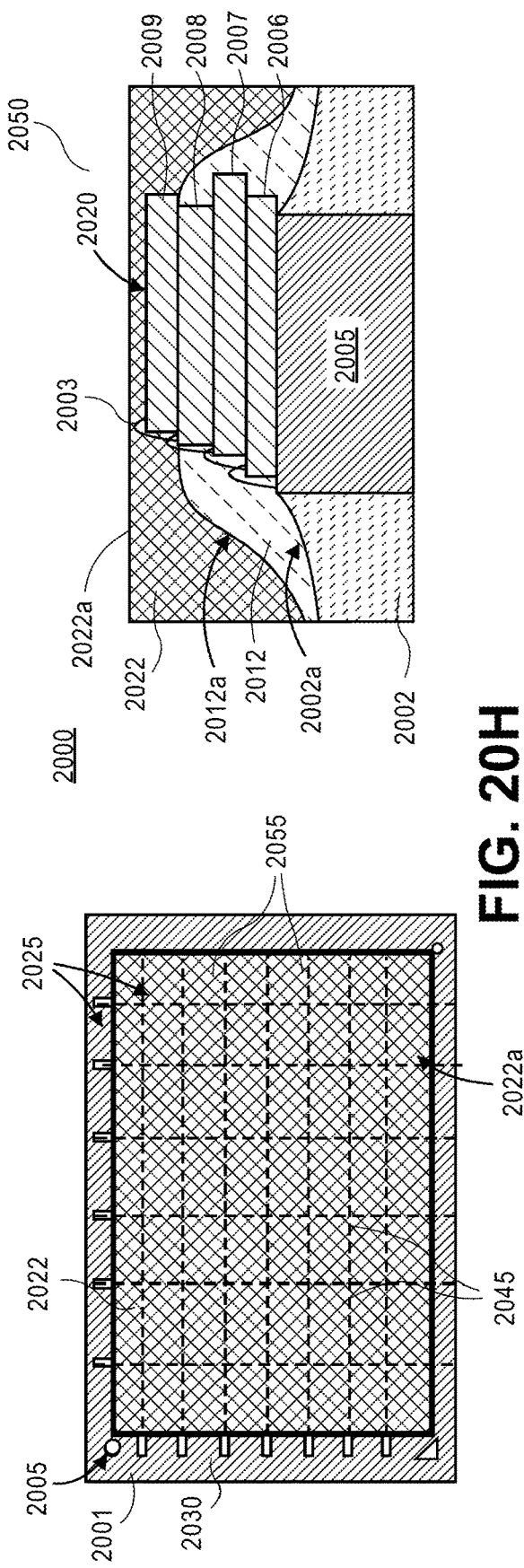
FIG. 20G
FIG. 20H

FORM A PANEL WITH A FIRST SET OF FIDUCIALS COVERED WITH AN ADHESIVE LAYER.
2105

↓

DISPOSES A DAM ON THE ADHESIVE LAYER AND FORMS A SET SECOND OF FIDUCIALS WITH A LASER TO DENOTE SINGULATION PATTERNS.
2110

↓

DISPOSES A FIRST PLURALITY OF DIES ON THE ADHESIVE LAYER.
2115

↓

FORMS A FIRST MOLD LAYER AROUND THE FIRST PLURALITY OF DIES, WHERE THE FIRST MOLD LAYER IS FORMED WITHIN THE DAM FILLING THE DAM UP TO A PLURALITY OF TOP SURFACES OF THE FIRST PLURALITY OF DIES.
2120

↓

DISPOSES A SECOND PLURALITY OF DIES ON THE TOP SURFACES OF THE FIRST PLURALITY OF DIES, WHERE EACH OF THE DIES MAY HAVE ONE OR MORE DIE CONTACTS ON A TOP SURFACE AND/OR A BOTTOM SURFACE THAT ARE EACH ELECTRICALLY COUPLED TO AT LEAST ONE DIE CONTACT OF ANOTHER DIE WITH ONE OR MORE INTERCONNECTS.
2125

↓

FORMS A SECOND MOLD LAYER AROUND THE SECOND PLURALITY OF DIES AND ON THE TOP SURFACE OF THE FIRST MOLD LAYER, WHERE THE SECOND MOLD LAYER IS FORMED WITHIN THE DAM FILLING THE DAM UP TO A PLURALITY OF TOP SURFACES OF THE SECOND PLURALITY OF DIES.
2130

↓

DISPOSES A THIRD PLURALITY OF DIES ON THE TOP SURFACES OF THE TOPMOST DIES OF THE SECOND PLURALITY OF DIES, WHERE EACH OF THE THIRD PLURALITY OF DIES MAY BE ELECTRICALLY COUPLED TO THE OTHER STACKED DIES WITH THE INTERCONNECTS.
2135

↓

FORMS A THIRD MOLD LAYER OVER AND AROUND THE THIRD PLURALITY OF DIES AND ON THE TOP SURFACE OF THE SECOND MOLD LAYER, WHERE THE THIRD MOLD LAYER IS FORMED WITHIN THE DAM FILLING THE DAM OVER THE TOP SURFACES OF THE THIRD PLURALITY OF DIES BUT BELOW THE TOP LEVEL OF THE DAM.
2140

↓

SINGULATES THE PLURALITY OF SEMICONDUCTOR PACKAGES ALONG ONE OR MORE FIDUCIAL LINES TO FORM AN INDIVIDUAL SEMICONDUCTOR PACKAGE.
2145

TSV-LESS DIE STACKING USING PLATED PILLARS/THROUGH MOLD INTERCONNECT

CROSS-REFERENCE TO RELATED APPLICATION

This patent application is a U.S. National Phase Application under 35 U.S.C. § 371 of International Application No. PCT/US2017/054670, filed Sep. 30, 2017, entitled "TSV-LESS DIE STACKING USING PLATED PILLARS/THROUGH MOLD INTERCONNECT," which designates the United States of America, the entire disclosure of which is hereby incorporated by reference in its entirety and for all purposes.

FIELD

Embodiments relate to semiconductor devices. More particularly, the embodiments relate to packaging small form factor (SFF) systems using a printed circuit board (PCB) in combination with an integrated or sacrificial molding/encapuslation base, where the PCB may include plated pillars, multi-encapsulation layers, and double-sided interconnects.

BACKGROUND

Recently, ultra-low power circuits, energy harvesting systems, communications systems, and novel packaging solutions have enabled extreme minitaturization of fully integrated systems (e.g., a total volume of a few $cm^3$ to $mm^3$). The exceedingly small size of these SFF systems allow them to be used in many novel applications such as implantable medical devices, environmental monitoring, animal tracking, and surveillance.

The communication, processing, and sensing functions are implemented with low power systems that allow the use of small batteries (e.g., thin film batteries) and small energy harvesting devices (e.g., solar and vibration). The SFF systems are typically limited to silicon components (i.e., with few or no discrete devices such as capacitors or inductors) to minimize the overall volume of the systems. Additional, some systems use wirebonding or vertical stacking using through silicon vias (TSVs) to further minimize the overall volume. The connected components (or dies) are then overmolded or coated to protect the system from the environment.

Ultra SFF systems, however, present several problems. One major problem involved with packaging these SFF systems is debugging, programming, and testing the components due to their small size. Conventionally, the SFF systems may add additional test pads for testing and programming purposes but this significantly increases their overall volume (e.g., adding 10 test pads to a 1 $mm^3$ system results in a volume increase of roughly 50%). Adding test pads to the SFF systems also leads to other problems when the pads need to be sealed from the environment which may prevent their use in many applications (e.g., in applications where moisture may cause shorts from the test pads, or where the test pads may not be biocompatible for body implantation).

Furthermore, in many of the SFF systems, the energy harvester starts charging the battery as soon as it is connected to the battery. This requires the use of shorting wires or open wires on the energy harvester during the different assembly steps to avoid partially charging the battery and reducing its shelf life or performance after the high temperature assembly steps. The wires on the energy harvester are then broken or shorted after the manufacturing is completed. Due to the SFF of the system, the process of cutting or connecting the wires is extremely challenging and needs to be manually performed under a microscope or magnifying glass. Furthermore, techniques to deal with these issues and other challenges requires smart strategies to enable batch processes with multi-product configuration flexibility.

BRIEF DESCRIPTION OF THE DRAWINGS

Embodiments described herein are illustrated by way of example and not limitation in the figures of the accompanying drawings, in which like references indicate similar features. Furthermore, some conventional details have been omitted so as not to obscure from the inventive concepts described herein.

FIG. 1A is a cross-sectional view of a semiconductor package having one or more dies, one or more interconnects, and an encapsulation layer, according to one embodiment.

FIG. 1B is a cross-sectional view of a semiconductor package having one or more dies, one or more interconnects, an encapsulation layer, and a PCB with one or more pads, according to one embodiment.

FIGS. 2A-2E are cross-sectional views of a process flow used to form a semiconductor package having one or more dies, one or more interconnects, an encapsulation layer, and a PCB with one or more pads, according to some embodiments.

FIGS. 3A-3H are cross-sectional views of a process flow used to form a semiconductor package having one or more dies, one or more interconnects, one or more encapsulation layers, and a PCB with one or more pads, according to some embodiments.

FIG. 10 is a process flow illustrating a method of forming a semiconductor package having a plurality of dies, one or more interconnects, and an encapsulation layer, according to one embodiment.

FIG. 11 is a process flow illustrating a method of forming a semiconductor package having a plurality of dies, one or more interconnects, an encapsulation layer, and a substrate with one or more pads, according to one embodiment.

FIG. 12 is a process flow illustrating a method of forming a package layer having a plurality of cavities, a plurality of device packages, and a plurality of interconnects, according to one embodiment.

FIG. 19 is a process flow illustrating a method of forming a semiconductor package having one or more dies, one or more interconnects, and a PCB with a cavity, according to one embodiment.

FIGS. 20C-20H are corresponding plan and cross-sectional views of a process flow used to form a package layer having a plurality of device packages, a plurality of interconnects, and one or more encapsulation layers that are stacked, according to one embodiment.

FIG. 21 is a process flow illustrating a method of forming a package layer having a plurality of device packages, a plurality of interconnects, and one or more encapsulation layers that are stacked, according to one embodiment.

DETAILED DESCRIPTION

Figure 1C:
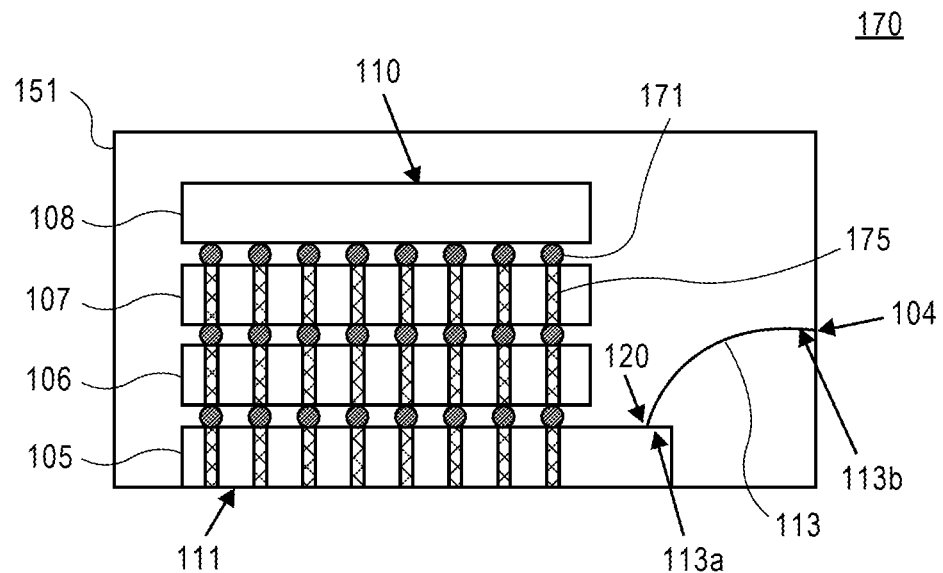
FIG. 1C is a cross-sectional view of a semiconductor package having one or more dies, one or more interconnects with through silicon vias (TSVs), and an encapsulation layer, according to one embodiment.

Described herein are systems that include a semiconductor package and methods of forming such semiconductor packages. Specifically, ultra-small form factor systems are described below and methods of forming such ultra-small form factor systems using a printed circuit board (PCB) in combination with a sacrificial or permanent molding/encapsulation base. Note that these disclosed embodiments are not limited in an application to ultra-small form factor systems. Additionally, according to some embodiments, a PCB embedded stack is described herein having plated pillars, multi-encapsulation layers, and/or double-sided interconnects. In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

According to some embodiments, an ultra-small form factor system includes one or more dies that are vertically stacked to minimize the overall volume of the system. For some embodiments, the one or more dies are stacked or disposed within or adjacent to the PCB (also referred to as a package or a substrate), where the PCB includes one or more exposed pads. According to several embodiments, vertically stacking the dies with wire bonds or through silicon vias (TSVs) and then adding one or more encapsulation layers over the dies and wire bonds/TSVs yields the ultra-small form factor. As such, the present embodiments enable automated testing during various manufacturing steps by using the exposed pads of the PCB.

Additionally, the present embodiments help to facilitate the extraction of one or more semiconductor packages (also referred to as device packages) within the PCB using a cutting process, which provides individual packages for customers needing ultra-small form factor devices without the PCB. Likewise, the present embodiments also help to facilitate the extraction of additional semiconductor packages within the PCB using the cutting process, which provides individual packages for customers needing ultra-small form factor devices with the exposed pads of the PCB for debugging, testing, and/or programming.

The present embodiments further enhance packaging solutions for ultra-small form factors by embedding a PCB adjacent to the stacked dies before overmolding. This allows testing of the dies (or devices/components) at different assembly steps using exposed pads of the PCB—before and after overmolding. For example, the semiconductor packages can be tested and/or programmed during an intermediate testing step of the overall assembly process, as the PCB is used as an encapsulation dam (or overmolding dam) between different types of molds. Furthermore, the present embodiments also provide an automated and precise sawing/cutting process that allows shorting wires of an energy harvester to be cut at the last assembly step.

Accordingly, as described in further detail below, the present embodiments enable device packages to be embedded in (or adjacent to) a PCB with pads and, therefore, provide automated testing of the device packages during different manufacturing steps—without increasing volume, cost, and total number of manufacturing steps.

Referring now to FIG. 1A, a cross-sectional view of a semiconductor package 100 is illustrated. The semiconductor package 100 has an encapsulation layer 102 and a plurality of dies 105-108 that are connected using one or more interconnects 103. In addition, according to some embodiments, the semiconductor package 100 may have an ultra-small form factor that is implemented for wearables, temperature monitoring, imaging and motion detection, implantable medical monitoring, ingestibles, security, search and rescue, environmental monitoring, Internet of Things (IoTs), chemical and biological military sensors, smart devices (e.g., smart dust, mote, etc.), etc., and/or any system in package (SIP) having an ultra-small form factor.

As used herein, an "ultra-small form factor" system may refer to a semiconductor (or device) package that has a total volume in the order of roughly several cubic millimeter ($\sim mm^3$) or less (e.g., somewhere in the 1-100 mm3 depending on the functions). The "ultra-small form factor" system, as described herein, refers to a low-power device with one or more miniaturized systems that integrate sensors, data processing, energy harvesting, energy storage and/or wireless data transmission. In addition, an "ultra-small form factor" system may include a semiconductor package that utilizes at least one of (i) a power system with near threshold voltage (NTV) devices, solar cells, and thin film batteries; (ii) a packaging system with integrated antennas, all-silicon design, and minimal packaging assembly (i.e., wire bonding, integrated antennas, and/or encapsulation); (iii) a modular system with multiple dies (or chips) having a common bus; and/or (iv) a PCB with one or more pads for improved electrical functionality and testing (as shown in further detail below in FIG. 1B). In view of that, the semiconductor package 100 may be formed adjacent to a substrate, a package, and a PCB (as shown in FIG. 1B), according to several embodiments. The system may be a stand-alone device or a system in package (SiP) as part of a larger device.

For one embodiment, the dies 105-108 are disposed (or assembled) on top of one another to form a stack (e.g., a vertical stack). The dies 105-108 may be disposed on a rigid support/carrier (not shown) that is removed at the final stages of the assembly process. Additionally, each die 105-108 has a top surface 110 and a bottom surface 111 that is opposite from the top surface 110. Each die 105-108 also has one or more die contacts 120-121 that are located on the top surface 110 of each die 105-108 (or on both sides of the dies for the case of stacking using TSVs). The die contacts 120-121 are each electrically coupled to at least one other die contact of another die with one or more interconnects 103 (e.g., wire bonds, TSV, TMVs, flip-chip, 3D printing, inkjet, and anisotropic conductive film (ACF)). For example, die 105 has two die contacts 120-121, die contact 120 of die 105 is electrically coupled to die contact 121 of die 106, and die contact 121 of die 105 is electrically coupled to a surface 104 of an encapsulation layer 102.

According to some embodiments, the encapsulation layer 102 (or an encapsulation layer) is disposed over and around the dies 105-108 and the one or more interconnects 103 and 113. As described herein, disposing/forming an encapsulation layer over the dies and interconnects may also be referred to as overmolding. In addition, a semiconductor package may have two or more encapsulation layers (as shown in FIGS. 3A-H), where the encapsulation layers may include different type of materials for each encapsulation layer (e.g., an opaque material for a first encapsulation layer and a transparent material for a second encapsulation layer).

Furthermore, as shown in FIG. 1A, the semiconductor package 100 has an interconnect 113 and an outer enclosure 101 formed from the encapsulation layer 102. For one embodiment, the interconnect 113 has a first end 113a and a second end 113b that is opposite from the first end 113a. According to this embodiment, the first end 113a is connected to die contact 121 of die 105 and the second end 113b extends through the encapsulation layer 102 to the surface 104 of the encapsulation layer 102. Note that a semiconductor package can have one or more interconnects that connect to the surface of the encapsulation layer based on implementation and customer requirements.

Each of the one or more dies 105-108 may include, but is not limited to, a semiconductor die, an integrated circuit, a CPU, and a microprocessor. For several embodiments, the dies 105-108 are formed of semiconductor components/devices (i.e., no discrete devices such as capacitors or inductors) to minimize the overall volume of the package (e.g., dies with thickness of approximately 50-150 µm or less). Note that, according to alternate embodiments, not all of the dies in the stack have to be active semiconductor components/devices (i.e., some dies or layers may be organic substrates, exclusively passive devices (e.g., decoupling capacitors/power delivery inductors, antennas), microelectromechanical systems (MEMS), or other types of components and/or sensors).

The dies 105-108 may further include, but are not limited to, a sensor (e.g., a temperature sensor, a pressure sensor, a motion detection/imaging sensor, etc.), a communication device (or chip), a radio, a battery, a decoupling capacitor, a battery control, a power stabilizer, a memory, an energy harvester (e.g., a solar cell, a photovoltaic (PV) cell), etc., and/or any combination thereof. Note that the semiconductor package 100 may have any possible variations of dies that are stacked. For example, the energy harvesting can be implemented using one or more dies (or devices), there can be more than one sensor (e.g., light sensor, pressure sensor, temperature sensor, humidity sensor, temperature & humidity sensor, medical sensor, etc.), and there can be an additional energy management die(s).

Figure 4:
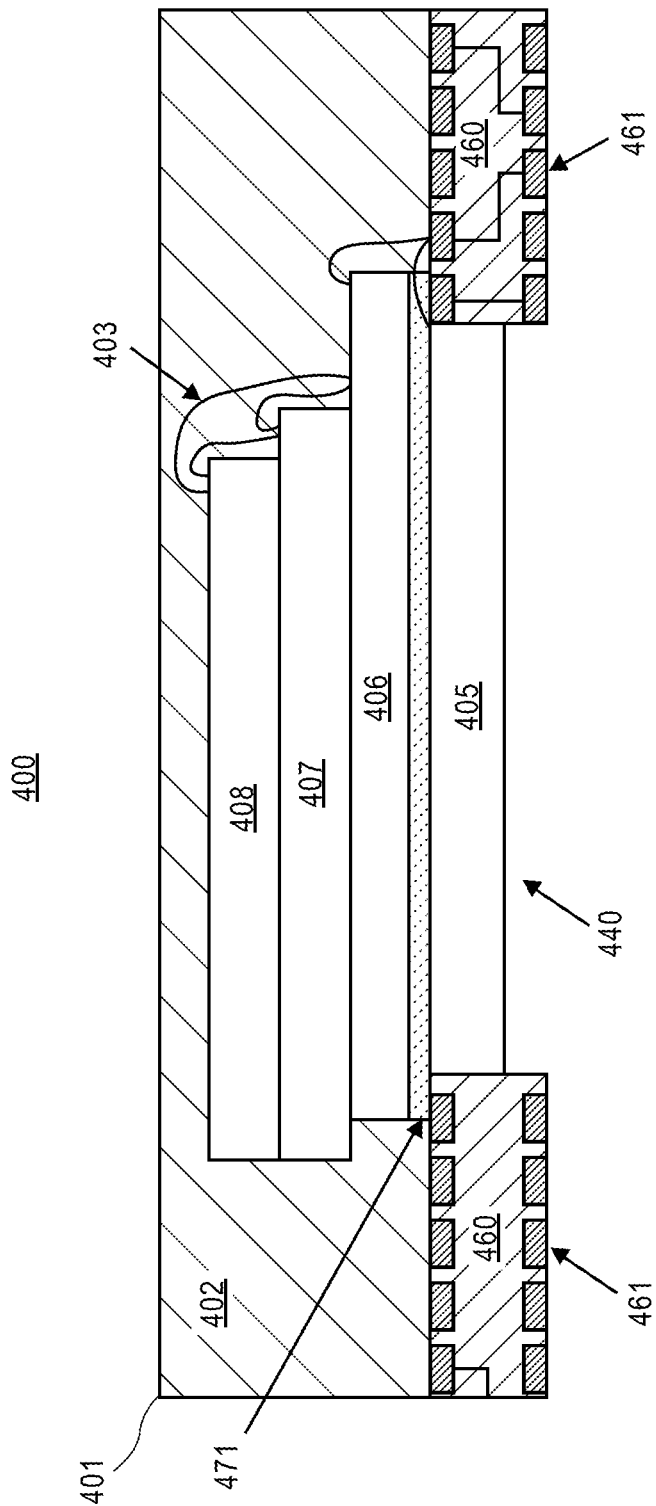
FIG. 4 is a cross-sectional view of a semiconductor package having one or more dies suspended in a cavity of a PCB, according to one embodiment.
Figure 7:
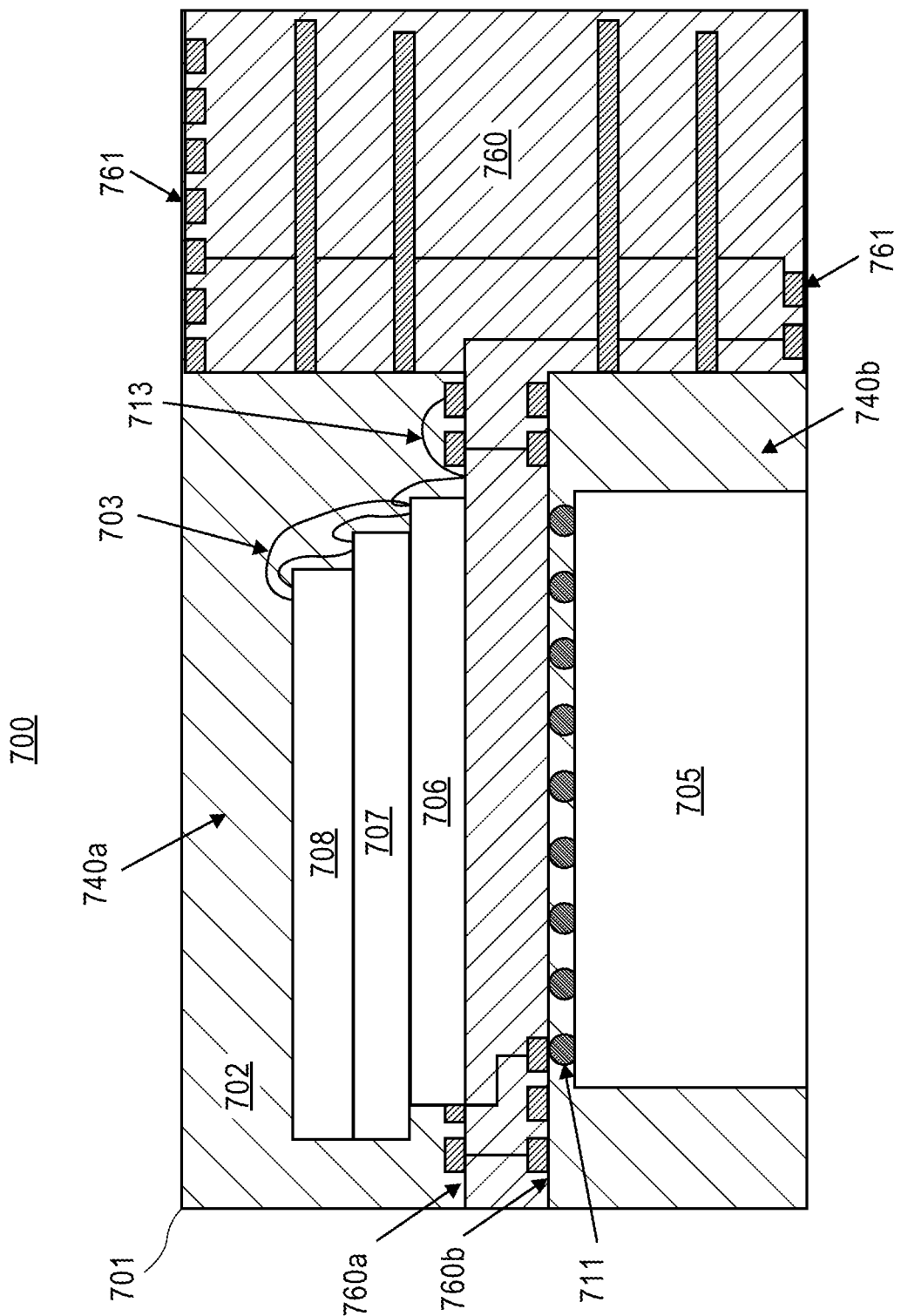
FIG. 7 is a cross-sectional view of a semiconductor package having one or more dies disposed on a first cavity of a PCB and a die disposed on a second cavity of the PCB, according to one embodiment.

For one embodiment, die 105 may be a sensor, die 106 may be a microprocessor (or a processing device), die 107 may be a battery (e.g., a thin-film lithium (Li) battery), and die 108 may be an energy harvester. Additionally, the total number of dies for each package is not limited to a specific number of dies (i.e., a package can have Nth number of dies based on a design or customer requirements). For alternative embodiments, a plurality of dies may be vertically stacked to minimize the overall volume and z-height, but the plurality of dies may also be arranged in any specified orientation to have any other desired configuration (e.g., as shown in FIGS. 4 and 7). In addition, a die may be directly disposed on another die with an adhesive layer (e.g., a bond film, a one/double sided tape, an attach film, an electrically conductive attach film, an epoxy film, etc.), or with solder interconnects for TSV dies, on the bottom surface of the die to be placed/disposed on the other die.

Each of the dies 105-108 may be a crystalline substrate formed using a bulk silicon or a silicon-on-insulator substructure. In other implementations, each of the dies 105-108 may be formed using alternate materials, which may or may not be combined with silicon, that include, but are not limited to, germanium, indium antimonide, lead telluride, indium arsenide, indium phosphide, gallium arsenide, gallium nitride, indium gallium arsenide, gallium antimonide, or other combinations of group III-V or group IV materials. Although a few examples of materials from which the semiconductor die may be formed are described herein, any material that may serve as a foundation upon which a semiconductor device may be built falls within the scope of the present embodiments. One or more dies may also be built on a non-semiconducting substrate (e.g., quartz, glass or ceramic) to provide passive functionality such as decoupling capacitors, inductors, transformers, antennas or precision resistors.

As shown in FIG. 1A, each of the dies 105-108 has one or more die contacts 120-121 that are each electrically coupled to at least one other die contact 120-121 of another die 105-108 using one or more interconnects 103 (e.g., wire bonds, TSV, TMVs, flip-chip, 3D printing, inkjet, and ACF). According to one embodiment, each of the dies 105-108 is a wire-bonded semiconductor die. Additional embodiments may include dies 105-108 that are electrically coupled/interconnected with a TSV, a through mold interconnect (TMI), a flip-chip interconnect using plated pillars/TMIs, or any combination thereof. For example, each of the dies 105-108 may be a flip-chip semiconductor die.

Interconnects 103 electrically couple die contacts 120-121 of one die 105-108 to another die 105-108. For one embodiment, interconnects 103 and 113 are wire bonds. The wire bonding structure of the semiconductor package 100 as shown in FIG. 1A may be substantially similar to those presently known in the art. For example, interconnects 103 and 113 may be wires that are ball-stitch bonded or wedge bonded from one die 105-108 to another die 105-108, one die 105-108 to a surface 104 on an encapsulation layer 102.

In addition, the interconnects 103 and 113 may be any commonly used conductive material, such as copper, silver, gold, or alloys thereof. While wire-bonded semiconductor dies are illustrated in FIG. 1A, it is to be appreciated that the semiconductor dies are not limited to wire-bonding, and other interconnect structures, such as flip-chip, 3D printing, inkjet, and anisotropic conductive film (ACF), are also within the scope of embodiments.

According to one embodiment, the die contacts 120-121 (also referred to as die contact pads, interconnects pads or wire bond pads) may include a conductive stack of materials, such as, but not limited to adhesion promoters, seed layers, copper, silver, gold, or alloys thereof, and oxidation inhibitors. Each of the die contacts 120-121 is electrically coupled to another die contact 120-121 by an interconnect 103 (also referred to as an interconnect line). According to some embodiments, the interconnects 103 are formed in a cascading pattern in order to allow for the interconnects to have flexibility, particularly in flexibility to change interconnect locations and avoid bending and damage.

After the dies 105-108 are stacked and interconnected, an encapsulation layer 102 is deposited over and around the dies 105-108 and interconnects 103 and 113 to protect the semiconductor package 100 from the environment. For one embodiment, the encapsulation layer 102 is then cured. Encapsulation layer 102 helps to protect and cover dies 105-108 from humidity, photons, corrosion and damage. According to one embodiment, a semiconductor package (e.g., semiconductor package 100) may have more than one encapsulation layer based on the stacked systems or dies that may require different encapsulation requirements.

For one embodiment, the encapsulation layer 102 is made of an epoxy (e.g., a soft epoxy, a stiff epoxy, opaque epoxy, etc.) with one or more filler materials. According to some embodiments, the one or more materials for the encapsulation layer 102 include, but are not limited to, ultra-compliant materials for pressure sensors, visible light, ultraviolet (UV) and infrared (IR) absorbing/reflective materials to block photons from the dies, stiff polymers to encapsulate the interconnects, and/or transparent materials on an energy harvest (e.g., a solar cell). In addition, the one or more multi-layered materials may also include visible light, UV and/or IR blocking agents or metals (e.g., aluminum to block light) that are selectively sputtered or deposited on the package. For some embodiments, the encapsulation layer 102 may be formed with one or more encapsulant materials that are dispensed onto the package (e.g., semiconductor package 100), rather than using injection, compression, or transfer mold processes.

The encapsulation layer 102 may form an outer enclosure 101 with a surface 104 that is coupled to an interconnect 113. The interconnect 113 extends through the encapsulation layer 102 as the first end 113 is coupled to die contact 121 of die 105 and the second end 113b is exposed on surface 104 of the outer enclosure 101 of the encapsulation layer 102 (i.e., a surface of the second end of the interconnect is coplanar with the surface 104 of the encapsulation layer 102). For one embodiment, the second end 113b of the interconnect 113 is exposed on the surface 104 after the semiconductor package 100 is singulated along a saw fiducial (not shown). For example, interconnect 113 can be cut at the last assembly step during sawing in an automated and precise manner, which then provides individual packages to customers needing ultra-small form factor devices.

For another embodiment, the surface 104 of the encapsulation layer 102 may be recessed to expose the second end 113b of the interconnect 113. For example, the encapsulation layer 102 may be recessed with an encapsulation grinding/polishing (also referred to as mold grinding/polishing) to provide a flat, polished surface for interconnect end 113b. In addition, the surface 104 may also have a coating (not shown) that electrically isolates the interconnect end 113b from the external environment.

For another embodiment, the surface 122 of the encapsulation layer 102 may be recessed to disconnect the terminal 103b of the interconnect 103b. For example, the encapsulation layer 102 may be recessed with an encapsulation grinding/polishing to provide a flat, polished surface for interconnect end 103b. In addition, the surface 122 may also have a coating (not shown) that electrically isolates the interconnect end 103b from the external environment.

For other embodiments, the encapsulation layer 102 may have any arbitrary shape or texture to enable the desired packaging design or application, including hemispherical shape, a capsule-like shape, a honeycombed shape to increase surface area, a round shape, one or more dimples to fit in certain devices, etc. In addition, for other embodiments, the encapsulation layer 102 may also serve one or more additional purposes, such as bio-compatible and/or hermetic sealing.

Note that the semiconductor package 100 may include fewer or additional packaging components based on the desired packaging design.

FIG. 1B illustrates a cross-sectional view of a semiconductor package 150 having an encapsulation layer 102, a plurality of dies 105-108 connected with one or more interconnects 103 and 113, and a PCB 160 with one or more pads 161. Note that semiconductor package 150 of FIG. 1B is similar to semiconductor package 100 of FIG. 1A, except that the semiconductor package 150 includes the PCB 160 with the one or more pads 161 to provide improved electrical functionality and testing. For example, the one or more PCB pads 161 allow customers to debug, test, program, and/or develop the semiconductor package 150 using standard probe technology.

Referring now to FIG. 1B, the semiconductor package 150 has the dies 105-108 disposed on top of one another to form a stack. For one embodiment, each die 105-108 has a top surface 110 and a bottom surface 111 that is opposite from the top surface 110. Each die 105-108 also has one or more die contacts 120-121 that are located on the top surface 110 of each die 105-108. The die contacts 120-121 are each electrically coupled to at least one other die contact of another die with one or more interconnects 103.

Figure 8:
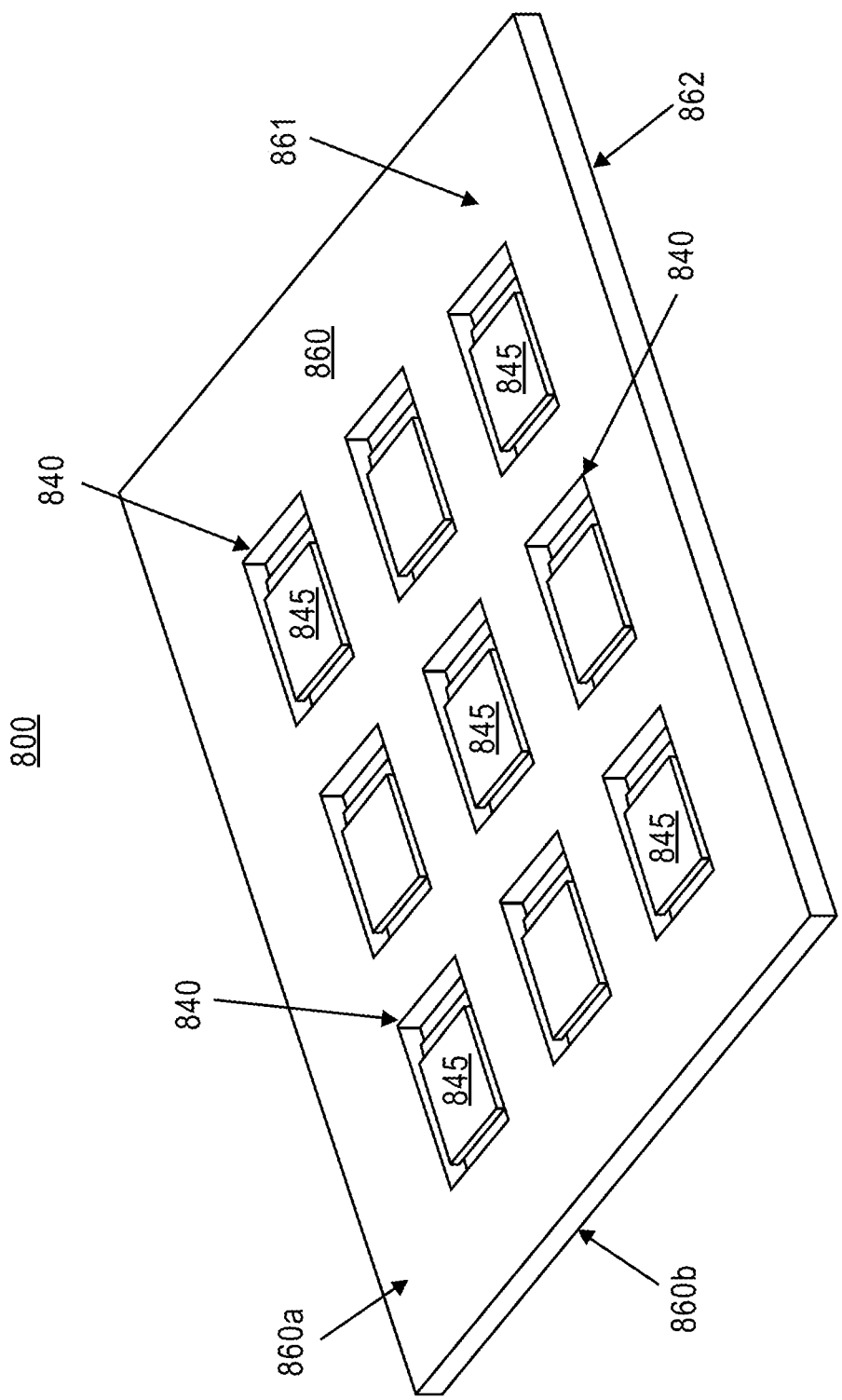
FIG. 8 is a top, perspective view of a PCB with a plurality of cavities that include a plurality of semiconductor packages, according to one embodiment.
Figure 9:
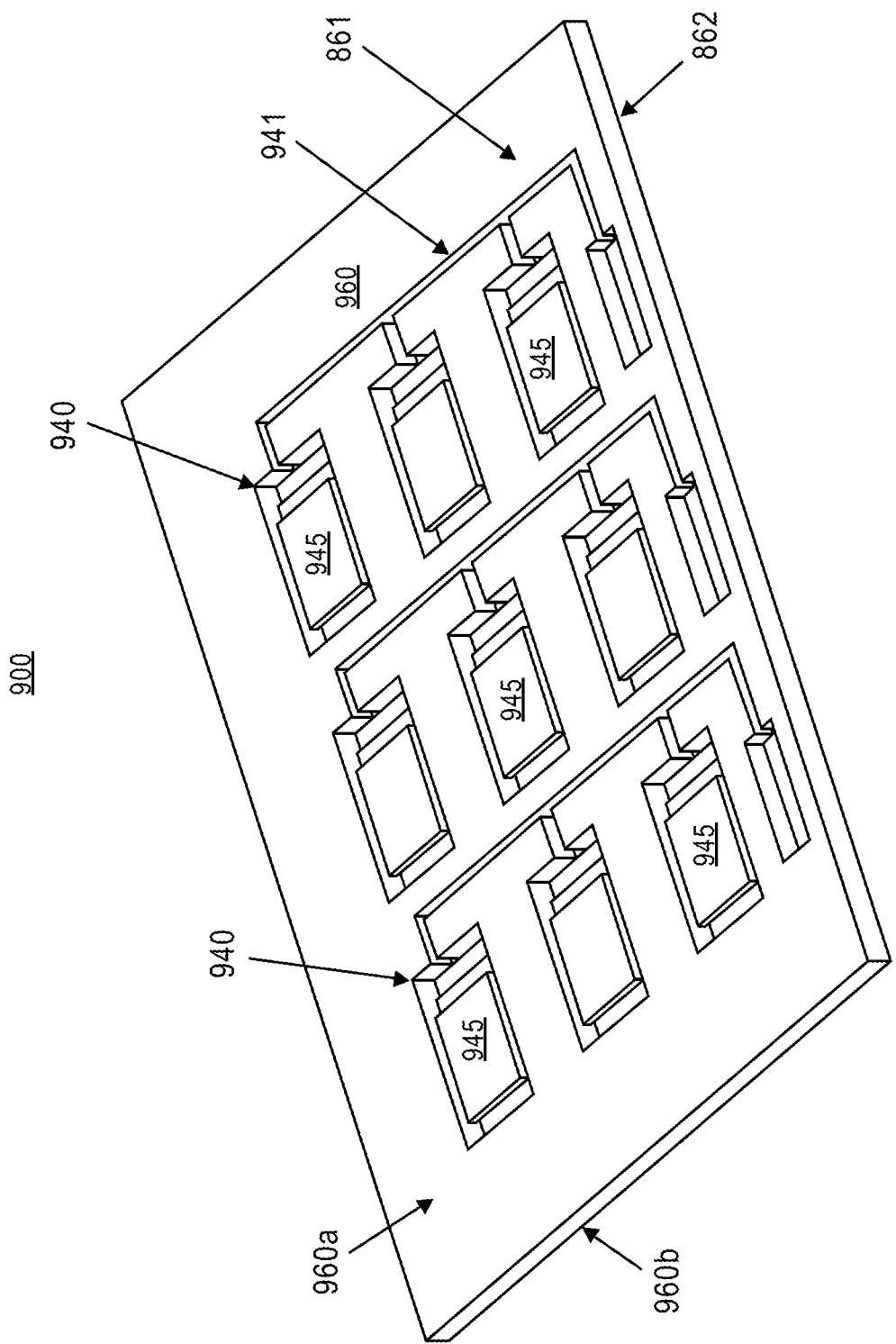
FIG. 9 is a top, perspective view of a PCB with one or more channels and a plurality of cavities that have a plurality of semiconductor packages, according to one embodiment.

According to some embodiments, the dies 105-108 are stacked and disposed adjacent to the PCB 160 (or substrate/package). As described herein, a "PCB" may refer to a base PCB that may be one or more smaller PCB(s) that are placed adjacent to or under the system components (e.g., the dies), as shown in FIGS. 1-7. Furthermore, a "PCB" may also refer to an encapsulation PCB that may be a large PCB with one or more cavities (and one or more encapsulation channels), where the system components and one or more encapsulation layers may be disposed into the one or more cavities. For example, in this case, the encapsulation PCB (as shown in FIGS. 8-9) may be used at the packaging-level (or panel-level) to assemble a plurality of semiconductor packages, where the semiconductor packages may be singulated into individual units with or without the PCB. For example, as in wafer shuttles, the units may be of the same configuration and shape or of multiple unique shapes and configurations.

Figure 5:
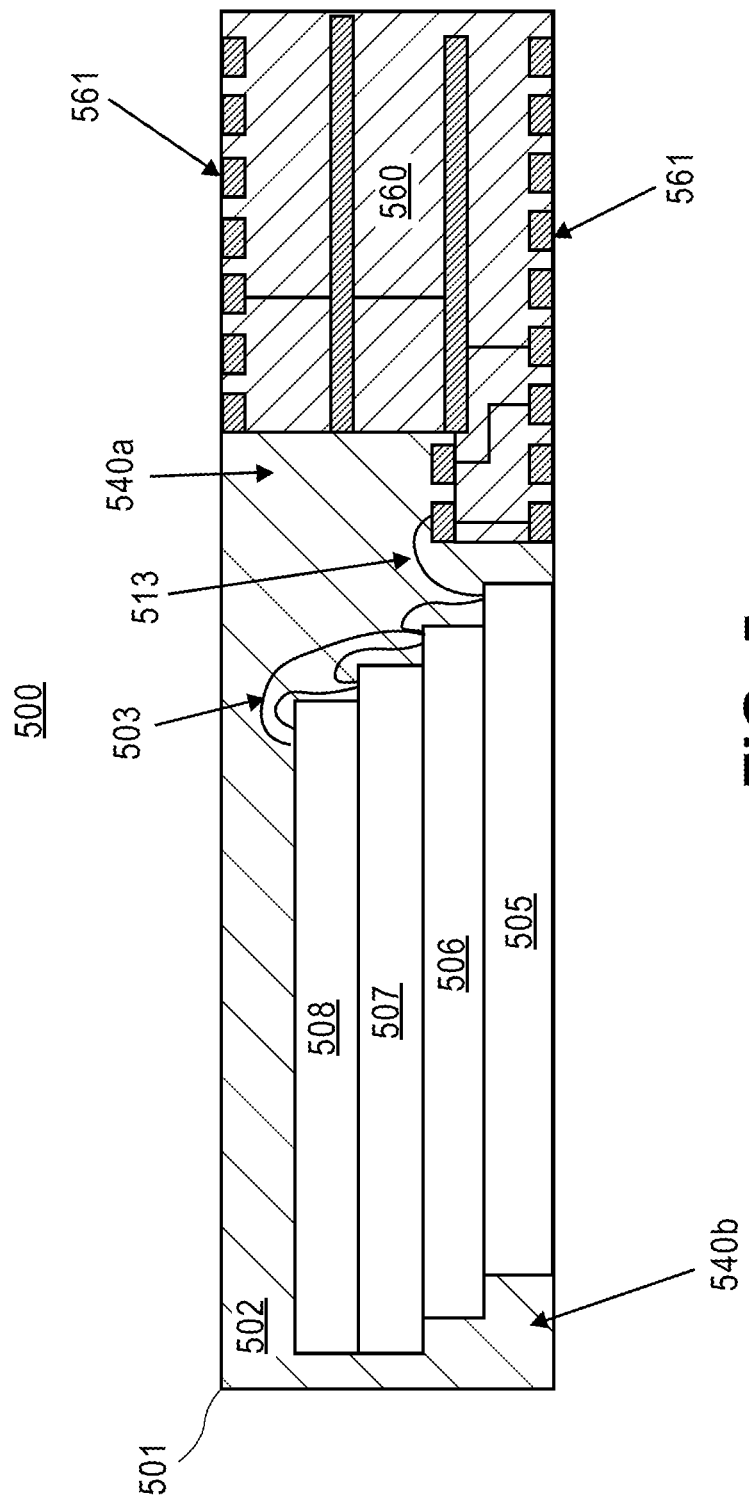
FIG. 5 is a cross-sectional view of a semiconductor package having one or more dies embedded within a PCB that has a multi-level cavity, according to one embodiment.
Figure 6:
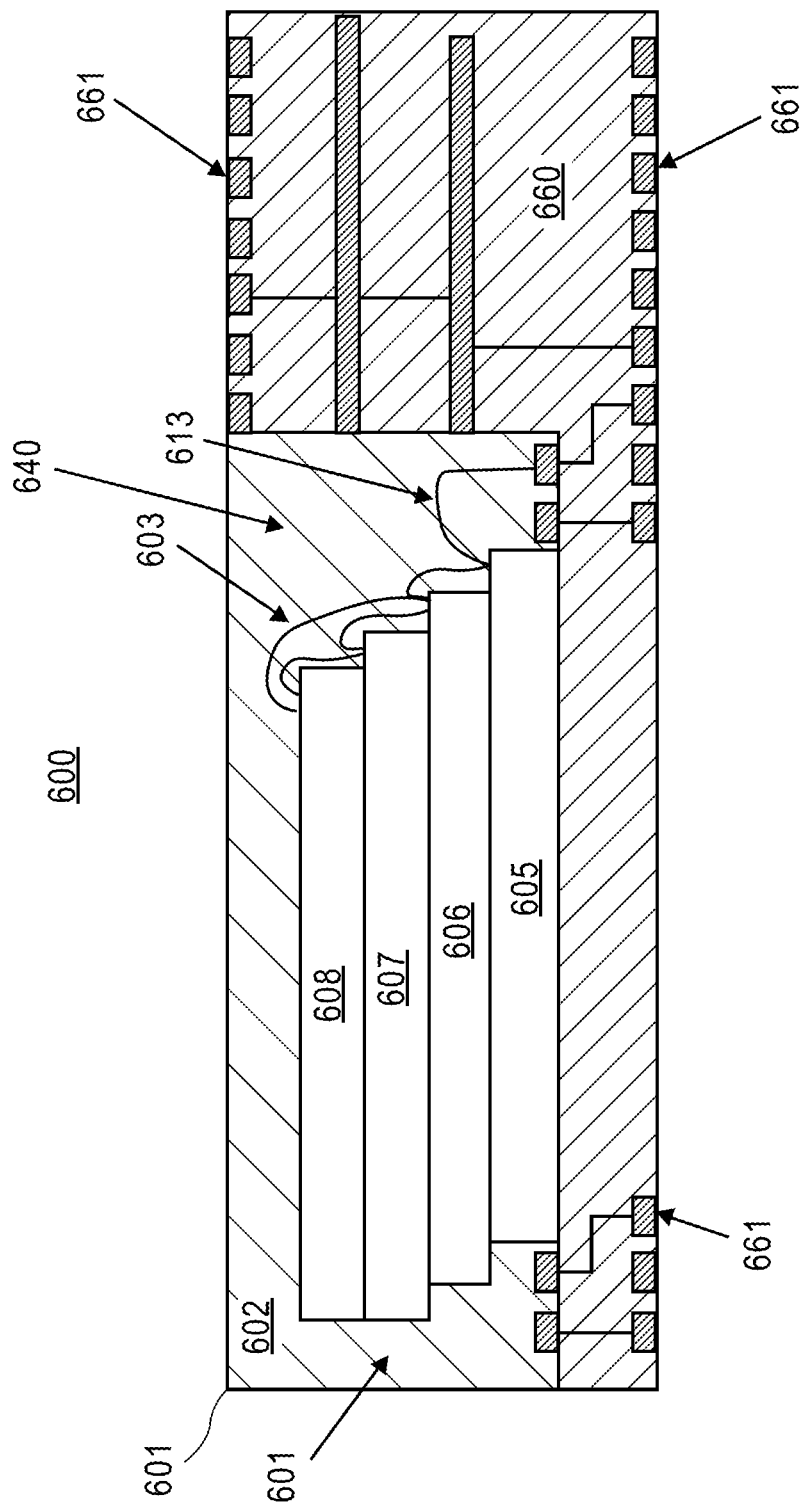
FIG. 6 is a cross-sectional view of a semiconductor package having one or more dies embedded on a PCB with a cavity, according to one embodiment.

For some embodiments, the dies 105-108 may be placed adjacent to the PCB 160. However, as shown below in FIGS. 4-9, each of the dies 105-108 may be disposed in a cavity or a cut-out (not shown) of the PCB 160 (e.g., as shown in FIGS. 8-9), suspended within the cavity of the PCB 160 (e.g., as shown in FIG. 4), embedded in the PCB 160 (e.g., as shown in FIG. 5 illustrating a PCB with multilevel cavities), and embedded and on the PCB 160 (e.g., as shown in FIG. 6). In addition, some of the dies 106-108 may be disposed on a top cavity (not shown) of the PCB 160, while die 105 (e.g., a sensitive pressure sensor or a MEMS device) may be disposed on a bottom cavity (not shown) of the PCB 160 that is connected to the top cavity with solder bumps and one or more vias (e.g., as shown in FIG. 7).

For one embodiment, the PCB 160 has a first set of pads 162 on a top surface 160a and a second set of pads 161 on a bottom surface 160b. As described above in FIG. 1A, the encapsulation layer 102 is deposited over and around the dies 105-108, the interconnects 103 and 113, and the first set of pads 162 of the PCB 160, as the second set of pads 161 on the bottom surface 160b are exposed. For one embodiment, the encapsulation layer 102 is then cured. Meanwhile, the exposed second set of pads 161 on the bottom surface 160b of the PCB 160 can be used for debugging, testing, programming, and/or developing the dies 105-108 of the semiconductor package 150.

As shown in FIG. 1B, a first end 113a of interconnect 113 is electrically coupled to one of the die contacts 121 of die 105, and a second end 113b of interconnect 113 extends through the encapsulation layer 102 and is electrically coupled to at least one pad of the first set of pads 162 of the PCB 160. Note that a semiconductor package (e.g., semiconductor package 150) can have one or more interconnects electrically coupled to one or more pads of a PCB.

For one embodiment, the PCB 160 is made of an FR-4 glass epoxy base with thin copper foil laminated on both sides (not shown). For certain embodiments, a multilayer PCB can be used, with pre-preg and copper foil (not shown) used to make additional layers. For example, the multilayer PCB may include one or more dielectric layers, where each dielectric layer can be a photosensitive dielectric layer (not shown).

For another embodiment, the surface 122 of the encapsulation layer 102 may be recessed to disconnect the terminal 103b of the interconnect 103b. For example, the encapsulation layer 102 may be recessed with an encapsulation grinding/polishing to provide a flat, polished surface for interconnect end 103b. In addition, the surface 122 may also have a coating (not shown) that electrically isolates the interconnect end 103b from the external environment.

For some embodiments, a plurality of cavities (not shown) may be formed in the PCB 160 (e.g., as shown in FIGS. 8-9). For one embodiment, the PCB 160 may also include conductive copper traces, vias, metallic pads, and holes (not shown).

Figure 1D:
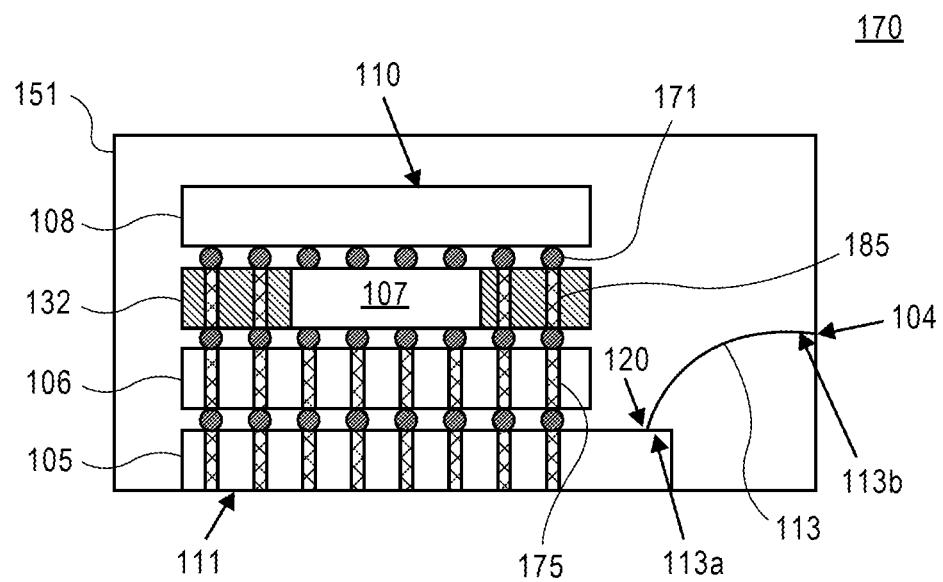
FIG. 1D is a cross-sectional view of a semiconductor package having one or more dies, one or more interconnects with through mold vias (TMVs), and an encapsulation layer, according to one embodiment.

FIGS. 1C and 1D illustrates cross-sectional views of a semiconductor package 170 having TSV stacked dies and a semiconductor package 180 having the stacked dies with through mold vias (TMVs), accordingly. Note that FIGS. 1C and 1D show other embodiments that may be used as a vertical interconnect for the stacked dies. For some embodiments, the semiconductor packages 170 and 180 of FIGS. 1C and 1D are similar to semiconductor packages 100 and 150 of FIGS. 1A and 1B, except that theses semiconductor package 170 and 180 implement alternative interconnects, such as TSVs and TMVs respectively, to interconnect the stacked dies rather than using wire bond interconnects. Also note that each interconnect (e.g., wire bond, TSV, TMV, etc.) may have advantages based on the desired design of the semiconductor package.

Referring now to FIG. 1C, the semiconductor package 170 has dies 105-108 electrically coupled with a plurality of TSVs 175 and a plurality of solder bumps 171. For some embodiments, the semiconductor package 170 has an enclosure 151 formed with an encapsulation layer (as shown in FIGS. 1A and 1B) that may be above a top surface 110 of die 108. According to one embodiment, the semiconductor package 170 may use the TSV interconnects 175 to stack the dies 105-108 directly above each other. For example, a plurality of TSVs 175 may be formed in die 105, where a bottom surface 111 of die 105 may be exposed. Then, a plurality of solder bumps 171 may be disposed on the plurality of TSVs 175 to attach and electrically couple to a plurality of TSVs 175 formed in die 106. As such, the same process is used to dispose the remaining dies 107-108 until the stack is completed.

Referring now to FIG. 1D, the semiconductor package 180 has dies 105-108 electrically coupled with a plurality of TSVs 175, a plurality of TMVs 185, and a plurality of solder bumps 171. For some embodiments, the semiconductor package 180 has an enclosure 151 formed with an encapsulation layer (as shown in FIGS. 1A and 1B) that may be above a top surface 110 of die 108. According to one embodiment, the semiconductor package 180 may use the TMVs interconnects 185 and TSV interconnects 175 to stack the dies 105-108 directly above each other. For example, a plurality of TSVs 175 may be formed in die 105, where a bottom surface 111 of die 105 may be exposed. Then, a plurality of solder bumps 171 may be disposed on the plurality of TSVs 175 to attach and electrically couple to a plurality of TSVs 175 formed in die 106. Then, a plurality of solder bumps 171 may be disposed on the plurality of TSVs 175 to attach and electrically couple an encapsulation layer 132 with an embedded die 107 and a plurality of TMVs 185. That is, the TMV interconnects 185 are disposed in between dies 108 and 106 using the plurality of solder bumps 171, as embedded die 107 is electrically coupled to die 108 with solder bumps 171.

Note that using a PCB embedded stack (e.g., as shown in FIGS. 1-9) for improved electrical functionality and testing provides various advantages, especially advantages over testing individual components then wireless programming/testing of the overall system.

Some of the advantages of the present embodiments are that (i) one or more semiconductor packages may be programmed simultaneously, and the packages may then be verified (or tested) for correct programming during the assembly process to significantly reduce the overall time of the verification process (e.g., an alternative verification process can be completed after the assembly process using wireless programming on a standard encapsulation strip size (~240×74-95 mm) that can have up to a few thousand devices, and therefore the verification process can take an extremely long time due to probe collisions between packets coming from the thousands of different devices.); (ii) one or more semiconductor packages may be tested intermediately to reduce an overall yield loss of packages (e.g., wireless programming requires that the packages (or dies) be completely assembled, which prevents intermediate testing and can result in a high yield loss due to assembling top dies on non-working bottom dies.); and (iii) one or more semiconductor packages may be tested without using additional components to wirelessly transmit to test device (e.g., analog-to-digital converters (ADCs)) and connections between the dies, thereby reducing overall costs and volume (e.g., analog signals typically need to be tested (eye diagrams, voltage levels, current levels, etc.) and sending such signals wirelessly requires additional components and connections between the dies—increasing the overall volume of the systems and costs for signals that may only be used for testing.).

Note that the semiconductor package 150 may include fewer or additional packaging components based on the desired packaging design.

FIGS. 2A-E are cross-sectional views of a process flow 200 used to form a semiconductor package (e.g., semiconductor packages 250-251 of FIGS. 2D-E) with an encapsulation layer (e.g., encapsulation layer 202 of FIG. 2B). According to some embodiments, the process flow 200 for forming a semiconductor package without and with a PCB (e.g., semiconductor packages 250-251 of FIGS. 2D-E, respectively) is illustrated in FIGS. 2A-E. However, it is to be appreciated that the processing illustrated in FIGS. 2A-E may be used to form a semiconductor package without a PCB similar to the device illustrated in FIG. 1A, a semiconductor package with a PCB similar to the device illustrated in FIG. 1B, a semiconductor package with two or more encapsulation layers either similar to the device illustrated in FIG. 3F or FIG. 3H, or a plurality of semiconductor packages stacked and embedded in a plurality of cavities of a PCB similar to devices illustrates in FIGS. 8-9.

Referring now to FIG. 2A, a cross-section view of a package layer is illustrated, according to one embodiment. The package layer may include a plurality of dies 205-208 and a PCB 260 disposed over a carrier 210. For one embodiment, the dies 205-208 and the PCB 260 of FIGS. 2A-E are similar to the dies 105-108 and the PCB 160 of FIG. 1B.

The carrier 210 may be a glass carrier or a rigid carrier, which can be made from stainless steel or ceramic or even copper clad core. According to one embodiment, the plurality of dies 205-208 are disposed on the carrier 210 and adjacent to the PCB 260. For example, the dies 205-208 are stacked or assembled adjacent to or within a cavity (not shown) of the PCB 260 before overmolding (as shown in FIG. 2B). For one embodiment, each of the dies 205-208 is each electrically coupled to at least one other die using one or more interconnects 203 and 213. In addition, the interconnect 213 may be electrically coupled to at least one pad of the PCB 260. Note that the package layer shows the dies 205-208 stacked adjacently to the PCB 260, but the package layer may have the dies 205-208 disposed on the PCB 260 in one or more configurations (e.g., as shown in FIGS. 4-7). Also, connection 213 is between the bottom die and the PCB but in actual applications different dies may be connected to the PCB not necessarily a single die.

Referring now to FIG. 2B, an encapsulation layer 202 may be deposited (or formed) over and around the die 205-208 and the interconnects 203 and 213. For one embodiment, the encapsulation layer 202 may then be cured and thus forms the enclosure 201 to surround and protect the package layer. According to some embodiments, the encapsulation layer 202 is made of an epoxy (e.g., a soft epoxy, a stiff, opaque epoxy, etc.) with one or more filler materials. For another embodiment, the package layer may include more than two or more encapsulant layers with different materials (e.g., as shown in FIGS. 3A-H) or two layers (or rounds) of the same encapsulation layer.

For example, according to some embodiments, some of the dies may be initially stacked (e.g., dies 205-206 are first stacked on the carrier 210) and then a first layer (not shown) of encapsulation layer 202 may be deposited over and around these initially stacked dies. The remaining other dies are subsequently stacked (e.g., dies 207-208 are subsequently stacked on the carrier 210) and then a second layer (not shown) of the encapsulation layer 202 may also be deposited over and around these remaining stacked dies. According to an additional embodiment, the enclosure 201 formed with the encapsulation layer 202 may have any desired shape. For example, the enclosure 201 may have a rounded shaped or rounded angles (e.g., a hill-shaped enclosure with a plateaued top surface) or any designed shape (e.g., hemispherical shape, capsule-like shape, a honeycombed shape to increase surface area, a round shape, one or more dimples to fit in certain devices, etc.). In addition, a compression plunger may be used to flatten a top surface of the enclosure 201 if needed.

Referring now to FIG. 2C, the carrier 210 is removed from the package layer. According to some embodiments, the package layer now has one or more exposed pads 261 on the bottom surface of the PCB 260. As such, after the overmolding 202 is completed and the carrier 210 is removed, the one or more pads 261 of the PCB 260 allow for the dies 205-208 to be tested, debugged, verified, and/or programmed (e.g., to verify that each of the interconnects was not damaged and the dies are correctly programmed).

Referring now to FIGS. 2D-E, the package layer is singulated to provide one or more semiconductor packages 250-251. For example, each of the packages 250-251 may be diced along a plurality of fiducial lines to extract each of the packages 250-251 from the package layer. FIG. 2D illustrates one or more semiconductor packages 250 that are singulated without the PCB 260. For some embodiments, the semiconductor packages 250 have one or more surfaces 204 that may also have a coating (not shown) that electrically isolates the interconnect ends 213 from the external environment. These packages 250 may be used as units for customers needing ultra-small form factor devices. Meanwhile, FIG. 2E illustrates the semiconductor package 251 that includes the PCB 260 with the one or more pads 261.

This package 251 may be used as unit(s) for customers needing debugging, additional programming/testing, and/or developmental devices.

While the illustrated process flow in FIGS. 2A-E produces a semiconductor package 250 with an interconnect 213 extending to a surface 204 of an encapsulation layer 202 (without including a PCB with one or more pads) and a semiconductor package 251 with an interconnect 213 electrically coupling a plurality of dies 205-208 to a PCB 260 with one or more pads 261 that are formed in a single package layer, embodiments are not limited to such configurations. For example, the package layer illustrated in the process flow of FIGS. 2A-E may be used to exclusively produce either a first plurality of semiconductor packages with a PCB or a second plurality of semiconductor packages without a PCB based on design (or customer) requirements.

According to additional embodiments, a semiconductor package with a PCB (or without a PCB) may also be formed with two or more encapsulation layers to allow intermediate testing of a plurality of dies. A process flow for forming such a semiconductor package is described in detail with respect to FIGS. 3A-H.

Note that the semiconductor packages 250-251 may include fewer or additional packaging components based on the desired packaging design.

Figure 3C:
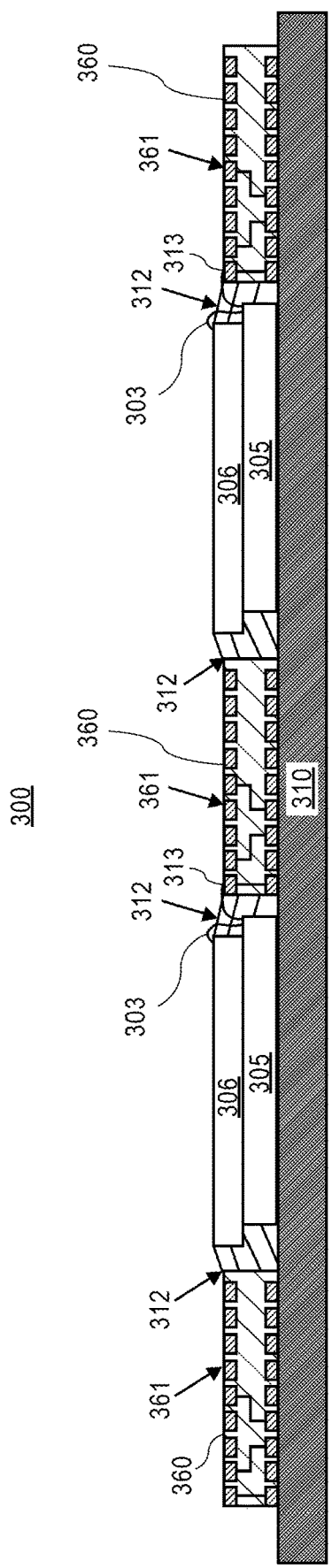

FIGS. 3A-H are cross-sectional views of a process flow 300 used to form a semiconductor package (e.g., semiconductor packages 350-351 of FIGS. 3G-H) with two encapsulation layers (e.g., encapsulation layer 312 of FIG. 3B and encapsulation layer 302 of FIG. 3E). According to some embodiments, the process flow 300 for forming a semiconductor package without and with a PCB (e.g., semiconductor packages 350-351 of FIGS. 3G-H, respectively) is illustrated in FIGS. 3A-H. However, it is to be appreciated that the processing illustrated in FIGS. 3A-H may be used to form a semiconductor package without a PCB similar to the device illustrated in FIG. 1A, a semiconductor package with a PCB similar to the device illustrated in FIG. 1B, or a plurality of semiconductor packages stacked and embedded in a plurality of cavities of a PCB similar to devices illustrates in FIGS. 8-9.

According to some embodiments, the overmolding of the package layer may be deposited in two or more encapsulation layers using different materials (e.g., a soft epoxy, a stiff, opaque epoxy, a transparent material, etc.), as illustrated in FIGS. 3A-H. Having the overmolding formed in two or more assembly steps additionally allows an intermediate testing and programming of the package layer at different assembly steps.

Referring now to FIG. 3A, a cross-section view of a package layer is illustrated, according to one embodiment. The package layer may include one or more dies 305-306 and a PCB 360 disposed over a carrier 310. For one embodiment, the dies 305-306 and the PCB 360 of FIGS. 3A-H are similar to the dies 105-108 and the PCB 160 of FIG. 1B.

The carrier 210 may be a glass carrier or a rigid carrier, which can be made from stainless steel or copper clad core or ceramic. According to one embodiment, the dies 305-306 are disposed on the carrier 310 and adjacent to the PCB 360. For example, the dies 305-306 are stacked or assembled adjacent to or within a cavity (not shown) of the PCB 360 before a first overmolding step (as shown in FIG. 3B). For one embodiment, each of the dies 305-306 is each electrically coupled to at least one other dies 305-306 using one or more interconnects 303 and 313. In addition, the interconnect 313 may be electrically coupled to at least one pad of the PCB 360. Note that the package layer shows the dies 305-306 stacked adjacently to the PCB 360, but the package layer may have dies 305-306 disposed on the PCB 360 in one or more configurations (e.g., as shown in FIGS. 4-7).

Referring now to FIG. 3B, a first encapsulation layer 312 may be deposited (or formed) over and around the dies 305-306 and the interconnects 303 and 313. For one embodiment, the first encapsulation layer 312 may be an opaque encapsulation layer based on the encapsulation requirements of the dies 305-306. Furthermore, the first encapsulation layer 312 of the package layer may then be cured. According to some embodiments, the first encapsulation layer 312 is formed of one or more first materials (e.g., a soft epoxy, a stiff, opaque epoxy, etc.), which may be different than the materials used for a second encapsulation layer (as shown in FIG. 3E). For some embodiments, the PCB 360 may be used as an encapsulation dam (or an overmolding dam) between two or more layers of encapsulation (e.g., an encapsulation dam between a first encapsulation layer and a second encapsulation layer). In other implementations, the PCB surface and sides may be treated to result in different encapsulation angles near the PCB (e.g., the PCB may be treated to repel or attract the encapsulation material).

Referring now to FIG. 3C, an intermediate testing of the package layer is illustrated. According to some embodiments, the package layer now has one or more exposed pads 361 on the top surface of the PCB 360. As such, after the first encapsulation layer 312 is formed, the one or more pads 361 of the PCB 360 allow for the dies 305-306 to be tested, debugged, verified, and/or programmed (e.g., to verify that each of the interconnects was not damaged and the dies are correctly programmed). For example, the interconnects 303 and 313, the dies 305-306, and/or the PCB 350 may be verified (i.e., tested, debugged, and/or programmed) to determine whether each of the components has an operational status (i.e., each of the interconnects and dies are properly working). This intermediate testing facilitates in an overall decrease in yield loss by testing and verifying that the dies 305-306 are functioning correctly prior to stacking additional dies (e.g., dies 307-308 of FIG. 3D) on the package layer.

Figure 3D:
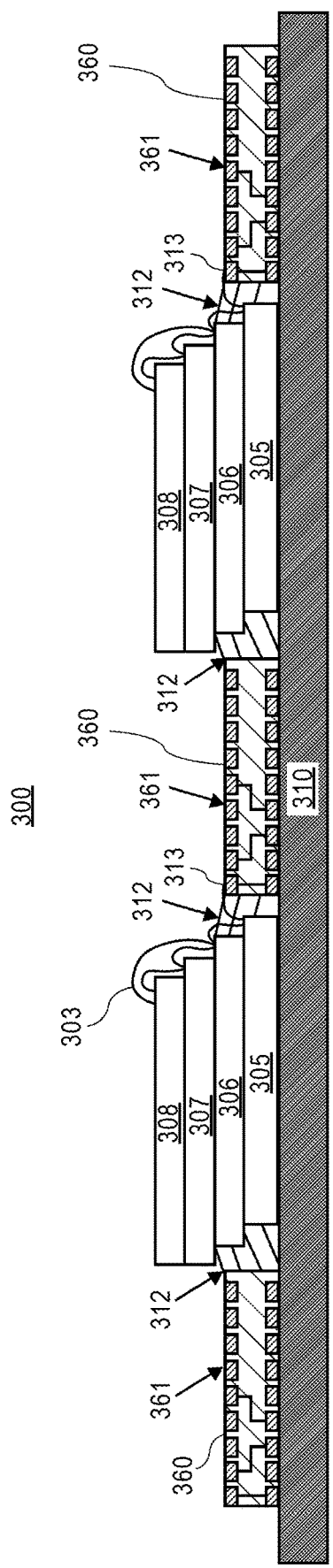

Referring now to FIG. 3D, one or more dies 307-308 are disposed on the dies 305-306 of the package layer. According to some embodiments, one or more interconnects 303 may be assembled to electrically couple the dies 307-308 with the other dies 305-306 and the PCB 360. The dies 307-308 may be disposed on the carrier 310 and adjacent to the PCB 360. For one embodiment, the dies 305-308 are now interconnected with the pads 361 of the PCB using the interconnects 303 and 313, which allows the package layer to be additionally tested/programmed if needed prior to depositing a second encapsulation layer.

Referring now to FIG. 3E, a second encapsulation layer 302 may be deposited over and around the dies 306-308, the interconnects 303 and 313, the first encapsulation layer 312, and the PCB 360. For one embodiment, the second encapsulation layer 302 may be a transparent encapsulation layer based on the encapsulation requirements of either of the dies 307-308 (e.g., die 308 may be an energy harvesting device that needs light). Furthermore, the second encapsulation layer 302 of the package layer may then be cured, forming enclosure 301 to surround and protect the package layer. As shown in FIG. 3E, the PCB 360 may be used as an encapsulation dam between the first encapsulation layer 312 and the second encapsulation layer 302.

According to an additional embodiment, the enclosure 301 formed from the encapsulation layer 302 may have any desired shape. For example, the enclosure 301 may have a rounded shaped or rounded angles (e.g., a hill-shaped enclosure with a plateaued top surface, a hemispherical shape, a capsule-like shape, a honeycombed shape to increase surface area, a round shape, one or more dimples to fit in certain devices, etc.). In addition, a compression plunger may be used to flatten a top surface of the enclosure 301 if needed.

Referring now to FIG. 3F, the carrier 310 is removed from the package layer. According to some embodiments, the package layer now has one or more exposed pads 361 on the bottom surface of the PCB 360. As such, after the second encapsulation layer 302 is completed and the carrier 310 is removed, the one or more pads 361 of the PCB 360 allow for the dies 305-308 to be tested, debugged, verified, and/or programmed.

Figure 3H:
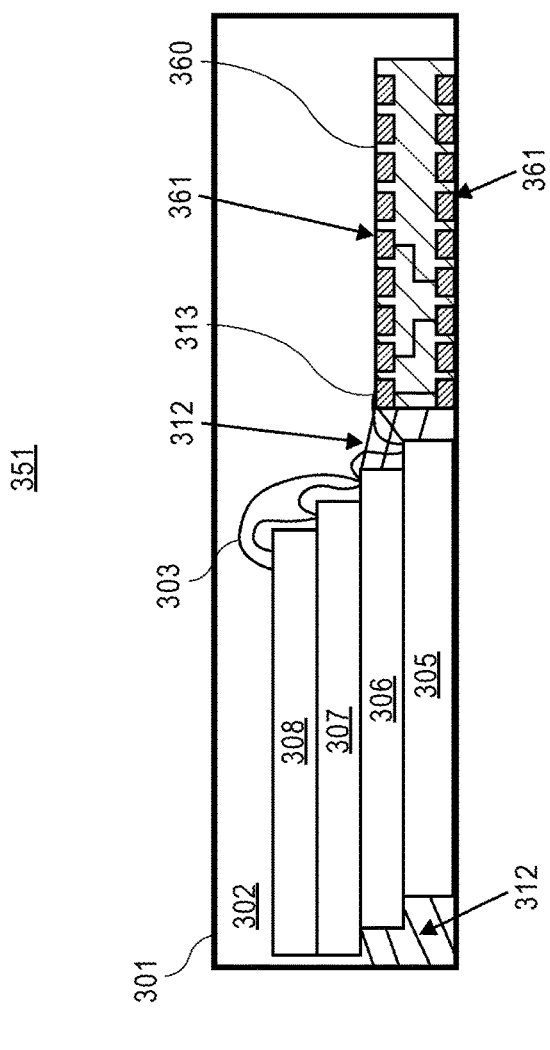
Figure 3G:
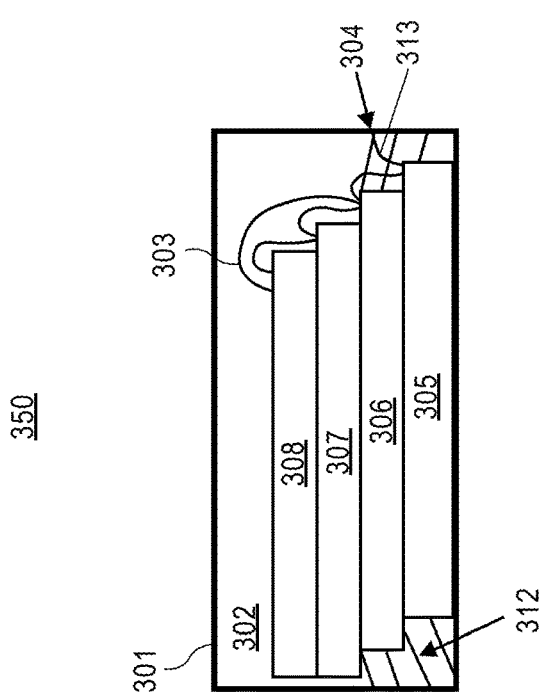

Referring now to FIGS. 3G-H, the package layer is singulated to provide one or more semiconductor packages 350-351 with two encapsulation layers 302 and 312. For example, each of the packages 350-351 may be diced along a plurality of fiducial lines to extract each of the packages 350-351 from the package layer. FIG. 3G illustrates a semiconductor package 350 that is singulated without the PCB 360. For some embodiments, the semiconductor package 350 has a surface 304 that may also have a coating (not shown) that electrically isolates the interconnect end 313 from the external environment. Meanwhile, FIG. 3H illustrates a semiconductor package 351 that includes the PCB 360 with the one or more pads 361.

While the illustrated process flow in FIGS. 3A-H produces a semiconductor package 350 with an interconnect 313 extending to a surface 304 of an encapsulation enclosure 301 (without including a PCB with one or more pads) and a semiconductor package 351 with an interconnect 313 electrically coupling a plurality of dies 305-308 to a PCB 360 with one or more pads 361 that are formed in a single package layer, embodiments are not limited to such configurations. For example, the package layer illustrated in the process flow of FIGS. 2A-E may be used to exclusively produce either a first plurality of semiconductor packages with a PCB or a second plurality of semiconductor packages without a PCB based on design (or customer) requirements.

For some embodiments, the PCB (or the test PCB) can be tabbed cut (or removed) so that the PCB can be disposed of later for the final product. For one embodiment, the test PCB can be removed with a paddle cut, a routed laser machined, etc.

Note that the semiconductor packages 350-351 may include fewer or additional packaging components based on the desired packaging design.

FIGS. 4-7 illustrate cross-sectional views of semiconductor packages having one or more configurations based on a plurality of dies and a PCB. Note that the dies, the interconnects, the encapsulation layer, and the PCB of FIGS. 4-7 are similar to the dies 105-108, the interconnects 103 and 113, the encapsulation layer 102, and the PCB 160 of FIG. 1B, however each package layer has a different configuration (or orientation) for disposing the dies on the PCB. Also note that the present embodiments are not limited to such configurations.

FIG. 4 is a cross-sectional view of a semiconductor package 400 having an encapsulation layer 402, a PCB 460 with a cavity 440 and one or more pads 461, and a plurality of dies 405-408 that are suspended on the cavity 440 of the PCB 460, according to some embodiments.

The semiconductor package 400 has the die 405 disposed within the cavity 440 of the PCB 460 using an adhesive layer 471 (e.g., a bond film) to attach the top surface of die 405 with the bottom surface of die 406. For one embodiment, the dies 405-408 are disposed on top of one another to form a stack. Each die 405-408 may have one or more die contacts that are each electrically coupled to at least one other die contact of another die with one or more interconnects 103. In addition, one or more interconnects 403 may be electrically coupled to one or more pads 461 of the PCB 460.

According to one embodiment, the package layer also has the encapsulation layer 402 formed over and around the dies 406-408, the interconnects 403, and the PCB 460. After overmolding, the PCB 460 has a set of pads 461 on the bottom surface of the PCB 460 that are exposed and may be used for testing, programming, and debugging. Note that suspending a die 405 inside a cavity 440 of a PCB 460 allows a die (e.g., a sensor die or any other type of dies) to be protected from the encapsulation process if needed.

In addition, according to one embodiment, the stack of dies 405-408 may be assembled together initially and then the package layer is overmolded. Alternatively, according to another embodiment, the stack of dies 406-408 may be disposed on the cavity 440 with the adhesive layer 471 and then the die 405 (or the cavity die) may be attached afterwards to the bottom surface of die 406 with the adhesive layer 471. Note that, in this case, the die 406 may leverage backside interconnects such as TSVs or TMIs.

Note that the semiconductor package 400 may include fewer or additional packaging components based on the desired packaging design.

FIG. 5 is a semiconductor package 500 having an encapsulation layer 502, a PCB 560 with a multi-level cavity 540a-b and one or more pads 561, and a plurality of dies 505-508 that are embedded in at least one of the cavities 540a-b of the PCB 560, according to some embodiments.

The semiconductor package 500 has a plurality of dies 505-508 embedded within the cavities 540a-b of the PCB 560. For one embodiment, the PCB 560 may have any desired number of cavity levels. For one embodiment, the dies 505-508 are disposed on top of one another to form a stack. Each die 505-508 may have one or more die contacts that are each electrically coupled to at least one other die contact of another die with one or more interconnects 503. In addition, one or more interconnects 503 may be electrically coupled to one or more pads 561 of the PCB 560.

According to one embodiment, the package layer has the encapsulation layer 502 formed over and around the dies 505-508, the interconnects 503, and the PCB 560. After overmolding, the PCB 560 has a set of pads 561 on the top and bottom surfaces of the PCB 560 that are exposed and may be used for testing, programming, and debugging. Note that embedding die 505-508 in a multi-level cavity 540a-b of a PCB 560 allows for additional pads 561 on both sides of the PCB 560, and thus avoids needing to remove a carrier to test/program during some of the assembly steps. This also allows for a simpler testing with light exposed on the energy harvester die (e.g., die 508).

Note that the semiconductor package 500 may include fewer or additional packaging components based on the desired packaging design.

FIG. 6 is a semiconductor package 600 having an encapsulation layer 602, a PCB 660 with a cavity 640 and one or more pads 661, and a plurality of dies 605-608 that are embedded in the cavity 640 of the PCB 660, according to some embodiments.

The semiconductor package 600 is similar to semiconductor package 500 of FIG. 5, but the semiconductor package 600 has the dies 605-608 disposed on the top surface the cavities 640 of the PCB 660 (i.e., the bottom surface of die 605 is not exposed as compared to FIG. 5). This provides a lower manufacturing cost as the bottom surface of die 605 does not have to be exposed to the environment (e.g., a temperature sensor die for food packaging).

Note that the semiconductor package 600 may include fewer or additional packaging components based on the desired packaging design.

FIG. 7 is a cross-sectional view of a semiconductor package 700 having one or more encapsulation layers 702, a PCB 760 with one or more cavities 740a-b and one or more pads 761, and a plurality of dies 706-708 that are disposed on the cavity 740a of the PCB 760 and a die 705 disposed on the cavity 740b of the PCB 760, according to some embodiments.

According to one embodiment, the stack of dies 706-708 may be embedded in cavity 740a and disposed on the top surface of the PCB 760a. In addition, according to another embodiment, the die 705 may be embedded in cavity 740b and disposed on the bottom surface of the PCB 760b. For one embodiment, the die 705 may be coupled to the PCB 760 and the other dies 706-708 with solder bumps 771 and one or more interconnects such as TSVs or TMIs or flip chip interconnects via redistribution layer.

Note that the semiconductor package 700, as illustrated in FIG. 7, allows a sensor die (e.g., die 705) to be attached without modification to the bottom surface of another die (e.g., die 406 as shown in FIG. 4). The semiconductor package 700 also allows for the compartmentalizing of two or more encapsulation layers if needed, particularly if the encapsulation specifications are unique. Also note that the semiconductor package 700 may include fewer or additional packaging components based on the desired packaging design.

FIG. 8 is a top, perspective view of a package layer 800 that has a PCB 860 with a plurality of cavities 840 and a plurality of semiconductor packages 845, according to some embodiments. For some embodiments, the semiconductor packages 845 may be similar to the packages 100 and 150 of FIGS. 1A-B, the packages 250-251 of FIGS. 2D-E, the packages 350-351 of FIGS. 3G-H, the packages 400, 500, 600, and 700 of FIGS. 4-7, and the packages 945 of FIG. 9.

Referring now to FIG. 8, the package layer 800 may be the PCB 860 having the one or more cavities 840, according to one embodiment. According to some embodiments, as shown in a panel-level perspective view, the PCB 860 may be formed to have the one or more cavities 840 and then the system components (e.g., the dies, the interconnects, etc.) may be disposed within the one or more cavities 840. In addition, the package layer 800 may further include a top surface 860a with pads 861 and a bottom surface 860b with pads 862. For example, the pads 861-862 may be similar the pads in FIGS. 2-7, which may be used for testing, debugging, verifying, and/or programming.

Thereafter, for one embodiment, an encapsulation layer (not shown) may be deposited over the one or more PCB cavities 840 to enclose the plurality of semiconductor packages 845. As such, the PCB 860 may be used at the panel-level to assemble the plurality of semiconductor packages 845, where each of the semiconductor packages 845 may be singulated after the overmolding process into individual units without or with the PCB (as shown in FIGS. 1A-B). For some embodiments, the system components are assembled together prior to disposing the components into the cavities 840 of the PCB 860. For other embodiments, as shown in FIGS. 3A-H, the system components and the encapsulation layers may be formed and deposited at different stages of the assembly process to allow for intermediate testing.

For some embodiments, a PCB with cavities may be leveraged to include a portion of the wire bond stack of integrated circuits (ICs). For example, this PCB may be used to redistribute signals and enable further signal conditioning or functioning on the package (e.g., by adding a radio-frequency (RF) antenna into the PCB). The PCB can also be leveraged to protect the die sensors that have special requirements, such as pressure sensors which must have low, symmetric stresses around the four sides. Additionally, the PCB (e.g., PCB 860) also enables double-sided processing and may separate mixed encapsulate requirements and inter-action issues. For some embodiments, the PCB (as described herein and illustrated in FIGS. 1-9) improves the overall architectural or configurational flexibility of the package with minimal impact to the overall volumetric form factor (i.e., maintaining an ultra-small form factor for the package).

Note that the package layer 800 may include fewer or additional packaging components based on the desired packaging design.

FIG. 9 is a top, perspective view of a PCB 960 with a plurality of cavities 940 and one or more channels 941, according to one embodiment. The PCB 960 also includes a plurality of semiconductor packages 945 disposed on the one or more cavities 940 of the PCB 960. For some embodiments, the semiconductor packages 945 may be similar to the packages 100 and 150 of FIGS. 1A-B, the packages 250-251 of FIGS. 2D-E, the packages 350-351 of FIGS. 3G-H, the packages 400, 500, 600, and 700 of FIGS. 4-7, and the packages 845 of FIG. 8. Note that the plurality of units (packages) in the PCB 960 can be different from each other having varying sizes, shapes, etc. (i.e., the packages do not have to be identical).

According to some embodiments, the package layer 900 is similar to the package layer 800 of FIG. 8, but the package layer 900 includes the one or more channels 941 that may be used to allow an encapsulation overflow between the package units and account for component size tolerance. Additionally, depending on the overmolding process, it might be preferable to have the one or more channels 941 between each of the packages 945. This enables volumetric control consistent with typical high volume manufacturing (HVM) tools rather than the precision volumes required for single units at one time.

Note that the package layer 900 may include fewer or additional packaging components based on the desired packaging design.

FIG. 10 is a process flow 1000 illustrating a method of forming a semiconductor package having a plurality of dies, one or more interconnects, an encapsulation layer, and a substrate with one or more pads, according to one embodiment. FIG. 10 illustrates a process flow 1000 of forming a semiconductor package as shown in FIG. 1A. In addition, the process flow 1000 may be similar to the method of forming a semiconductor package as shown in FIGS. 2A-E. Note that the process flow 1000 may be used to form a semiconductor package as shown in FIG. 3G.

At block 1005, the process flow 1000 electrically couples a die contact of a die to a pad on a substrate with an interconnect, where the substrate is adjacent to the die (as shown in FIG. 2A). For example, a package layer may electrically couple at least one die contact of a die from a plurality of dies to a pad on a substrate with at least one interconnect from one or more interconnects, where the substrate is adjacent to the plurality of dies.

At block 1010, the process flow 1000 disposes a plurality of dies on top of one another to form a stack (note that this may include the die from block 1005), where each die has a top surface and a bottom surface, where each die has one or more die contacts on the top surface and/or the bottom surface that are each electrically coupled to at least one die contact of another die with one or more interconnects (as shown in FIG. 2A). For example, the plurality of dies may have contacts on one surface only or on both surface (e.g., TSVs). Note that the process flow 1000 may be assembled in any configuration needed and is not limited to the sequential order of blocks 1005 and 1010 (i.e., the step of block 1010 may be implemented first, and then the step of block 1005 is assembled—or vice-versa). For example, for some embodiments, a process flow may dispose the substrate first and then the dies may be disposed on the substrate using the substrate pattern as fiducials. Also note that steps 1005 and 1010 maybe repeated for different sets of dies to enable testing during the manufacturing rather than at the last step.

At block 1015, the process flow 1000 form an encapsulation layer over and around the plurality of dies, the one or more interconnects, and the substrate (as shown in FIG. 2B). At block 1020, the process flow 1000 severs the encapsulation layer and the interconnect to the pad on the substrate to form one or more semiconductor packages (as shown in FIG. 2D), where some of the semiconductor packages include the substrate and some packages do not include the substrate. For example, the process flow may sever the interconnect to form a surface on the encapsulation layer (as shown in FIG. 2D) (e.g., the surface may be coplanar to one of the surfaces of the encapsulation layer). Note that the process flow 1000 may also include two or more encapsulation layers and any other configuration for the dies, the interconnects, and the substrate.

FIG. 11 is a process flow 1100 illustrating a method of forming a semiconductor package having a plurality of dies, one or more interconnects, and one or more encapsulation layers, according to one embodiment. FIG. 11 illustrates a process flow 1100 of forming a semiconductor package as shown in FIG. 1B. In addition, the process flow 1100 may be similar to the method of forming a semiconductor package as shown in FIGS. 2A-E. Note that the process flow 1100 may be used to form a semiconductor package as shown in FIG. 3H.

At block 1105, the process flow 1100 disposes a first set of dies on top of one another to form a stack, wherein each die has a top surface and a bottom surface that is opposite from the top surface, wherein each die has one or more die contacts on the top surface that are each electrically coupled to at least one die contact of another die with one or more interconnects (as shown in FIG. 2A).

At block 1110, the process flow 1100 disposes a substrate adjacent to the plurality of dies, wherein the substrate includes a first set of pads on a top surface and a second set of pads on a bottom surface that are opposite from the top surface (as shown in FIG. 2A). At block 1115, the process flow 1200 electrically couples at least one die contact to at least one pad of the first set of pads of the substrate with at least one of the interconnects (as shown in FIG. 2A).

At block 1120, the process flow 1100 forms an encapsulation layer over and around the plurality of dies, the one or more interconnects, and the substrate, wherein the second set of pads on the bottom surface of the substrate are exposed (as shown in FIG. 2C). Furthermore, after overmolding, a carrier may be removed to expose the second set of pads on the bottom surface of the substrate, according to one embodiment.

For some embodiments, the encapsulation layer may include a first encapsulation layer and a second encapsulation layer. As such, the first encapsulation layer may be initially deposited over and around one or more of the dies and one or more of the interconnects, and then the second encapsulation layer may be deposited over and around the first encapsulation layer, the remaining dies, and the remaining interconnects, according to some embodiments. In addition, prior to depositing the second encapsulation layer, the process flow may test the first set of pads of the substrates to determine whether each of the dies and interconnects have an operational status. Note that the process flow 1100 may also include any other configuration for the dies, interconnects, and the substrate.

FIG. 12 is a process flow 1200 illustrating a method of forming a package layer having a plurality of cavities, a plurality of device packages, and a plurality of interconnects, according to one embodiment. FIG. 12 illustrates a process flow 1200 of forming a package layer as shown in FIGS. 8-9.

At block 1205, the process flow 1200 disposing a substrate having a plurality of cavities, a first set of pads, and a second set of pads on the substrate (as shown in FIG. 8-9). For example, the process flow may place the substrate on a carrier. At block 1210, the process flow disposes a plurality of device packages on the plurality of cavities of the substrate (as shown in FIGS. 8-9). For example, the plurality of device packages may be similar to the semiconductor packages of FIGS. 1A-B. At block 1215, the process flow 1200 forms a plurality of interconnects on the plurality of device packages, where each of the device packages is electrically coupled to at least one pad of the first set of pads by one of the interconnects (as shown in FIGS. 8-9). Note that each of the device packages may have similar or different/varying sizes and or shapes.

For some embodiments, the process flow 1200 may dispose a plurality of channels on the substrate, where the plurality of channels are coupled to the plurality of cavities (as shown in FIG. 9). For other embodiments, the process flow 1200 may form the first set of pads on a top surface of the substrate and the second set of pads on a bottom surface of the substrate (as shown in FIG. 8-9). For some embodiments, the process flow 1200 may deposit an encapsulation layer over and around the plurality device packages, the plurality of interconnects, and the plurality of cavities and the plurality of channels of the substrate, where the second set of pads on the bottom surface of the substrate may be exposed. Note that the process flow 1200 may also include two or more encapsulation layers and any other configuration for the dies and the substrate.

Figure 13:
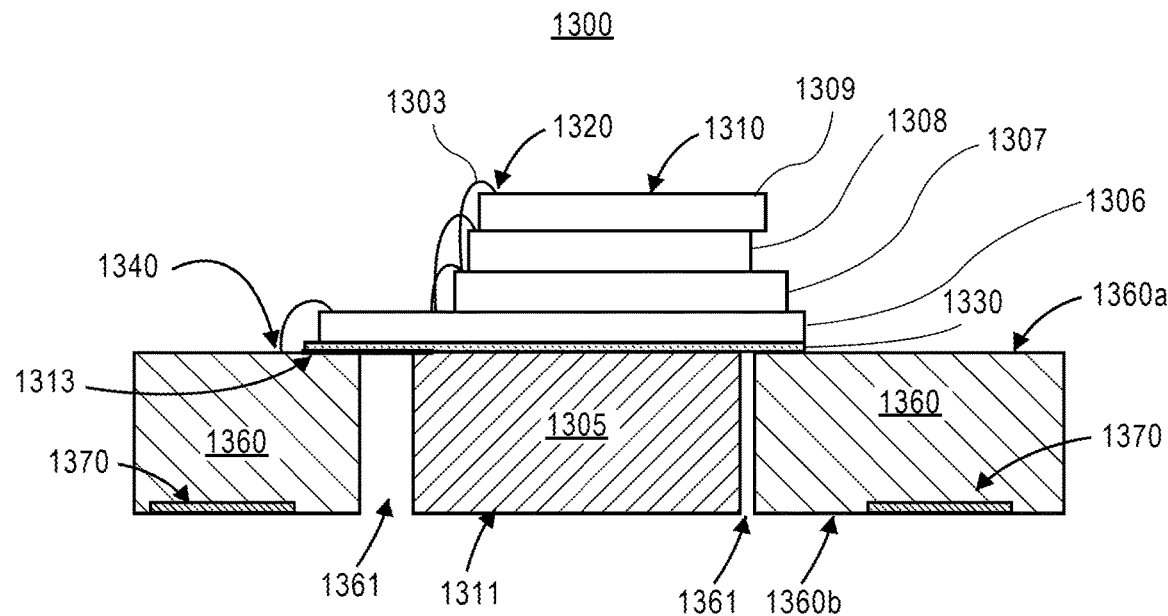
FIGS. 13-14 are cross-sectional views of semiconductor packages having one or more dies, one or more interconnects, a PCB with a cavity, according to one embodiment.
Figure 14:
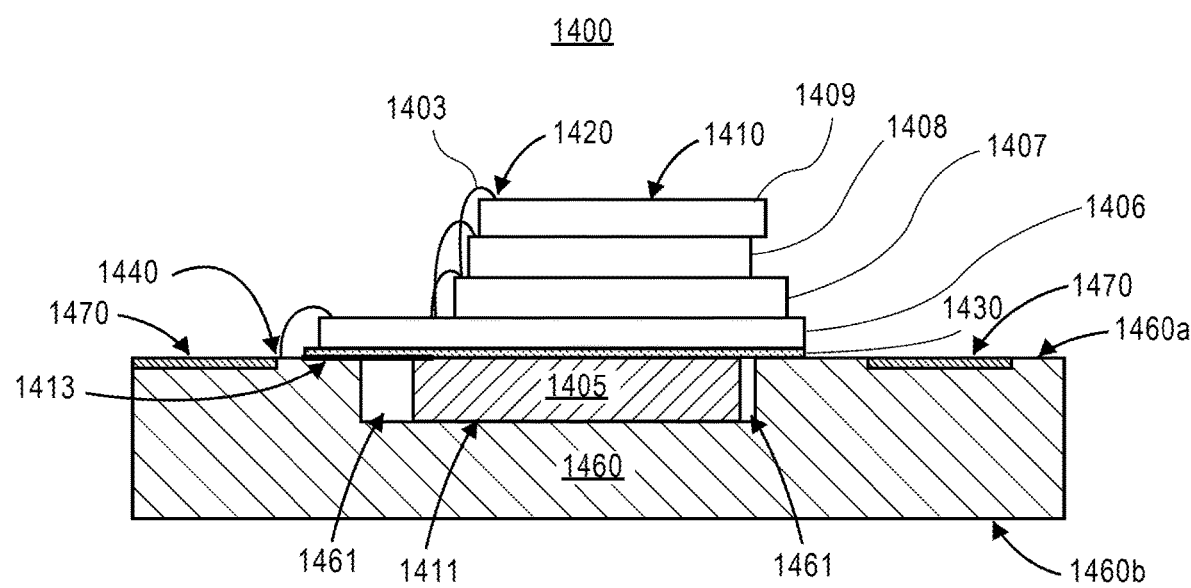

FIGS. 13-14 illustrate cross-sectional views of semiconductor packages 1300 and 1400, respectively, having a plurality of dies, one or more interconnects, and a PCB (or embedded PCB). The semiconductor package 1300 of FIG. 13 is similar to the semiconductor package 1400 of FIG. 14, however a PCB 1360 of FIG. 13 has a through-cut cavity 1361 as a PCB 1460 of FIG. 14 has a cavity 1461 with a specified depth (or z-height). As described below, the semiconductor packages 1300 and 1400 use the embedded PCB (e.g., PCB 1360 and 1460) for added functionality of the ultra-small form factor systems, such as reducing the overall z-height and volume by including/embedding a portion of the wire bond stacked dies and interconnects (e.g., dies 1305 and 1405 and interconnects 1313 and 1413 of FIGS. 13-14).

Referring now to FIG. 13, according to one embodiment, the semiconductor package 1300 includes the PCB 1360 having the cavity 1361 with a through-cut. For example, the through-cut of cavity 1361 may refer to a cavity that has exposed top and bottom surfaces (i.e., the depth of the cavity is roughly equal to the z-height of the PCB). For one embodiment, the PCB 1360 has one or more pads 1340 on a top surface 1360*a* of the PCB 1360. Additionally, a first die 1305 may be embedded in the cavity 1360 of the PCB 1360. For some embodiments, the cavity 1360 may have a through-cut or a specified depth (as shown in FIG. 14). Each stacked die of the semiconductor package 1300 has a top surface 1310 and a bottom surface 1311 that is opposite from the top surface 1310 (note that each surface is not shown to avoid confusion). For one embodiment, the die 1305 may have one or more die contacts (not shown), where at least one of the die contacts of die 1305 is electrically coupled to the pads 1340 with an interconnect 1313 (e.g., as shown in FIG. 17C). For some embodiments, a soft encapsulant material (not shown) may be formed and cured around the edges of the die 1305 or air may be maintained around each of the four edges between the cavity walls and the die 1305.

According to some embodiments, a second die 1306 may have an adhesive layer 1330 on the bottom surface 1311 of the second die 1306 (i.e., the backside of die 1306). For some embodiments, the second die 1306 with the adhesive layer 1330 on its backside may be disposed on the first die 1305 and the top surface 1360*a* of the PCB 1360. In this instance, the adhesive layer 1330 of the die 1306 is used to seal the die 1305 to the top surface 1360*a* of the PCB 1360. For some embodiments, the adhesive layer 1330 may have a deformation layer to accommodate the electrical contact topology on the PCB's top surface 1360*a* and any interconnects (e.g., interconnect 1313). Note that, for example, the die 1305 may need to be shielded from interference as such an electrically conductive adhesive layer may be used to electrically couple to a ground (not shown) on the PCB 1360.

For some embodiments, the semiconductor package 1300 has a plurality of dies 1307-1309 disposed on top of one another to form a stack above the second die 1306. Each of the dies 1305-1309 may have one or more die contacts 1320 on the top surface 1310 of each die 1305-1309. In addition, according to some embodiments, the one or more die contacts 1320 of each die 1305-1309 may be electrically coupled to at least one of the die contacts 1320 of another die 1305-1309 and/or the pads 1340 of the PCB 1360 using the interconnects 1303 and 1313. For one embodiment, the semiconductor package 1300 may have a sealant formed on the pads 1340 of the PCB 1360 and the one or more interconnects 1303 and 1313 that are coupled to the pads 1340.

Figure 15:
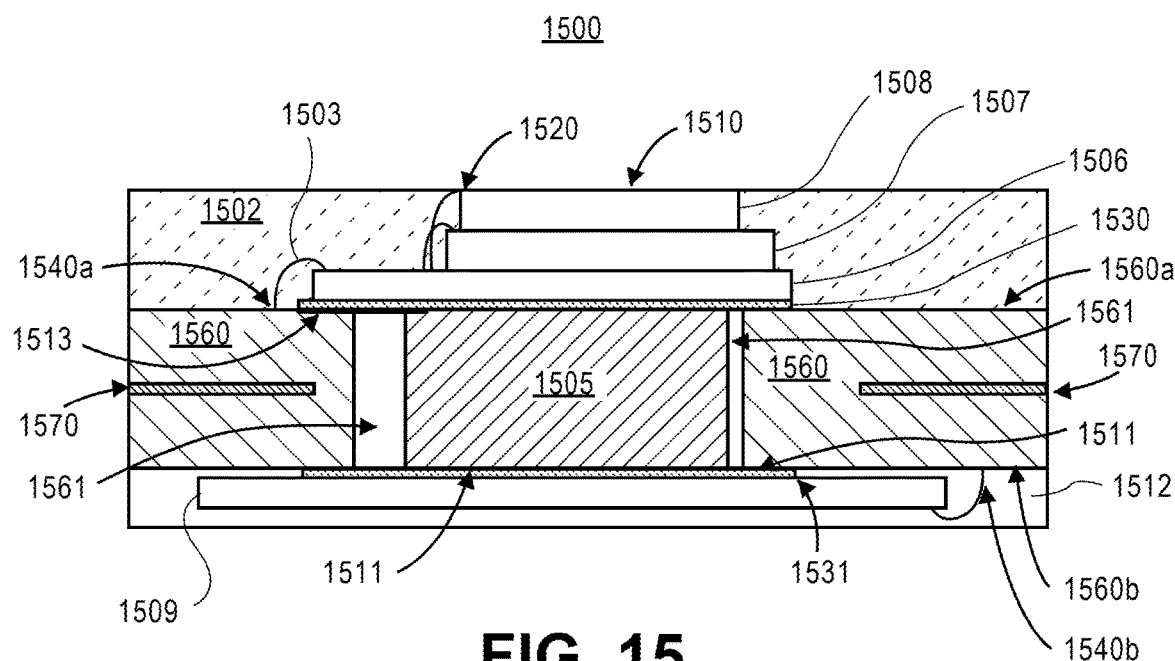
FIGS. 15-16 are cross-sectional views of semiconductor packages having one or more dies, one or more interconnects, one or more encapsulation layers, and a PCB with a cavity, according to one embodiment.
Figure 16:
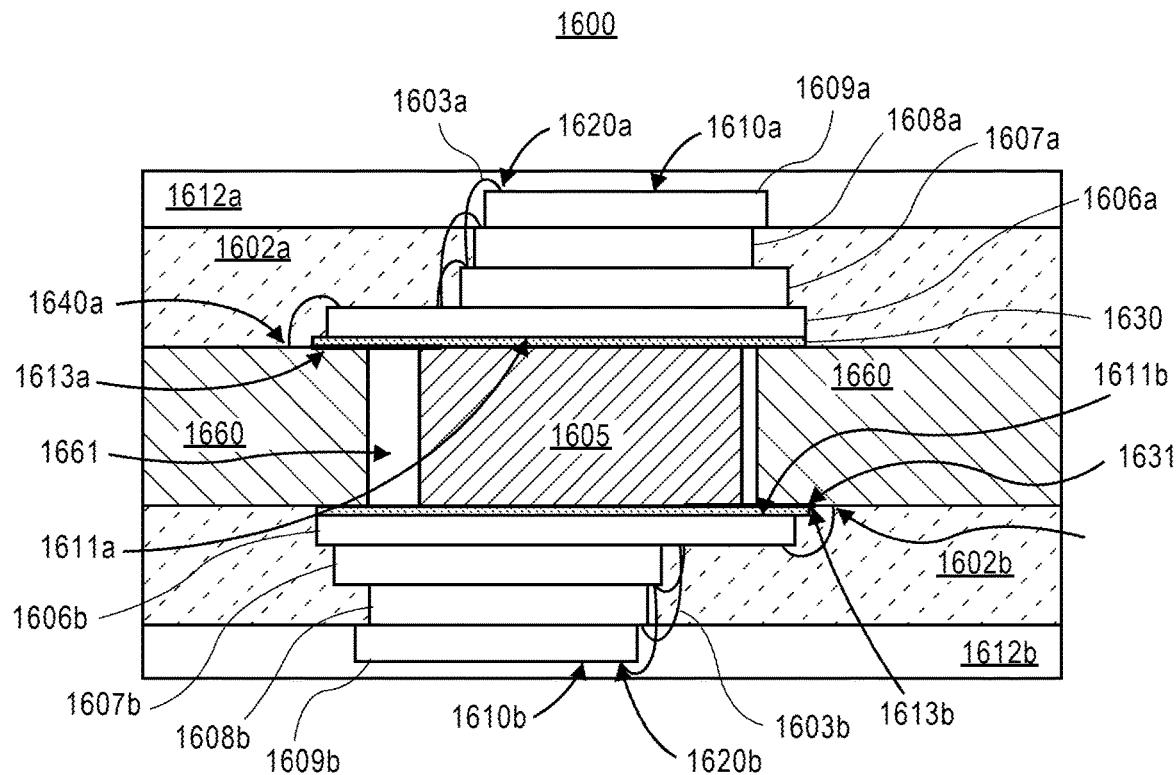

According to one embodiment, the die 1305 may be a pressure sensor, the die 1306 may be a battery, the die 1307 may be a decoupling capacitor, the die 1308 may be a radio, and the die 1309 may be a solar cell (or any other energy harvest). Additionally, the total number of dies for each package is not limited to a specific number of dies (i.e., a package can have Nth number of dies based on a design or customer requirements). For alternative embodiments, a plurality of dies may be vertically stacked to minimize the overall volume and z-height, but the plurality of dies may also be arranged in any specified orientation to have any other desired configuration (e.g., as shown in FIGS. 15 and 16).

The PCB 1360 includes the cavity 1361 to embed a portion of the interconnects 1313 and the interconnected stack of dies 1305-1309 (i.e., die 1305 is embedded, however more than one die may be embedded in the cavity). The PCB 1360 thus allows the overall volume of the semiconductor package 1300 to be reduced, while also providing redistribution of signals and enabling further signal conditioning or functionality for the PCB 1360. For example, the PCB 1360 may also include one or more antennas 1370 (e.g., radio frequency (RF) antennas) to enhance the signal conditioning and functionality of the semiconductor package 1300. As shown in FIG. 13, the one or more antennas 1370 may be disposed on the bottom surface 1360*b* of the PCB 1360, however the antennas may be disposed on any surface (or intermediate layer(s)) of the PCB (e.g., as shown in FIGS. 14 and 15) pending directionality & frequency sensitivity required for transmit and/or receive.

In addition, the embedded PCB 1360 can also be leveraged to protect dies (or sensors) that have special requirements, such as a pressure sensor that needs low, symmetric stresses around the four sides of the sensor. The embedded PCB 1360 further (i) enables double-sided processing on both surfaces 1360*a-b* (and any other layers formed within the PCB) and (ii) facilitates separate encapsulant requirements and interaction issues (e.g., die 1305 may be encapsulated with air, while dies 1306-1309 may be encapsulated with one or more encapsulation layers as shown in FIGS. 15-16). Accordingly, this improved architectural or configurational flexibility of the embedded PCB 1360 is included with minimal impact to the volumetric ultra-small form factor of the semiconductor package 1300.

Referring now to FIG. 14, according to one embodiment, the semiconductor package 1400 includes the PCB 1460 that has cavity 1461 with a specified depth. For example, the cavity 1461 may refer to a cavity that has either an exposed top surface or bottom surface with the depth needed to embed a desired die (i.e., the depth of the cavity is roughly equal to the z-height of the die). For one embodiment, the PCB 1460 has one or more pads 1440 on a top surface 1460*a* of the PCB 1460. Additionally, a first die 1405 may be embedded in the cavity 1460 of the PCB 1460. For example, the through-cut of cavity 1361 may refer to a cavity that has exposed top and bottom surfaces (i.e., the depth of the cavity is roughly equal to the z-height of the PCB). Each stacked die of the semiconductor package 1400 has a top surface 1410 and a bottom surface 1411 that is opposite from the top surface 1410 (note that each surface is not shown to avoid confusion). For one embodiment, the die 1405 may have one or more die contacts (not shown), where at least one of the die contacts of die 1405 is electrically coupled to the pads 1440 with an interconnect 1413 (e.g., as shown in FIG. 17C). For some embodiments, a soft encapsulant material (not shown) may be formed and cured around the edges of the die 1405 or air may be maintained around each of the four edges between the cavity walls and the die 1405.

According to some embodiments, a second die 1406 may have an adhesive layer 1430 on the bottom surface 1411 of the second die 1406 (i.e., the backside of die 1406). For some embodiments, the second die 1406 with the adhesive layer 1330 on its backside may be disposed on the first die 1405 and the substrate 1460. In this instance, the adhesive layer 1430 of the die 1306 is used to seal the die 1405 to the top surface 1460*a* of the PCB 1460. For some embodiments, the adhesive layer 1430 may have a deformation layer to accommodate the electrical contact topology on the PCB's top surface 1460*a* and any interconnects (e.g., interconnect 1413). Note that, for example, the die 1405 may need to be shielded from interference as such an electrically conductive adhesive layer may be used to electrically couple to a ground (not shown) on the PCB 1460.

For some embodiments, the semiconductor package 1400 has a plurality of dies 1407-1409 disposed on top of one another to form a stack above the second die 1406. Each of the dies 1405-1409 may have one or more die contacts 1420 on the top surface 1410 of each die 1405-1409. In addition, according to some embodiments, the one or more die contacts 1420 of each die 1405-1409 may be electrically coupled to at least one of the die contacts 1420 of another die 1405-1409 and/or the pads 1440 of the PCB 1460 using the interconnects 1403 and 1413. For one embodiment, the semiconductor package 1400 may have a sealant formed on the pads 1440 of the PCB 1460 and the one or more interconnects 1403 and 1413 that are coupled to the pads 1440.

According to one embodiment, the die 1405 may be an accelerometer, the die 1406 may be a battery, the die 1407 may be a decoupling capacitor, the die 1408 may be a radio, and the die 1409 may be a solar cell (or any other energy harvest). In addition, the PCB 1460 may also include one or more antennas 1470 disposed on the top surface 1460*a* of the PCB 1460, however the antennas may be disposed on any surface (or intermediate layer(s)) of the PCB (e.g., as shown in FIGS. 13 and 15).

Note that the semiconductor packages 1300 and 1400 of FIGS. 13-14 may include fewer or additional packaging components based on the desired packaging design. For example, the semiconductor packages 1300 and 1400 may include one or more encapsulation layers (as shown in FIGS. 15-16) and any other configuration (or orientation) for the dies, interconnects, cavities, and PCB.

FIGS. 15-16 illustrate cross-sectional views of semiconductor packages 1500 and 1600, respectively, having a plurality of dies, one or more interconnects, one or more encapsulation layers, and a PCB. The semiconductor packages 1500 and 1600 of FIGS. 15-16 are similar to the semiconductor packages 1300 and 1400 of FIGS. 13-14, however these semiconductor packages 1500 and 1600 have one or more encapsulation layers and one or more stacks using double-sided interconnects.

Referring now to FIG. 15, according to one embodiment, the semiconductor package 1500 includes the PCB 1560 having the cavity 1561 with a through-cut. For one embodiment, the PCB 1560 has one or more pads 1540*a* on a top surface 1560*a* of the PCB 1560 and one or more pads 1540*b* on a bottom surface 1560*b* of the PCB 1560. Additionally, a first die 1505 may be embedded in the cavity 1560 of the PCB 1560. For one embodiment, the die 1505 may have one or more die contacts (not shown), where at least one of the die contacts of die 1505 is electrically coupled to the pads 1540*a* (or pads 1540*b*) with an interconnect 1513 (e.g., as shown in FIG. 17C). For some embodiments, a soft encapsulant material (not shown) may be formed and cured around the edges of the die 1505 or air may be maintained around each of the four edges between the cavity walls and the die 1505.

According to some embodiments, a second die 1506 may have an adhesive layer 1530 on a bottom surface 1511 of the second die 1506 (i.e., the backside of die 1506). For some embodiments, the second die 1506 with the adhesive layer 1530 on its backside may be disposed on the top surface 1510 of the first die 1505 and the top surface 1560*a* of the substrate 1560. Furthermore, for one embodiment, a third die 1509 may have an adhesive layer 1531 on the bottom surface 1511 of the third die 1509. For some embodiments, the third die 1509 with the adhesive layer 1531 on its backside may be disposed on the bottom surface 1511 of the first die 1505 and the bottom surface 1560*b* of the substrate 1560. In this instance, the adhesive layers 1530-1531 of the dies 1506 and 1509 may be used to seal the die 1505 to the top and bottom surfaces 1560*a-b* of the PCB 1560. As such, the semiconductor package 1500 has a first stack of dies 1506-1508 disposed on the top surface 1560*a* of the PCB 1560, and a die 1509 (or a second stack of dies as shown in FIG. 16) disposed on the bottom surface 1560*b* of the PCB 1560.

Each of the dies 1505-1509 may have one or more die contacts 1520 on the top surface 1510 of each die 1505-1509. In addition, according to some embodiments, the one or more die contacts 1520 of each die 1505-1509 may be electrically coupled to at least one of the die contacts 1520 of another die 1505-1509 and/or the pads 1540*a-b* of the PCB 1560 using the interconnects 1503 and 1513. For one embodiment, the semiconductor package 1500 may have a sealant formed on the pads 1540*a-b* of the PCB 1560 and the one or more interconnects 1503 and 1513 that are coupled to the pads 1540*a-b*.

According to one embodiment, the die 1505 may be an accelerometer, the die 1506 may be a battery, the die 1507 may be a decoupling capacitor, the die 1508 may be a radio, and the die 1509 may be a solar cell (or any other energy harvest).

For some embodiments, the PCB 1560 may also include one or more antennas 1570 to enhance the signal conditioning and functionality of the semiconductor package 1500. As shown in FIG. 15, the one or more antennas 1570 may be disposed on any layer of the PCB 1560, including any surface (or intermediate layer(s)) of the PCB (e.g., as shown in FIGS. 13 and 15). For example, the antennas 1570 may be disposed on the PCB with side-radiating implementations.

According to some embodiments, an encapsulation layer 1502 may be formed over and around the dies 1506-1508 (note that this may include the adhesive layer 1530), the interconnects 1503 and 1513, and the pads 1540*a* and top surface 1560*a* of the PCB 1560. Note that the top surface 1510 of die 1508 may be exposed or covered with the encapsulation layer. In addition, an encapsulation layer 1512 may be formed over and around the die 1509 (note that this may include the adhesive layer 1531), the interconnects 1503 and die contacts 1520, and the pads 1540*b* and bottom surface 1560*b* of the PCB 1560. For example, the die 1509 may be a solar cell as such the encapsulation layer 1512 may be formed of an UV-Visible (UV-Vis) transmittable material, while the encapsulation layer 1502 may be formed of an epoxy material (i.e., encapsulation layers 1502 and 1512 may be formed from different materials).

Referring now to FIG. 16, according to one embodiment, the semiconductor package 1600 includes the PCB 1660 having the cavity 1661 with a through-cut. For one embodiment, the PCB 1660 has one or more pads 1640*a* on a top surface 1660*a* of the PCB 1560 and one or more pads 1540*b* on a bottom surface 1560*b* of the PCB 1560. Additionally, a first die 1605 may be embedded in the cavity 1660 of the PCB 1660. For one embodiment, the die 1605 may have one or more die contacts (not shown) on a top surface 1610*a* and/or a bottom surface 1611*a*, where at least one of the die contacts of die 1605 is electrically coupled to the pads 1640*a* and/or pads 1640*b* with one or more interconnects 1613*a-b*. For some embodiments, a soft encapsulant material (not shown) may be formed and cured around the edges of the die 1605 or air may be maintained around each of the four edges between the cavity walls and the die 1605.

According to some embodiments, a second die 1606*a* may have an adhesive layer 1630 on a bottom surface 1611*a* of the second die 1606*a* (i.e., the backside of die 1606). For some embodiments, the second die 1606*a* with the adhesive layer 1630 on its backside may be disposed on the top surface 1610a of the first die 1605 and the top surface 1660a of the substrate 1660. Furthermore, for one embodiment, a third die 1606b may have an adhesive layer 1631 on the bottom surface 1611b of the third die 1606b. For some embodiments, the third die 1606b with the adhesive layer 1631 on its backside may be disposed on the bottom surface 1611a of the first die 1605 and the bottom surface 1660b of the substrate 1660. In this instance, the adhesive layers 1630-1631 of the dies 1606a-b may be used to seal the die 1605 to the top and bottom surfaces 1660a-b of the PCB 1660. As such, the semiconductor package 1600 has a first stack of dies 1606a-1609a disposed on the top surface 1660a of the PCB 1660, and a second stack of dies 1606b-1609b disposed on the bottom surface 1560b of the PCB 1660. For example, the semiconductor package 1600 is similar to the semiconductor package 1300 of FIG. 13, but this package 1600 has two sets of stacked dies 1606a-1609a and 1606b-1609b and multiple encapsulation layers 1602a-b and 1612a-b.

Each of the dies 1606a-1609a and 1606b-1609b may have one or more die contacts 1620a-b on the top surfaces 1610a-b of each die 1606a-1609a and 1606b-1609b. In addition, according to some embodiments, the one or more die contacts 1620a-b of each die 1606a-1609a and 1606b-1609b may be electrically coupled to at least one of the die contacts 1620a-b of another die 1606a-1609a and 1606b-1609b and/or the pads 1640a-b of the PCB 1660 using the interconnects 1603a-b and 1613a-b. For one embodiment, the semiconductor package 1600 may have a sealant formed on the pads 1640a-b of the PCB 1660 and the one or more interconnects 1603a-b and 1613a-b that are coupled to the pads 1640a-b.

According to one embodiment, the die 1605 may be a pressure sensor, the dies 1606a-b may be batteries, the dies 1607a-b may be decoupling capacitors, the dies 1608a-b may be radios, and the dies 1609a-b may be solar cells (or any other energy harvests). Note that the dies (e.g., dies 1606a-b) may be the same dies or different dies (i.e., die 1606a may be a battery, while 1606b is a decoupling capacitor), and the stacked dies (e.g., 1606a-1609a and 1606b-1609b) may have the same configuration or any, different orientation/configuration that is needed.

For some embodiments, the PCB 1660 may also include one or more antennas (not shown) to enhance the signal conditioning and functionality of the semiconductor package 1600. As shown in FIGS. 13-16, the one or more antennas (not shown) may be disposed on any layer of the PCB 1660.

According to some embodiments, an encapsulation layer 1602a may be formed over and around the dies 1606a-1608a (note that this may include the adhesive layer 1630), the interconnects 1603a and 1613a, and the pads 1640a and top surface 1660a of the PCB 1660. Likewise, on the opposite-side of the PCB 1660, an encapsulation layer 1602b may be formed over and around the dies 1606b-1608b (note that this may include the adhesive layer 1631), the interconnects 1603b and 1613b, and the pads 1640b and bottom surface 1660b of the PCB 1660. For some embodiments, the encapsulation layer 1602a-b may formed of the same material (e.g., an epoxy) or one or more different materials.

In addition, an encapsulation layer 1612a may be formed over and around the die 1609a, the interconnects 1603a and die contacts 1620a, and the encapsulation layer 1602a. For example, the die 1609a may be a solar cell as such the encapsulation layer 1612a may be formed of a UV-Vis transmittable material, while the encapsulation layer 1602a may be formed of an epoxy material (i.e., encapsulation layers 1502 and 1512 may be formed from different materials with different encapsulant requirements for the respective embedded dies). Likewise, on the opposite-side of the PCB 1660, an encapsulation layer 1612b may be formed over and around the die 1609b, the interconnects 1603b and die contacts 1620b, and the encapsulation layer 1602b. For some embodiments, the encapsulation layer 1612a-b may formed of the same material (e.g., a transparent material) or one or more different materials.

Note that the semiconductor packages 1500 and 1600 of FIGS. 15-16 may include fewer or additional packaging components based on the desired packaging design. For example, the semiconductor packages 1500 and 1600 may include additional encapsulation layers and any other the dies, interconnects, cavities, and PCB.

Furthermore, some of the additional advantages of the present embodiments (e.g., as shown in FIGS. 13-16) are that: (i) the semiconductor packages (e.g., semiconductor package 1300) may enable various, different layouts of the interconnected (or wire bond) stack as interconnects may be routed to the PCB (e.g., PCB 1360) rather than the exposed die pads (e.g., die contacts 1320); (ii) additional functionality may be added to the PCB (e.g., an antenna (such as antennas 1370) may be routed with prescribed directionality, integrated passives may be designed in the layers of the PCB, and surface-mount devices (SMDs) may be added as needed); (iii) the PCB may be made of traditional materials or new alternatives (e.g., liquid crystal polymer (LCP), polyimide (PI), teflon, glass, FR4, polyethylene terephthalate (PET), MIS, pre-preg, organic build-up, polyurethanes, polydimethylsiloxane (PDMS), etc.); (iv) devices (or components/features) may be added to the PCB (or package) to enable interconnections to other sub-modules with different functionality or connectorizations of specific shells or add-ons; (v) the integrated dies (or circuits) (e.g., dies 1305-1309) may have different material encapsulant requirements and may thus be separated from top-to-bottom to reduce the risk of interfacial adhesion delamination (e.g., NTV ICs (or dies) may be covered with photon-absorbing material, sputter coated with aluminum (Al) or similar reflector material, spray coated with a black artificial substance (e.g., vertically aligned carbon nanotube arrays) while the alternate side is masked, and/or a solar cell on that side may then be coated with an UV-Vis transmittable material); (vi) pressure sensors (e.g., die 1305) may be embedded including a soft encapsulation layer formed around the four sides of the pressure sensor if needed to help ensure pressure sensor stability or air around the four sides of the pressure sensor if an adhesive layer (e.g., adhesive layer 1330) is used on the interconnects (e.g., interconnects 1303 and 1313); (vii) one or more stacks of dies may be encompassed in the same design (e.g., semiconductor package 1600 of FIG. 16); and (viii) panel-level manufacturing is enabled with redistribution without the increased cost of embedded wafer-level ball grid array (eWLB) or fan-out approaches.

FIGS. 17A-17E are cross-sectional views of a process flow 1700 used to form a semiconductor package (e.g., semiconductor package 1750 of FIG. 17E) having one or more dies (e.g., dies 1705-1708F), one or more interconnects (e.g., interconnects 1703 and 1713), and a PCB 176 with a cavity 1761, according to some embodiments. FIGS. 17A-17E illustrate cross-sectional views of the process flow 1700 used to form a semiconductor package (e.g., semiconductor package 1750 of FIG. 17E) having an embedded stack of dies—without an encapsulation layer(s). According to some embodiments, a process flow 1800 of FIGS. 18A-D implements a semiconductor package similar to the semiconductor package 1750 of FIG. 17E to further illustrate forming one or more encapsulation layers on the semiconductor package (e.g., the semiconductor package 1750 of FIG. 17E). However, it is to be appreciated that the processing illustrated in FIGS. 17A-17E may be used to form a semiconductor package similar to the devices illustrated in FIGS. 13 and 14, the devices illustrated in FIGS. 15 and 16, and the devices illustrated in FIGS. 18C and 18D. Note that for simplicity a process flow for one instantiation is provided on a unit-level flow, however it is to be appreciated that the processing illustrated in FIGS. 17A-17E may be implemented on a panel-level to enable a plurality of semiconductor packages with singulation as a last step.

Figure 17A:
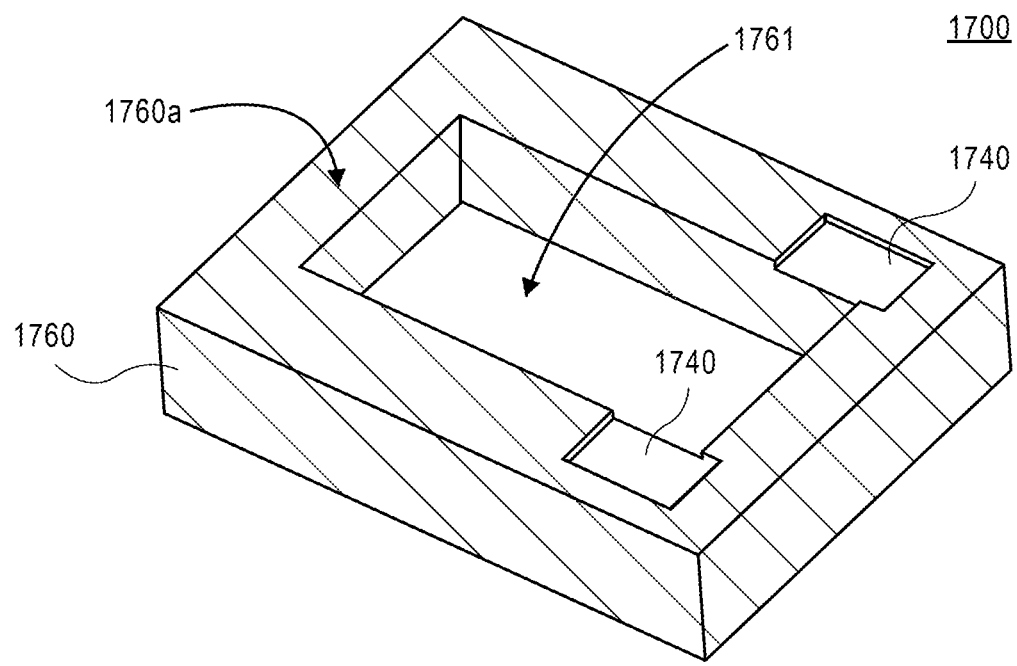
FIGS. 17A-17E are cross-sectional views of a process flow used to form a semiconductor package having one or more dies, one or more interconnects, and a PCB with a cavity, according to some embodiments.

Referring now to FIG. 17A, a cross-section view of a package layer is illustrated, according to one embodiment. According to some embodiments, the package layer may include forming a PCB 1760 with a through-cut cavity 1761 and one or more pads 1740 formed on a top surface 1760a of the PCB 1760. For one embodiment, the PCB 1760 may be formed (or disposed) on a temporary carrier (not shown) during the assembly process.

For some embodiments, the PCB 1760 may have a cavity 1761 or more than one cavity (not shown) if needed. The cavity 1761 may have a through-cut (as shown) or any specified depth (e.g., as shown with cavity 1461 of FIG. 14). According to some embodiments, the PCB 1760 may provide any redistribution of signals and embedding of signals or components. For example, pads 1740 may be used to redistribute and/or electrically couple signals and components within the PCB 1760. Note that, for example, any routing of the PCB 1760 may be included through the thickness or along the cross-section of the PCB 1760 to enable broad functionality, such as integrated passives, antennas, etc.

Figure 17B:
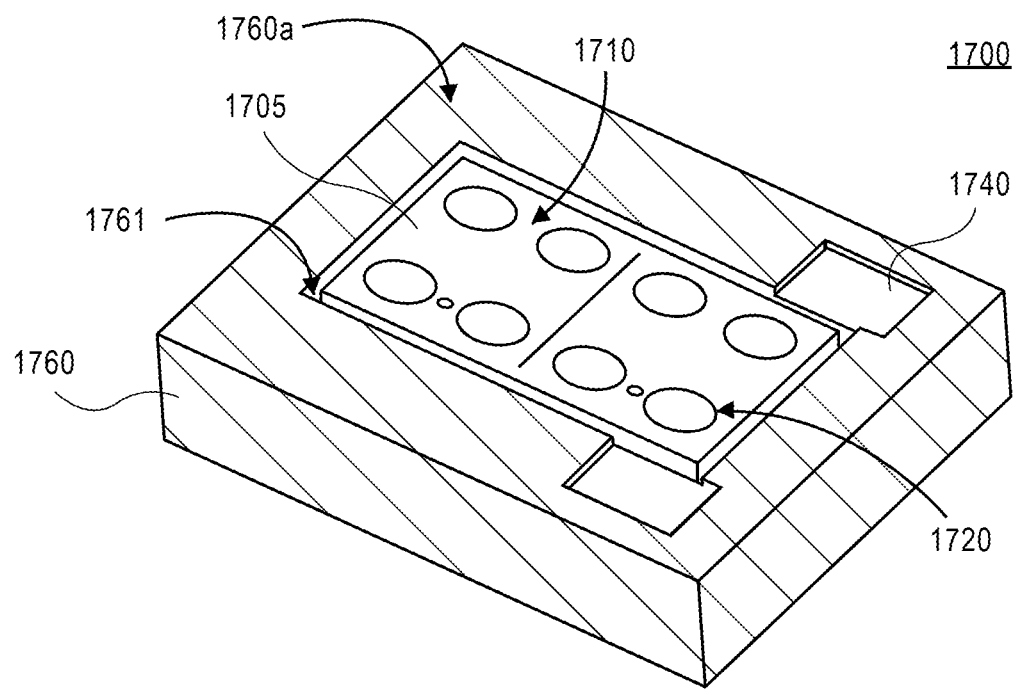
Figure 17C:
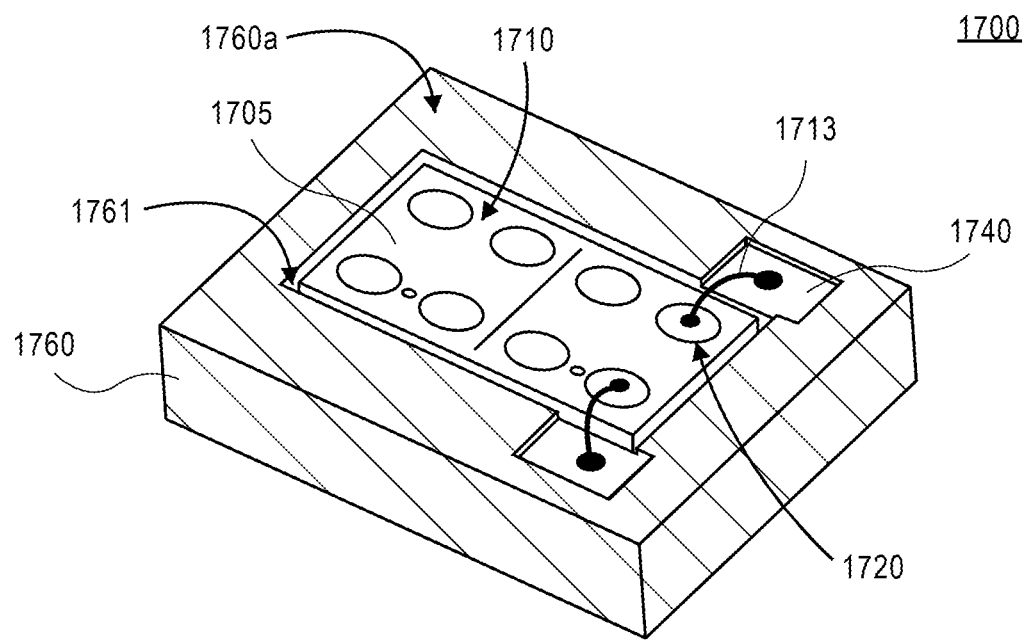

Referring now to FIG. 17B, according to some embodiments, the package layer may include disposing a die 1705 in the cavity 1761 of the PCB 1760. For example, the die 1705 may be a pressure sensor that is placed on the cavity 1761 of the PCB 1760 with a diaphragm (not shown) onto the temporary carrier (not shown). For one embodiment, the die 1705 has one or more die contacts 1720 on a top surface 1710 of the die 1705. Note that the die 1705 may also have die contacts on a bottom surface of the die 1705 (not shown). For some embodiments, a soft encapsulant material (not shown) may be deposited and cured between the four walls of the cavity 1761 and the four sides of the die 1705. For other embodiments, the cavity 1761 may have air surround the four sides of the die 1705. Referring now to FIG. 17C, the package layer may include electrically coupling at least one or more of the die contacts 1720 and the pads 1740 of the PCB 1760 with interconnects 1713. For example, the interconnects 1713 may be wires that are ball-stitch bonded (wire bonds) from the die contacts 1720 of the die 1705 to the pads 1740 of the PCB 1760. However, as described herein, the interconnects 1713 may be wire bonds, TSVs, TMIs, or a combination thereof, or any other desired type of interconnects.

Figure 17D:
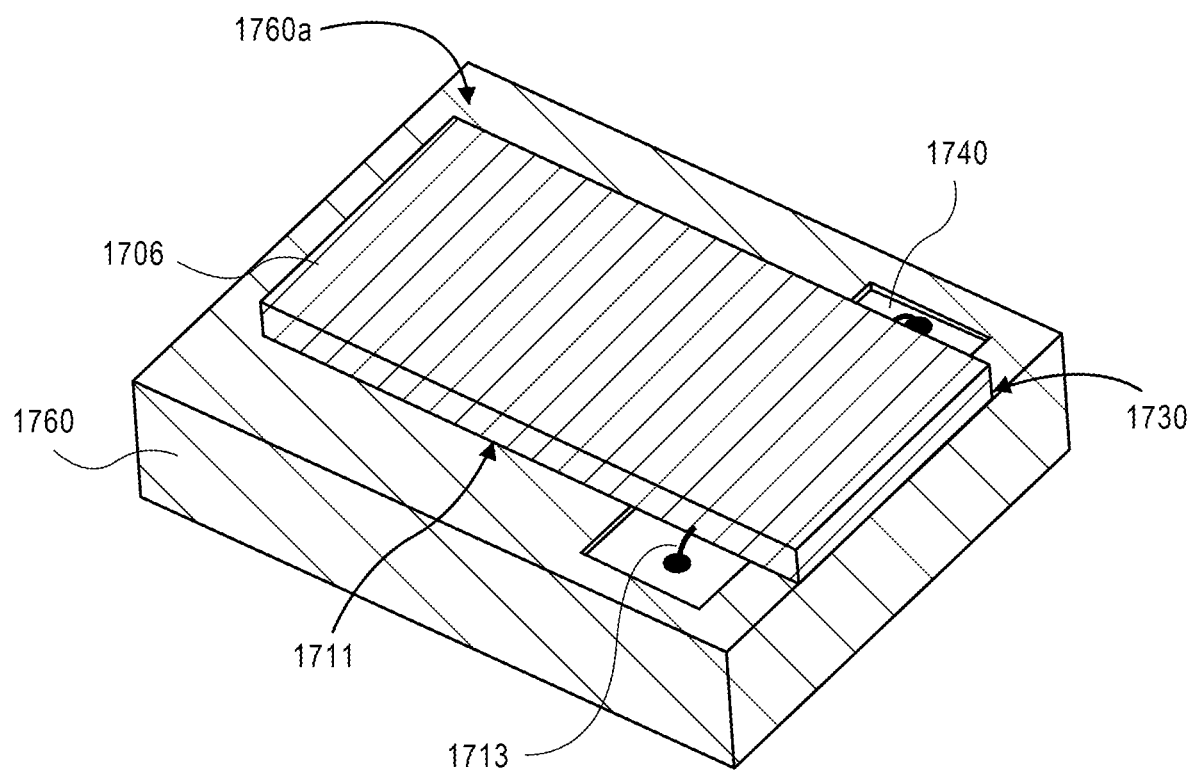

Referring now to FIG. 17D, according to some embodiments, a die 1706 may be disposed on the die 1705 and the top surface 1760a of the PCB (note that this may include a portion of the pads 1740 and interconnects 1713). For example, the die 1706 may have an adhesive layer 1730 on a bottom surface 1711 of the die 1706 (i.e., the backside of die 1706). For some embodiments, the die 1706 with the adhesive layer 1730 on its backside may be disposed on the die 1705 and the top surface 1710 of the PCB 1760. In this instance, the adhesive layer 1730 of the die 1706 is used to seal the die 1705 to the top surface 1760a of the PCB 1760. For some embodiments, the adhesive layer 1730 may have a deformation layer to accommodate the electrical contact topology on the PCB's top surface 1760a, such as a portion of the pads 1740 and interconnects 1713.

Note that, for example, the die 1705 may need to be shielded from interference as such an electrically conductive adhesive layer may be used to electrically couple to a ground (not shown) on the PCB 1760. For one embodiment, the package layer may have a sealant formed on the pads 1740 of the PCB 1760 and the one or more interconnects 1703 and 1713 that are coupled to the pads 1740.

Figure 17E:
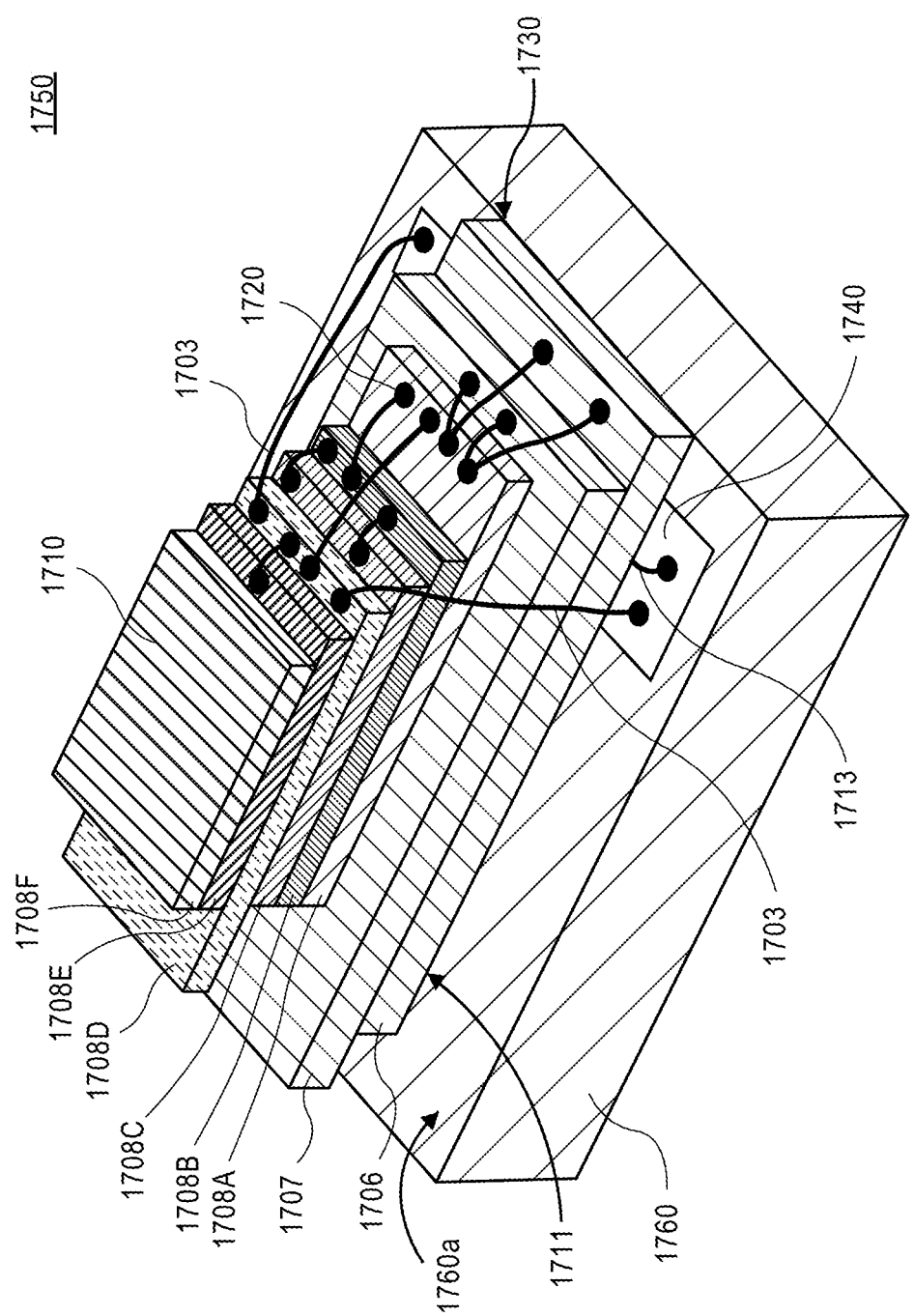

Referring now to FIG. 17E, according to some embodiments, the package layer may include stacking dies 1707-1708F above the die 1706 and interconnecting the dies 1705-1708F to each other or to the PCB 1760 to ultimately form a PCB embedded stack 1750 (also referred to as a package embedded stack). For example, after the step shown in FIG. 17D, the remaining dies 1707-1708F may then be attached and interconnected based on the design arrangement that is needed (i.e., forming the dies and die contacts in any specified orientation and location). As described above, the interconnects 1703 and 1713 may be electrically coupled (or interconnected) from one die 1705-1708F to another die 1705-1708F or one die 1705-1708F to the PCB 1760.

Each of the dies 1705-1708F may have one or more die contacts 1720 on the top surface 1710 of each die 1705-1708F. In addition, according to some embodiments, the one or more die contacts 1720 of each die 1705-1708F may be electrically coupled to at least one of the die contacts 1720 of another die 1705-1708F and/or the pads 1740 of the PCB 1760 using the interconnects 1703 and 1713. In addition, as described above, the PCB 1760 may also include one or more antennas (not shown) that may be disposed on any surface (or intermediate layer(s)) of the PCB (e.g., as shown in FIGS. 13-15).

Figure 18A:
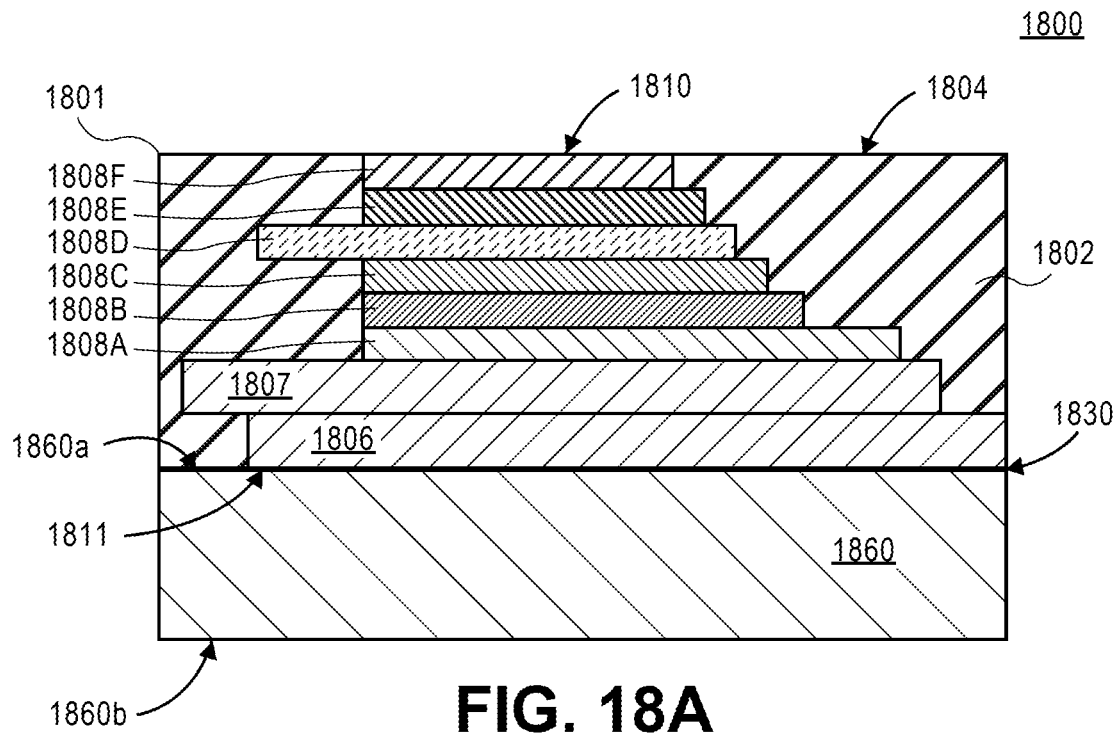
FIGS. 18A-18D are cross-sectional views of a process flow used to form a semiconductor package having one or more dies, one or more interconnects, one or more encapsulation layers, and a PCB with a cavity, according to some embodiments.
Figure 18B:
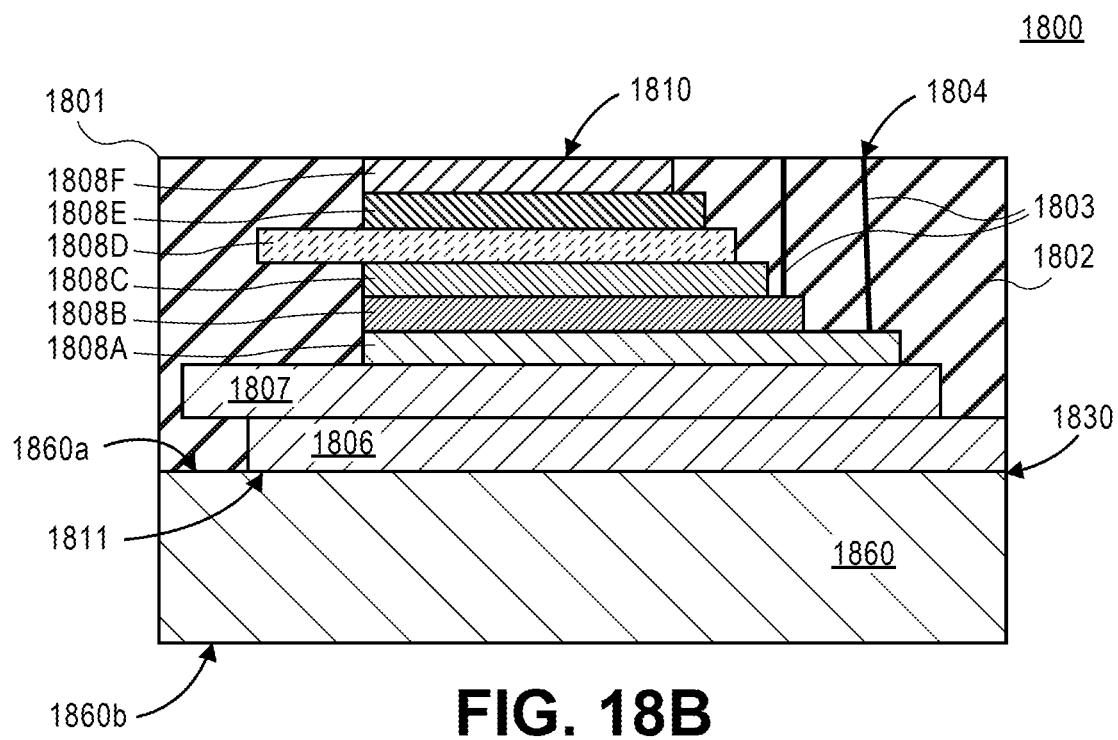
Figure 18C:
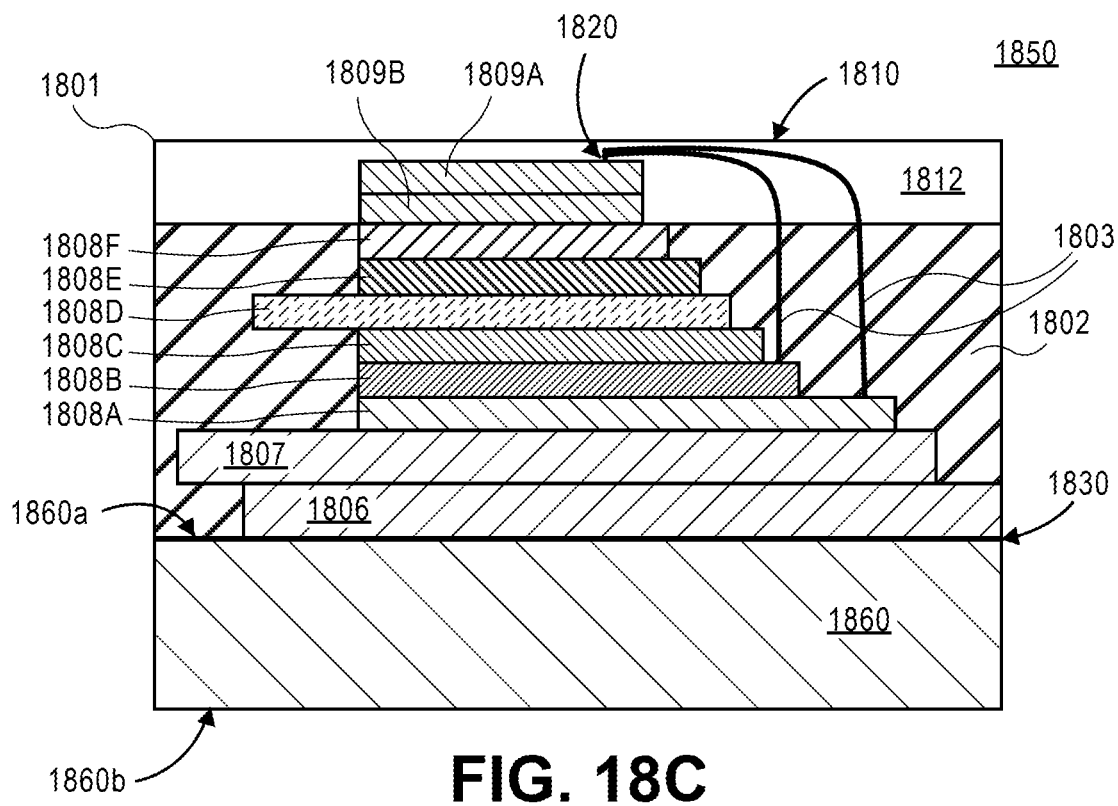
Figure 18D:
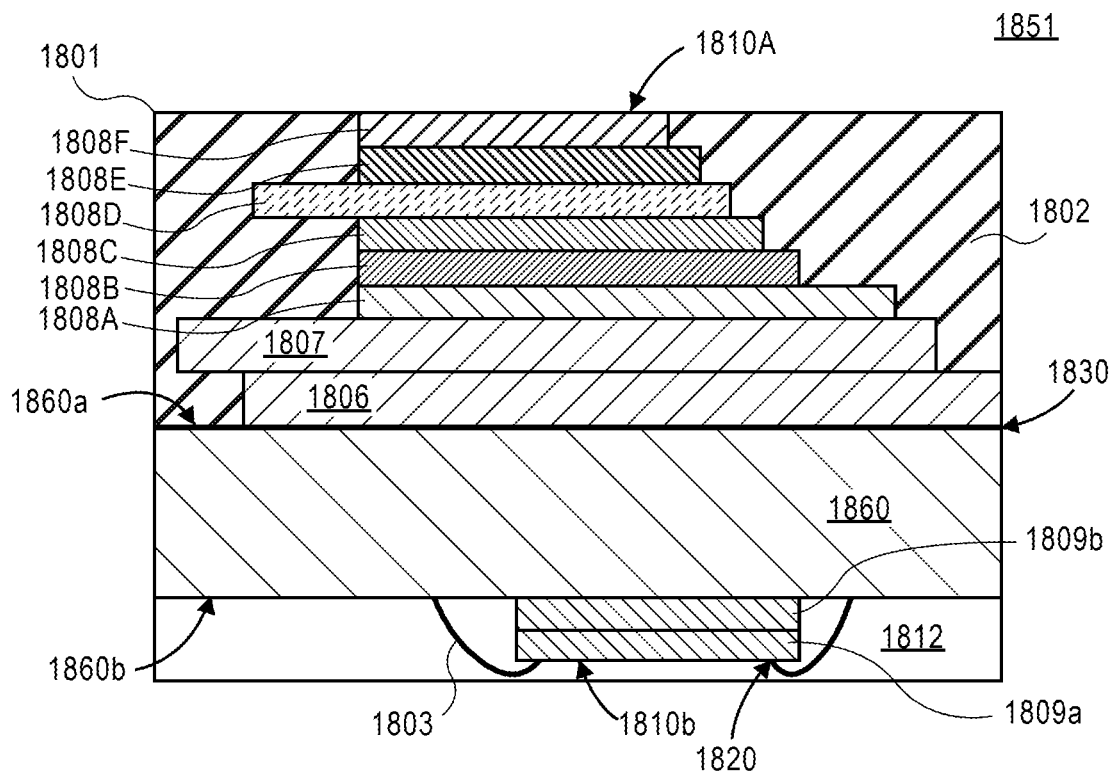

In this instance, the PCB embedded stack 1750 is then formed and may further include a spacer and a solar cell die (e.g., dies 1809B and 1809A, respectively, as shown in FIGS. 18C-D) and one or more encapsulation layers (e.g., encapsulation layers 1802 and 1812 as shown in FIGS. 18C-D) to separate the encapsulant requirements of the dies. Additionally, the total number of dies for each package is not limited to a specific number of dies (i.e., a package can have Nth number of dies based on a design or customer requirements), nor is the shape of the unit (or individual package) limited to a rectangular prism, for example, any arbitrary 3D shape is feasible (e.g., hemispherical shape, a capsule-like shape, a honeycombed shape to increase surface area, a round shape, one or more dimples to fit in certain devices, etc.). For alternative embodiments, a plurality of dies may be vertically stacked to minimize the overall volume and z-height, but the plurality of dies may also be arranged in any specified orientation to have any other desired configuration. As such, the process flow 1700 and the semiconductor package 1750 may include fewer or additional packaging components based on the desired packaging design.

FIGS. 18A-18D illustrate cross-sectional views of a process flow 1800 used to form a semiconductor package (e.g., semiconductor packages 1850-1851 of FIGS. 18C and 18D) having an embedded stack of dies (e.g., dies 1806-1809A) with one or more encapsulation layers (e.g., encapsulation layers 1802 and 1812).

According to some embodiments, a process flow 1800 of FIGS. 18A-D uses a semiconductor package similar to the semiconductor package 1750 of FIG. 17E, omitting some steps to focus on the overmolding process. However, it is to be appreciated that the processing illustrated in FIGS. 18A-18D may be used to form a semiconductor package similar to the devices illustrated in FIGS. 15 and 16 and the device illustrated in FIG. 17E. Note that for simplicity a process flow for one instantiation is provided on a unit-level flow, however it is to be appreciated that the processing illustrated in FIGS. 18A-18D may be implemented on a panel-level to enable a plurality of semiconductor packages with singulation as a last step.

Referring now to FIG. 18A, a package layer includes a stack of dies 1806-1808F (note that an additional die may be embedded in the PCB 1860) disposed on the PCB 1860. According to some embodiments, the package layer further includes forming an encapsulation layer 1802 (e.g., an epoxy) over and around the dies 1806-1808F (note that this may include an adhesive layer if needed on the backside of die 1806), one or more interconnects (not shown) and one or more pads (not shown) of the PCB 1860, and a top surface 1860a of the PCB 1860. Note that the top surface 1810 of die 1808F may be exposed or covered with the encapsulation layer 1802. Also note that the overmolding process may be implemented in batches (if needed) with or without an exposed top surface of the top die (e.g., die 1808F), where exposing the top surface of the top die may be facilitated with any known process such as laser raster, wet blast, grind, etch, etc.

Referring now to FIG. 18B, for some embodiments, the package layer may form TMIs to one or more dies or to the PCB using a laser ablate with a filling process (i.e., depositing a conductive material to fill the laser ablated openings to form the TMIs). For other embodiments, the package layer may include an interconnect loop (e.g., interconnects 1803) formed through the package prior to forming/depositing the encapsulation layer and then after molding use a grinding process to expose one or more contacts 1804 of any interconnect (e.g., interconnects 1803) that was enabled. Note that the interconnect loop may a wire bonds, a TSV, a TMV, a flip-chip, a 3D printing, an inkjet, and an ACF.

Referring now to FIG. 18C, according to some embodiments, the package layer may further include disposing dies 1809A-B on the top surface 1810 of the die 1808F (or a top surface of the encapsulation layer 1802). For example, the dies 1809A-B may be a spacer and a solar cell die that are added to finalize the stack. For one embodiment, after disposing dies 1809A-B, the stack of semiconductor package 1850 is assembled and then encapsulated with an encapsulation layer 1812, which may include an alternate material (e.g., an UV-Vis material) from the encapsulation layer 1802 (e.g., an epoxy material). For example, the encapsulation layer 1812 may be formed over and around the dies 1809A-B, one or more interconnects 1803, one or more die contacts 1820, and the encapsulation layer 1802.

According to some embodiments, the top dies 1809A-B may be electrically coupled to the rest of the package 1850 either with the exposed contacts (e.g., contacts 1804 as shown in FIG. 18B) of the interconnects 1803 or an alternate side (e.g., the bottom surface 1860b) of the PCB 1860 (as shown in FIG. 18D). In addition, for other embodiments, the package layer may have stacked the dies 1806-1809B and electrically coupled the dies 1806-1809B and the PCB 1860 with the interconnects 1803, and then formed the encapsulation layers (e.g., encapsulation layers 1802 and 1812) when the stack was assembled.

Referring now to FIG. 18D, according to alternate embodiments, the package layer may dispose dies 1809A-B on the bottom surface 1860b of the PCB 1860, such as a PCB embedded stack with double-sided interconnects. For one embodiment, after disposing dies 1809A-B, the stack of semiconductor package 1851 is assembled and then encapsulated with an encapsulation layer 1812, which may include an alternate material from the encapsulation layer 1802. For example, the encapsulation layer 1812 may be formed over and around the dies 1809A-B, one or more interconnects 1803, one or more die contacts 1820 on the top surface 1810b of the dies 1809A-B, and the bottom surface 1860b of the PCB 1860.

According to some embodiments, the dies 1809A-B may be electrically coupled to the rest of the package 1851 using the bottom surface 1860b of the PCB 1860. In addition, for other embodiments, the package layer may have stacked both set of dies 1806-1808F and 1809A-B and electrically coupled the dies 1806-1809B and the PCB 1860 with the interconnects 1803, and then formed the encapsulation layers (e.g., encapsulation layers 1802 and 1812) when the stacks were assembled.

Note that the process flow 1800 of FIGS. 18A-18D may include fewer or additional packaging components based on the desired packaging design. Also note that, according to some embodiments, the semiconductor packages (e.g., semiconductor packages 1300, 1400, 1500, and 1600 of FIGS. 13-16, and 1850-1851 of FIGS. 18C-D) may include components such as: (i) antennas on any surface or layer of a PCB, (ii) integrated passives (e.g., inductors, resistors, capacitors, and any other circuits), (iii) surface-mount devices (SMDs) or other embedded components, (iv) a PCB that may be formed of a wide variety of materials and does not have to be planar, (v) multiple cavities or thru-cuts may be made in a PCB, (vi) alternate sensors, cameras, light-emitting diodes (LEDs), or photo-detectors may be disposed on a PCB, and (vii) at least one side of a PCB may include interconnects that may socket, anisotropic conductive film (ACF), or reflow attach to other modules or systems (or packages).

FIG. 19 is a process flow 1900 illustrating a method of forming a semiconductor package having one or more dies, one or more interconnects, and a PCB with a cavity, according to one embodiment. FIG. 19 illustrates a process flow 1900 of forming a semiconductor package as shown in FIG. 18C. In addition, the process flow 1900 may be similar to the method of forming semiconductor packages as shown in FIGS. 13-16 and 17E.

At block 1905, the process flow disposes a substrate having a cavity and one or more pads on at least one of a top surface and a bottom surface that is opposite from the top surface (as shown in FIG. 17A). For example, a package layer may dispose a substrate (e.g., a PCB) with a through-cut cavity and one or more pads formed on a top surface of the substrate. For one embodiment, the substrate may be disposed on a temporary carrier during the assembly process.

At block 1910, the process flow embeds a first die in the cavity of the substrate (as shown in FIG. 17B). For example, a package layer may dispose the first die in the cavity of the substrate, where the first die may be a pressure sensor. For one embodiment, the first die may have one or more die contacts on a top surface and/or a bottom surface of the first die. In addition, for some embodiments, a soft encapsulant material (not shown) may be deposited and cured between the four walls of the cavity and the edges of the first die, or the cavity may have air surround the four walls of the cavity and the edges of the first die.

At block 1915, the process flow disposes a second die having an adhesive layer on a bottom surface of the second die, where the second die and the adhesive layer are disposed on the first die and the substrate (as shown in FIG. 17D). For example, the second die may have the adhesive layer on its backside, and the package layer may dispose the second die with the adhesive layer on the first die and/or the top surface of the substrate (note that this may include a portion of the pads and one or more interconnects). In this instance, for example, the adhesive layer and the second die may be used to seal the first die to the top surface of the substrate.

At block 1920, the process flow disposes a plurality of dies disposed on the second die and on top of one another to form a stack, wherein each die has a top surface and a bottom surface that is opposite from the top surface, wherein each die has one or more die contacts on the top surface and/or bottom surface that are each electrically coupled to at least one of the die contacts of another die and the pads of the substrate with one or more interconnects (as shown in FIG. 17E).

For example, a package layer may stack the plurality of dies on the second die. Then, continuing with the above example, the package layer may electrically couple at least one or more of the die contacts from one die to another die or from one die to the pads of the substrate using interconnects (e.g., wire bonds, TSVs, TMIs, direct write interconnects via 3d printing or inkjet printing etc.).

At block 1925, the process flow forms an encapsulation layer over and around the plurality of dies, the one or more interconnects, the one or more pads of the substrate, and the top surface of the substrate (as shown in FIGS. 15 and 18C). For example, the package layer may deposit the encapsulation layer over the plurality of dies (note that this includes the second die and/or the adhesive layer), the interconnects, the pads, and the top surface of the substrate. In addition, the encapsulation layer may further includes a first encapsulation layer and a second encapsulation layer, where the first encapsulation layer may be initially deposited over and around one or more of the dies, one or more of the interconnects, the pads, and the top surface of the substrate, and the second layer encapsulation layer may then be deposited over and around the remaining dies, the remaining interconnects, and the top surface of the first encapsulation layer.

Note that the process flow 1900 may form a semiconductor package that may include fewer or additional packaging components based on the desired packaging design. For example, the semiconductor package may include any configuration needed, including additional encapsulation layers and any other the dies, interconnects, cavities, and PCB.

FIGS. 20A-20H are plan views and corresponding plan and cross-sectional views of a process flow used to form the package layer 2000 having a plurality of device packages, a plurality of interconnects, and one or more encapsulation layers that are stacked (also referred to as a multi-material stack), according to one embodiment. FIGS. 20A-20H illustrate the package layer 2000 used to form a semiconductor package (e.g., semiconductor package 2050 of FIG. 20H) having a plurality of stacked dies (e.g., dies 2005-2009 of FIG. 20H), one or more interconnects (e.g., interconnects 2003), and one or more encapsulation layers (e.g., encapsulation layers 2002, 2012, and 2022 of FIG. 20H), according to some embodiments. Note that FIGS. 20C-20H illustrate two corresponding views of the package layer 200, a plan view of the package layer (as shown on the left) and a cross-sectional view of the respective package layer in an individual unit-level (as shown on the right), where the individual unit is one of a plurality of semiconductor packages/units.

According to some embodiments, the package layer 2000 illustrated in FIGS. 20A-20H enables a dimension tolerant, low-cost, and multi-material stack. For example, the package layer 2000 may utilize a batch process that relies on large material volume control rather than tight tolerance encapsulation/mold collaterals, materials applications, or grind control. Some of the advantages of these embodiments (e.g., as shown in FIGS. 20A-20H) are cost-efficient, accelerated stock keeping unit (SKU) adjustment, and custom build on demand with minimal manufacturing change or cost. In addition, the package layer 2000 may facilitate lowered volume for the overall packages as overmolding is dispensed or paste printed to control the overall z-height of the packages.

For some embodiments, the one or more encapsulation layers (e.g., encapsulation layers 2002, 2012, and 2022 of FIG. 20H) illustrated in FIGS. 20A-20H may include, but are not limited to, ultra-compliant materials for pressure sensors, visible light, UV and IR absorbing/reflective materials to block photons from the dies, stiff polymers to encapsulate the interconnects, and/or transparent materials on energy harvests (e.g., solar cells). In addition, the one or more encapsulation layers as described herein may also include visible light, UV and/or IR blocking agents or metals (e.g., aluminum to block light) that are selectively sputtered on the packages.

Figure 20A:
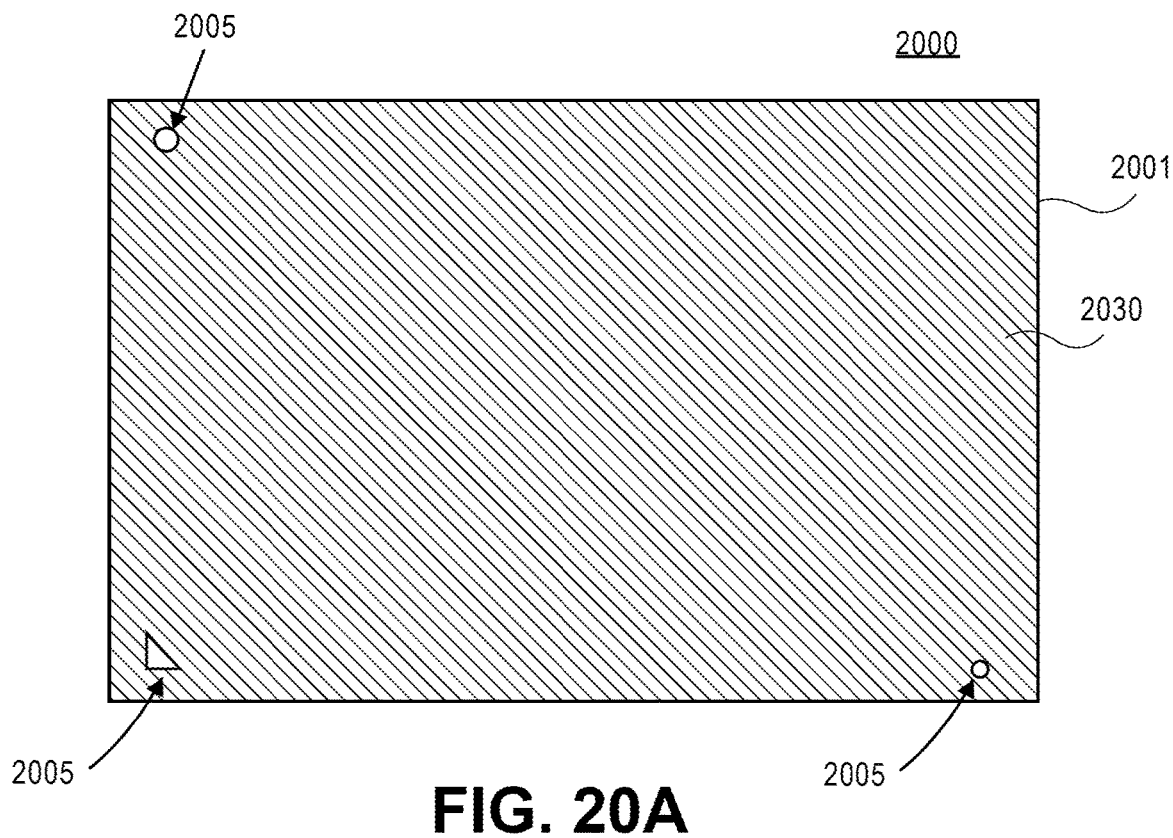
FIGS. 20A-20B are plan views of a process flow used to form a package layer having a plurality of device packages, a plurality of interconnects, and one or more encapsulation layers that are stacked, according to one embodiment.

Referring now to FIG. 20A, a package layer 2000 may have a panel 2001 (or a temporary carrier) with a first set of fiducials 2005 that are covered with an adhesive layer 2030, according to one embodiment. The package layer 2000 illustrates forming the adhesive layer 2030 on the panel 2001 that has the first set of fiducials 2005. For some embodiments, the adhesive layer 2030 may include a bond film, a one/double sided tape, a thermal tape, an attach film, or any other type of adhesive. For one embodiment, the first set of fiducials 2005 may be used to align an encapsulation dam (as shown in FIG. 20B) or accommodate to any package design.

Figure 20B:
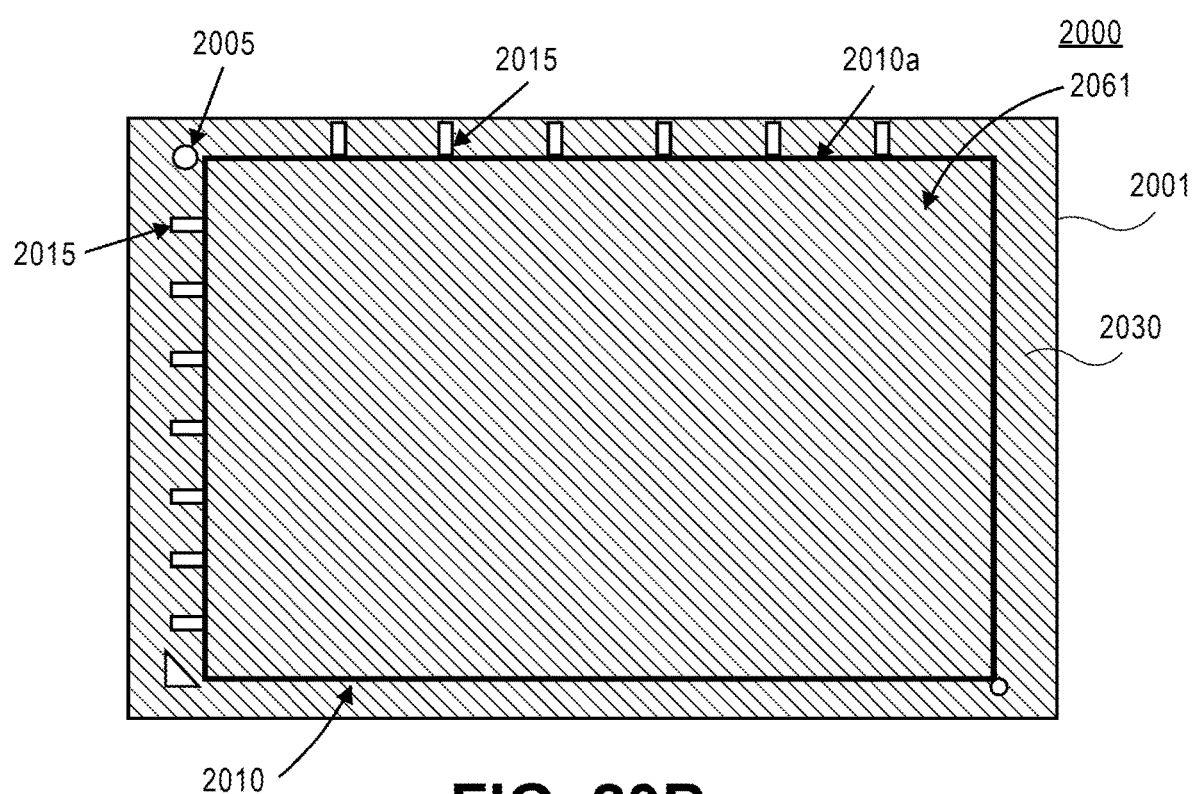

Referring now to FIG. 20B, the package layer 2000 may include disposing a dam 2010 with a cavity 2061 on the adhesive layer 2030, according to one embodiment. For example, the dam 2010 is disposed on the adhesive layer forming the cavity 2061 with the bottom surface covered with the adhesive layer, while the top surface is exposed. In addition, for some embodiments, the package layer 2000 may form a set second of fiducials 2015 with a laser to denote singulation patterns. For example, the second set of fiducials 2015 may be formed on the adhesive layer 2030 and adjacent to an outer surface 2010*a* of the dam 2010, where the second set of fiducials 2015 may be formed outside of the dam 2010 and aligned adjacently to at least two outer-edge walls (e.g., aligned on the x-y axis) of the dam 2010. Note that the second set of fiducials 2015 may be used to form a plurality of compartments (e.g., a plurality of compartments 2055 of FIG. 20H) that house a plurality of semiconductor packages (e.g., a plurality of semiconductor packages 2045 of FIG. 20H) and align with the saw fiducials (e.g., fiducial lines 2025 of FIG. 20H) during the singulation process and formed with any configuration. Also note that the exact location and placement of the second set of fiducials 2015 is illustrative (i.e., the fiducials as shown in FIGS. 20B-20H may not be to scale) and may be changed based on the desired number of semiconductor packages and requirements.

Referring now to FIG. 20C, the package layer 2000 illustrates disposing a first plurality of dies 2005 in the cavity 2061 of the dam 2010 formed on the adhesive layer 2030, according to one embodiment. For example, the first plurality of dies 2005 are disposed on the adhesive layer 2030 using the second set of fiducials 2015 to align each die within one of the compartments 2055 (i.e., within a prescribed array having the lines/boundaries formed by the fiducials 2015 and/or the dam 2010). For some embodiments, the first plurality of dies 2005 may be pressure sensors. As shown in the cross-sectional view of FIG. 20C, one of the first dies 2005 is illustrated having a top surface 2020 and a bottom surface 2021 that is opposite of the top surface 2020. Note that a few components may be omitted for simplicity (e.g., the adhesive layer and the panel formed below the die).

Referring now to FIG. 20D, the package layer 2000 includes forming a first encapsulation layer 2002 around the first plurality of dies 2005, according to one embodiment. In addition, for some embodiments, the first encapsulation layer 2002 (e.g., a soft epoxy) is formed within the dam 2010 filling up to a plurality of top surfaces 2020 of the first plurality of dies 2005 and then the first encapsulation layer 2002 is cured.

As shown in the cross-sectional view of FIG. 20D, the package layer 2000 illustrates the first die 2005 having the first encapsulation layer 2002 formed around the edges of the first die 2005. Note that after overmolding and curing the first encapsulation layer 2002, a top surface 2002a of first encapsulation layer 2002 may not be planar as the top surface 2002a curtails based on one or more factors (e.g., coefficient of thermal expansion (CTE) mismatch, z-height of the adjacent die, pressure created by stacking additional encapsulation layers, material properties of the encapsulation layers, etc.). For example, the top surface 2002a may have a rounded shape or rounded angles (e.g., hill-shaped) that ends (or plateaus) at the top surface 2020 of the first die 2005. Furthermore, according to other embodiments, the package layer 2000 may form the first encapsulation layer 2002 to have any desired shape (e.g., hemispherical shape, a capsule-like shape, a honeycombed shape to increase surface area, a round shape, one or more dimples to fit in certain devices, etc.).

Referring now to FIG. 20E, the package layer 2000 illustrates disposing a second plurality of dies 2006-2008 on the top surfaces 2020 of the first plurality of dies 2005, according to one embodiment. For some embodiments, the second plurality of dies 2006-2008 may include one or more different dies. For example, dies 2006 may be batteries, dies 2007 may be decoupling capacitors, and dies 2008 may be radios. In addition, after disposing dies 2006-2008, each of the stacked dies 2005-2008 may be interconnected in a batch or one at a time, according to some embodiments. For example, each of the stacked dies 2005-2008 may have one or more die contacts (not shown) on the top surface 2020 and/or the bottom surface 2021 that are each electrically coupled to at least one die contact of another die 2005-2008 with one or more interconnects 2003. For some embodiments, the interconnects 2003 may be wire bonds, TSVs, through mold vias (TMVs), inkjet printed interconnects, three-dimensional (3D) printed interconnects, and/or anisotropic conductive film (ACF). As shown in the cross-sectional view of FIG. 20E, the package layer 2000 shows the second dies 2006-2008 disposed on the top surface 2020 of the first die 2005, where each of the dies 2005-208 are electrically coupled with interconnects 2003.

Referring now to FIG. 20F, the package layer 2000 includes forming a second encapsulation layer 2012 around the second plurality of dies 2006-2008 and on the top surface 2002a of the first encapsulation layer 2002 (note that this may include portions of the top surfaces of the first plurality of dies 2005), according to one embodiment. In addition, for some embodiments, the second encapsulation layer 2012 (e.g., a stiff, opaque epoxy to protect the interconnects 2003) is formed within the dam 2010 filling up to a plurality of top surfaces 2020 of the top dies 2008 and then the second encapsulation layer 2012 is cured. As shown in the cross-sectional view of FIG. 20F, the package layer 2000 illustrates the second encapsulation layer 2012 formed around and over the edges of the second dies 2006-2008, interconnects 2003, and on the top surface 2002a of the first encapsulation layer 2002 (note that this may include portions of the top surface of the first die 2005). Note that the rounded angles (e.g., hill-shaped) of the top surface 2012a of the second encapsulation layer 2012 may increase and end (or plateau) at the top surface 2020 of the topmost die 2008 of the second plurality of dies 2006-2008.

Referring now to FIG. 20G, the package layer 2000 illustrates disposing a third plurality of dies 2009 on the top surfaces 2020 of the topmost dies 2008, according to one embodiment. For some embodiments, the third plurality of dies 2009 may be solar cells. In addition, after disposing dies 2009, each of the third plurality of dies 2009 may be electrically coupled to the other stacked dies 2005-2008 with interconnects 2003, according to one embodiment. As shown in the cross-sectional view of FIG. 20G, the package layer 2000 shows the third die 2009 disposed above the second encapsulation layer 2012 and on the top surface 2020 of the die 2008.

Referring now to FIG. 20H, the package layer 2000 includes forming a third encapsulation layer 2022 over and around the third plurality of dies 2009 and on the top surface 2012a of the second encapsulation layer 2012 (note that this may include portions of the top surfaces of the dies 2008), according to one embodiment. In addition, for some embodiments, the third encapsulation layer 2022 (e.g., a transparent material to facilitate the third dies 2009) is formed within the dam 2010 filling up above the top surfaces 2020 of the third dies 2009—but below the top level/height of the dam—and then the third encapsulation layer 2022 is cured.

Furthermore, the top surface 2022a of the third encapsulation layer 2022 may be compressed with a compression plunger (not shown) to flatten the top surface 2022a if needed. Note, however, that even if the top surface 2022a is compressed, the top surface 2022a may have a similar hill-shaped angle as the other encapsulation layers (e.g., top surfaces 2002a and 2012a of the encapsulation layers 2002 and 2012). As such, after the third encapsulation layer 2022 is deposited, the package layer 2000 has formed a plurality of semiconductor packages 2045, according to some embodiments. Note that the package layer 2000 may have fiducial lines 2025 (shown as dashed lines) formed based on the set second of fiducials 2015 to facilitate the singulation of each of the plurality of semiconductor packages 2045 (e.g., as an individual unit shown with the semiconductor package 2050). For example, at this step of the process flow, the fiducial lines 2025 on the package layer 2000 form a plurality of individual semiconductor packages that were assembled (e.g., forty-eight individual semiconductor packages/units may be singulated, where each unit may be illustrated as semiconductor package 2050).

As shown in the cross-sectional view of FIG. 20H, a semiconductor package 2050 is illustrated. For some embodiments, the semiconductor package 2050 may have the third encapsulation layer 2022 formed over and around the third die 2009, interconnects 2003, and on the top surface 2012a of the second encapsulation layer 2012 (note that this may include portions of the top surfaces of the die 2008). As described above, the top surface 2022a of the third encapsulation layer 2022 may be compressed to flatten the top surface above the die 2009, but all of the surface 2022a of the third encapsulation layer 2022 may not be planar (i.e., angled as the other top surfaces 2002a and 2012a of the encapsulation layers 2002 and 2012).

Furthermore, each of the semiconductor packages (e.g., semiconductor package 2050) may now be singulated along the fiducials 2025 (shown with the dashed lines) to form each individual package. Accordingly, the adhesive layer 2030 and the panel 2001 may then be removed (in either order), where the die 2005 may have an exposed bottom surface 2021, according to some embodiments. Note that as the surface tension is leveraged and in some instances surface treatments (such as plasma) are used to modify the wetting angles of the multiple encapsulation layers to promote adhesion, the resulting multi-material stack (or the multiple encapsulation layers of the package) may have a meniscus atypical of molding (or encapsulation). That is, after depositing each encapsulation layer into the cavity of the dam, each of the encapsulation layers may rescind and form a curved upper surface (as shown with surface 2002a and 2012a of FIG. 20F) and the upper encapsulation layers may have a larger curved upper surface than the lower curved upper surface (as shown with surface 2012a of FIG. 20F compared to surface 2002a of FIG. 20F), according to some embodiments. Note that a meniscus encapsulation shape for each of the encapsulation layers is unlike the flatten surface that is formed with a typical encapsulation process.

Note that the process flow, as described above in FIGS. 20A-20H, may also be leveraged by adding one or more packaging components, such as the PCB (e.g., PCB 160 of FIG. 1B and/or the PCB of FIGS. 13-18), and/or the one or more antennas (e.g., antennas 1370, 1470, and 1570 of FIGS. 13-15) to re-distribute the signals or enable further features on the package. Also note that the process flow illustrated in FIGS. 20A-20H may include fewer or additional packaging components based on the desired packaging design, including any combination and number of dies, interconnects, encapsulation layers, and encapsulation materials. Also note that a plurality of dies (e.g., the first plurality of dies, the second plurality of dies, and the third plurality of dies) are not limited to two or more dies, i.e., only a single die may be added at each stage/step.

FIG. 21 is a process flow illustrating a method of forming a package layer having a plurality of device packages, a plurality of interconnects, and one or more encapsulation layers that are stacked, according to one embodiment. FIG. 21 illustrates the process flow used to form a semiconductor package (e.g., semiconductor package 2050 of FIG. 20H) with a dimension tolerant, multi-material stack, according to one embodiment. In addition, the process flow 2100 may be similar to the method of forming a package layer (e.g., package layer 2000) having a plurality of semiconductor packages as shown in FIGS. 20A-H.

At block 2105, the process flow forms a panel with a first set of fiducials that are covered with an adhesive layer (as shown in FIG. 20A). At block 2110, the process flow disposes a dam on the adhesive layer and forms a set second of fiducials with a laser to denote singulation patterns (as shown in FIG. 20B). At block 2115, the process flow disposes a first plurality of dies on the adhesive layer (as shown in FIG. 20C). For example, the first plurality of dies are disposed on the adhesive layer using the second set of fiducials to align each die within a prescribed array within the dam.

At block 2120, the process flow forms a first encapsulation layer around the first plurality of dies, where the first encapsulation layer is formed within the dam filling the dam up to a plurality of top surfaces of the first plurality of dies (as shown in FIG. 20D). At block 2125, the process flow disposes a second plurality of dies on the top surfaces of the first plurality of dies, where each of the dies may have one or more die contacts on a top surface and/or a bottom surface that are each electrically coupled to at least one die contact of another die with one or more interconnects (as shown in FIG. 20E). For some embodiments, the second plurality of dies may include one or more different dies. In addition, each of the stacked dies may be interconnected in a batch or one at a time, according to some embodiments.

At block 2130, the process flow forms a second encapsulation layer around the second plurality of dies and on the top surface of the first encapsulation layer, where the second encapsulation layer is formed within the dam filling the dam up to a plurality of top surfaces of the second plurality of dies (as shown in FIG. 20F). At block 2135, the process flow disposes a third plurality of dies on the top surfaces of the topmost dies of the second plurality of dies, where each of the third plurality of dies may be electrically coupled to the other stacked dies with the interconnects (as shown in FIG. 20G). At block 2140, the process flow forms a third encapsulation layer over and around the third plurality of dies and on the top surface of the second encapsulation layer, where here the third encapsulation layer is formed within the dam filling the dam over the top surfaces of the third plurality of dies but below the top level of the dam (as shown in FIG. 20H). Lastly, at block 2145, the process flow singulates the plurality of semiconductor packages along one or more fiducial lines to form an individual semiconductor package. Note that at block 2145, the process flow may further remove the adhesive layer and the panel (in either order), where each of the first plurality of dies may have an exposed bottom surface, according to some embodiments.

Note that the process flow 2100 may form a semiconductor package that may include fewer or additional packaging components based on the desired packaging design. For example, the semiconductor package may include any configuration needed, including additional encapsulation layers and any combination and/or number of dies, interconnects, and encapsulation materials.

Figure 22:
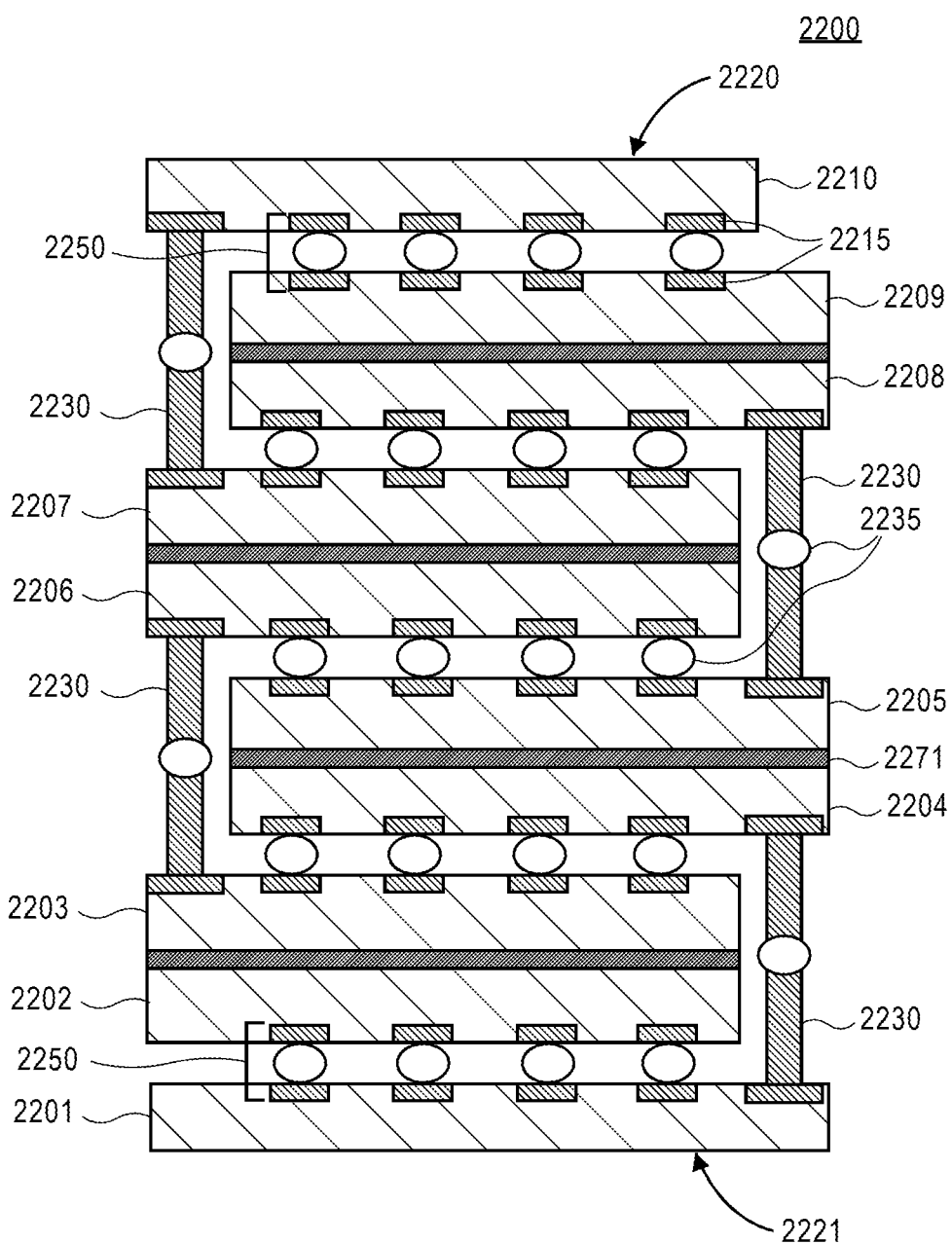
FIG. 22 is a cross-sectional view of a semiconductor package having one or more substrates, one or more interconnects, and one or more pillars, according to one embodiment.

FIG. 22 illustrates a cross-sectional view of a semiconductor package 2200 having one or more substrates 2201-2210, one or more interconnects 2250, and one or more pillars 2230, according to one embodiment. For some embodiments, the semiconductor package 2200 includes stacked substrates 2201-2210 that may be formed vertically using interconnects 2250 and pillars 2230—without using, for example, wire bonds, through silicon vias (TSVs), or through mold vias. For example, as described below in further detail, the semiconductor package 2200 may implement a TSV-less die stacking of substrates 2201-2210 with pillars 2230 (also referred to as plated pillars), adhesive layers 2271, and interconnects 2250 for added functionality of the ultra-small form factor systems, such as reducing the overall z-height and volume by circumventing TSV and/or wire bond stacked dies and interconnects.

For some embodiments, the semiconductor package 2200 may implement a flip-chip process with interconnects 2250 along with one or more plated pillars 2230 to interconnect the various layers of substrates 2201-2210, where the plated pillars 2230 are disposed on the periphery of two or more substrates 2201-2210 (e.g., one plated pillar 2230 is formed at the periphery edges of substrates 2201 and 2204 as shown in FIG. 22). As used herein, a "pillar" (or plated pillar) may refer to a conductive via formed to electrically couple one or more substrates/layers without the need for wire bonding or TSVs. As shown for example in FIGS. 22-27, these longer pillars (e.g., pillars 2230 of FIG. 22) help to connect the various layers/substrates of a semiconductor package. Further, as used herein, the "pillar" may be formed using a copper pillar(s), where a photoresist layer is spun onto a wafer and photolithography is then used to create arrays of wells/molds as the copper is then electroplated to form these longer pillars (e.g., reaching aspect ratios as high as 6:1).

For example, as shown in FIG. 22, pillars 2230 may be formed to interconnect two or more substrates 2201-2210 having one pillar joined with another pillar with a solder bump 2235. For some embodiments, substrates 2201-2210 are stacked in layers with adhesive layers 2271 in between one or more substrates 2201-2210 (e.g., substrate 2202 is joined with substrate 2203 with adhesive layer 2271). For some embodiments, interconnects 2250 may be formed with two or more pads 2215 of two substrates 2201-2210 joined by a solder bump 2235. For example, substrate 2201 may be joined to substrate 2201 with four interconnects 2250 as substrate 2201 is then joined with substrate 2204 with pillars 2230.

According to some embodiments, substrates 2201-2210 may include, but are not limited to, semiconductor dies (e.g., processors, sensors, etc.), organic substrates (e.g., PCBs), passive devices (e.g., decoupling capacitors/power delivery inductors), MEMS devices, or any other types of components/devices. In addition, solder bumps 2235 may formed with solder, controlled collapse chip connection (C4) bumps, ACF, or other conductive layers/materials. For some embodiments, adhesive layers 2271 may be die-attach film or any other adhesive material.

Referring now to FIG. 22, the semiconductor package 2200 may have ten substrates 2201-2210 that are vertically attached with four pillars 2230 and a plurality of interconnects 2250 and four adhesive layers 2271. For one embodiment, the plurality of interconnects 2250 may include a plurality of pads 2215 and a plurality of solder bumps 2235. For some embodiments, the plurality of solder bumps 2235 may be used to interconnect the plurality of die pads 2215 (i.e., forming interconnects 2250) and the one or more pillars 2230. For some embodiments, each of the substrates 2201-2210 may have a top surface 2220 and a bottom surface 2221, where for example substrate 2202 may have a plurality of pads 2210 on the bottom surface 2221 of the substrate 2202 that are electrically coupled to a plurality of pads 2210 on the top surface 2220 of the substrate 2201, and an adhesive layer 2271 on the top surface 2220 of substrate 2202 that is attached to the bottom surface 2221 of substrate 2203.

For some embodiments, pillars 2230 may be formed to interconnect substrate 2201 to substrate 2204, substrate 2203 to substrate 2206, substrate 2205 to substrate 2208, and substrate 2207 to substrate 2210. Note that each of the pillars 2230 may be used to interconnect more than two substrates. In addition, adhesive layers 2271 may be formed between substrates 2202-2203, 2204-2205, 2206-2207, and 2208-2209. Also note that each substrate 2201-2210 may have interconnects 2250 on both surfaces, however to reduce the overall z-height of the package 2200, pads 2215 are only located on one of the surfaces of each substrate 2201-2210.

According to some embodiments, by utilizing flip-chip interconnects (e.g., interconnects 2250 and pillars 2230) without TSVs, the method of forming the semiconductor package 2200 may be simplified and reduce the cost of the wafer manufacturing process. That is, by circumventing wire bonding, the semiconductor package 220 may enable more robust architecture(s) (without having to worry about damaging wires) and increase the number of interconnects per given volume. As shown in FIG. 22, the semiconductor package 2200 using a flip-chip process allows the use of more of the substrate area for interconnects without having to grow the size of the substrate. Also, for some embodiments, only a few substrates (e.g., substrates 2201-2210) may need an increased number of interconnects (e.g., CPU to memory, where face-to-face bonding may provide significant advantages), whereas the substrates may need a relatively small number of interconnects (e.g., 2-3 interconnects may be needed for an energy harvester or a battery, and 5-6 interconnects may be needed for sensors).

Furthermore, some of the additional advantages of using TSV-less die stacking with plated pillars (e.g., as shown in FIGS. 22-27) are: (i) a lowered manufacturing cost as the use of TSVs in manufacturing of dies may increase cost; (ii) a reduction of manufacturing steps (i.e., a reduction in complexity and difficulty) as the use of wire bonding, for example, are fragile and may need to be protected carefully to ensure they are not bent (which may cause shorts) or damaged (which may cause opens); (iii) a lowered overall volume of the package as the use of wire bonds, for example, increase the volume of the system by requiring the substrates to be offset from one another to accommodate the wire bond pads and, if more connections are needed, more wire bond pads must be added also increasing the volume of the package; and (iv) applicable for systems needing very low power systems as the use of wire bonds, for example, may likely have higher resistance and inductance.

Note that the semiconductor package 2200 may include fewer or additional packaging components based on the desired packaging design, including any combination and number of substrates (dies, MEMS, and/or organic substrates), adhesive layers, interconnects, solder (or ACF), and pillars.

Figure 23:
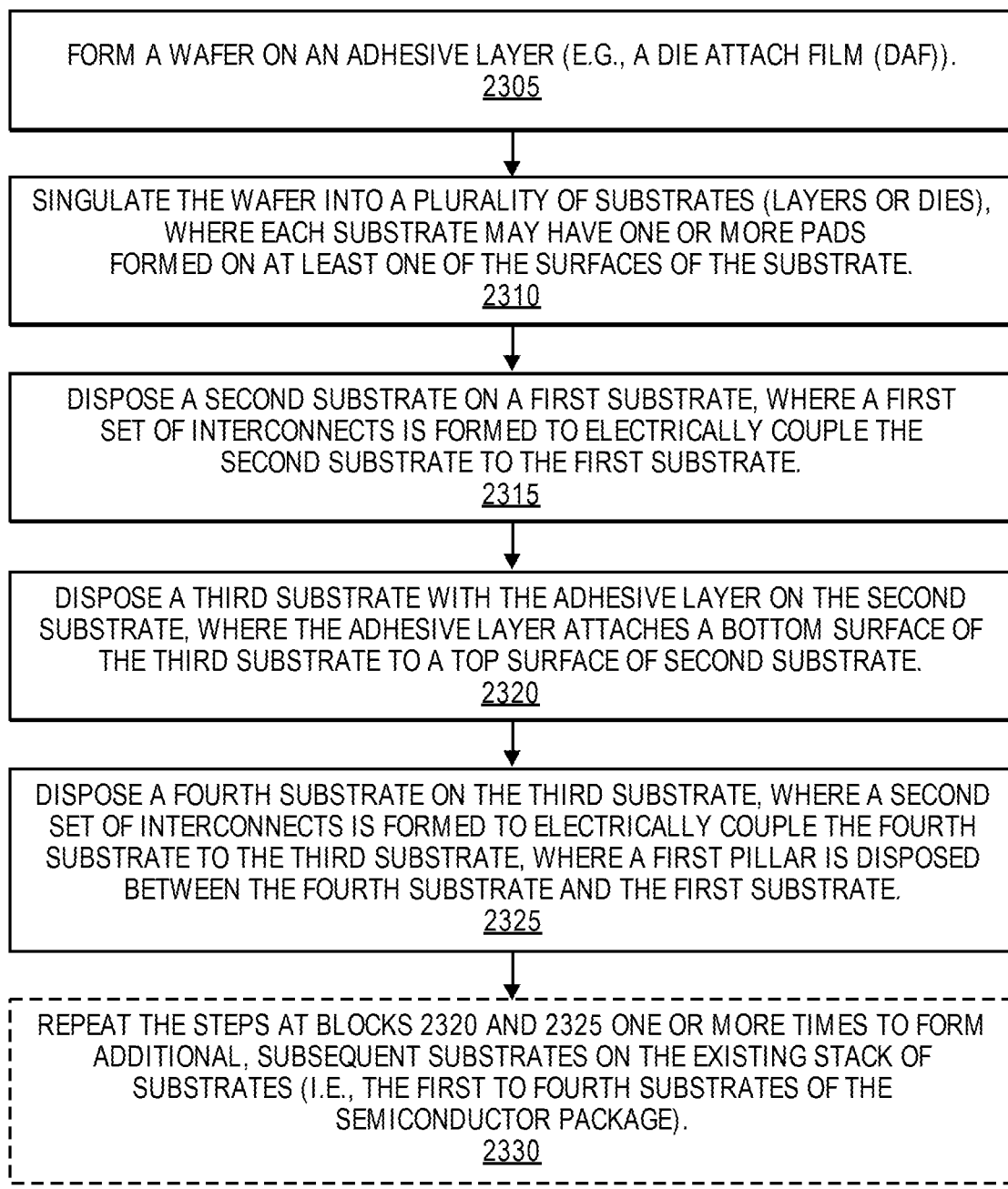
FIG. 23 is a process flow illustrating a method of forming a semiconductor package having one or more substrates, one or more interconnects, and one or more pillars, according to one embodiment.

FIG. 23 is a process flow 2300 illustrating a method of forming a semiconductor package having one or more substrates, one or more interconnects, and one or more pillars, according to one embodiment. For some embodiments, the process flow 2300 may be used to form a semiconductor package as shown in FIGS. 22 and 24-27. According to some embodiments, the process flow 2300 may be implemented to form a TSV-less die stacking package with plated pillars, after the wafer has been grinded and the pillars have been formed to have a desired height(s).

At block 2305, the process flow forms a wafer on an adhesive layer (e.g., a die attach film (DAF)). For one embodiment, the process flow may form the wafer with DAF on a temporary carrier (e.g., a temporary adhesive, such as a UV release dicing tape). At block 2310, the process flow singulates the wafer into a plurality of substrates (layers or dies), where each substrate may have one or more pads formed on at least one of the surfaces of the substrate. At block 2315, the process flow disposes a second substrate on a first substrate, where a first set of interconnects is formed to electrically couple the second substrate to the first substrate. For example, the process flow may use solder bumps or ACF to form the first set of interconnects between the pads of the first and second substrates to initialize the stack.

At block 2320, the process flow disposes a third substrate with the adhesive layer on the second substrate, where the adhesive layer attaches a bottom surface of the third substrate to a top surface of second substrate. At block 2325, the process flow disposes a fourth substrate on the third substrate, where a second set of interconnects is formed to electrically couple the fourth substrate to the third substrate, where a first pillar is disposed between the fourth substrate and the first substrate. At block 2330, the process flow may repeat (or return back to) the steps at blocks 2320 and 2325 one or more times to form additional, subsequent substrates on the existing stack of substrates (i.e., the first to fourth substrates of the semiconductor package).

Note that the semiconductor package of FIG. 23 sets forth one embodiment used to form a TSV-less substrate stacking. As such, the semiconductor package formed by FIG. 23 may include fewer or additional packaging components based on a desired packaging design, including any combination and number of substrates (dies, MEMS, and/or organic substrates), adhesive layers, interconnects, solder (or ACF), and pillars.

FIGS. 24-27 are cross-sectional views of semiconductor packages having one or more substrates, one or more interconnects, and one or more pillars, according to some embodiments. The semiconductor packages 2400, 2500, 2600, and 2700 of FIGS. 24-27 are similar to the semiconductor package 2200 of FIG. 22, however these semiconductor packages 2400, 2500, 2600, and 270 have one or more alternative configurations for each TSV-less substrate stacking using platted pillars. For example, a semiconductor packages (as shown below in FIGS. 24-27) may have a stack of semiconductor dies and organic substrates, a stack interconnected with ACF, and a stack interconnects with adhesive layers (e.g., DAFs) and a smaller number of interconnects.

Figure 24:
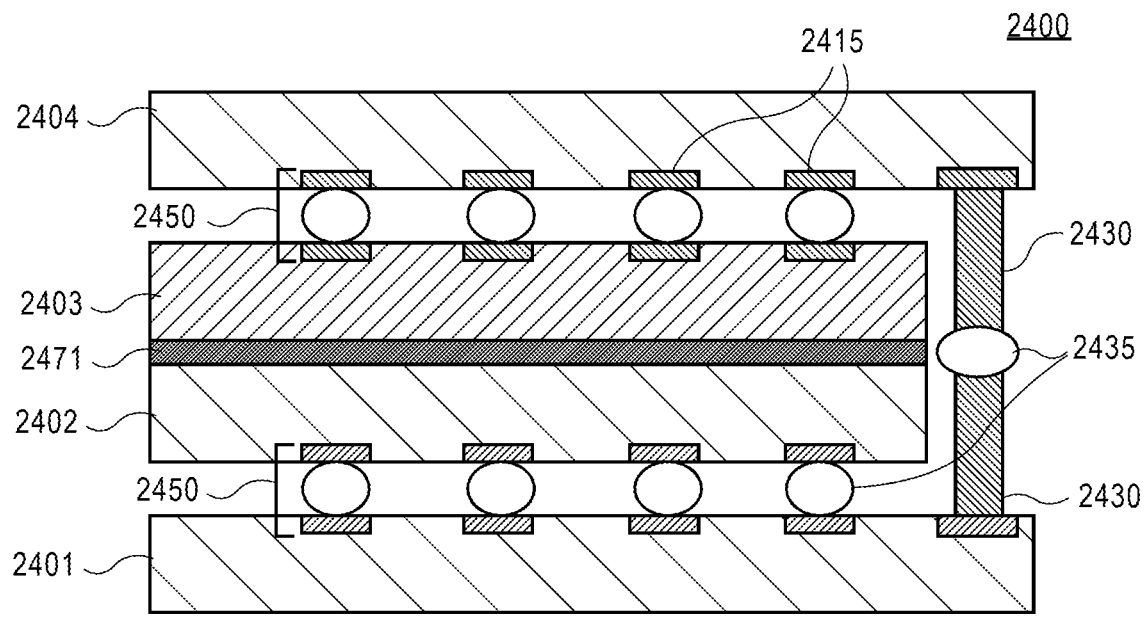
FIGS. 24-27 are cross-sectional views of semiconductor packages having one or more substrates, one or more interconnects, and one or more pillars, according to some embodiments.

Referring now to FIG. 24, a semiconductor package 2400 may have one or more substrates 2401-2404, a plurality of interconnects 2450, and platted pillars 2430. For one embodiment, the semiconductor package 2400 may have four substrates (or any number of substrates), where the substrate 2401 is a first die, the substrate 2402 is a second die, the substrate 2403 is an organic substrate, and the substrate 2404 is a MEMs device. For example, the semiconductor packages may include a combination of dies, organic substrates, MEMs devices, and any other type of components that may serve a variety of purposes. In addition, the substrates 2402-2403 may be attached with an adhesive layer 2471, while the other substrates are interconnected with the plurality of interconnects 2450 and the platted pillars 2430. For one embodiment, the interconnects 2450 may include a plurality of solder bumps 2435 formed in between one or more pads 2415.

Figure 25:
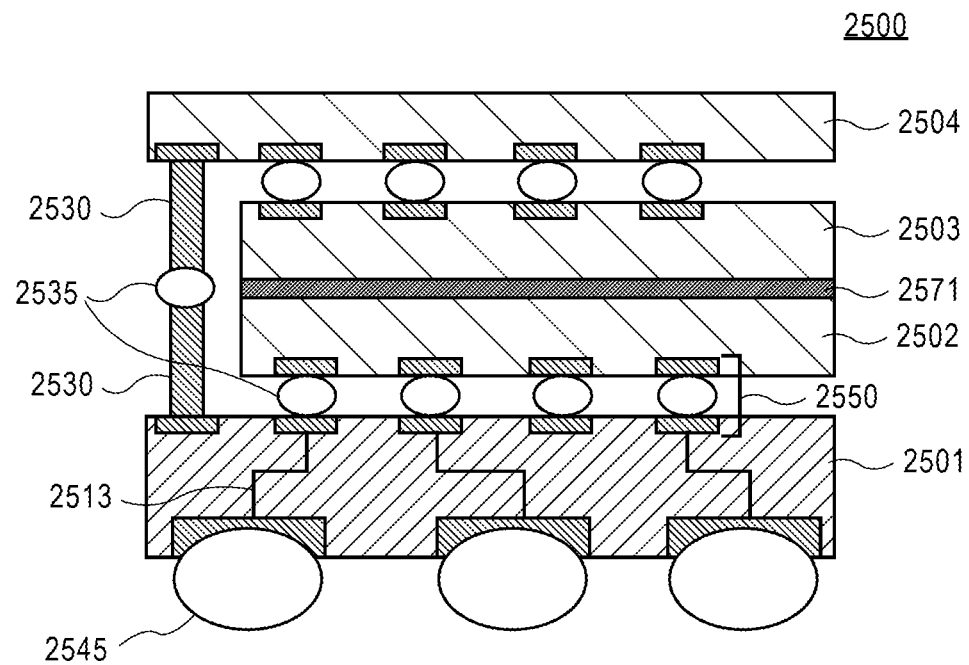

Referring now to FIG. 25, a semiconductor package 2500 may have one or more substrates 2501-2504, a plurality of interconnects 2550, and platted pillars 2530. For one embodiment, the semiconductor package 2500 may have four substrates (or any number of substrates), where the substrate 2501 is an organic substrate and the substrates 2502-2504 are dies. For example, the semiconductor package 2500 does not have to be a stand-alone system. That is, for example, the semiconductor package 2500 may be attached to an organic substrate and then surface-mounted to a board or any other system with a plurality of solder bumps 2545. In addition, for one embodiment, the semiconductor package 2500 may have the stack be embedded into an organic substrate either as standalone or with interconnects 2513 within the organic substrate. For some embodiments, the substrates 2502-2503 may be attached with an adhesive layer 2571, while the other substrates are interconnected with the plurality of interconnects 2550 and the plated pillars 2530. For one embodiment, the interconnects 2550 may include a plurality of solder bumps 2535 formed in between one or more pads 2515.

Figure 26:
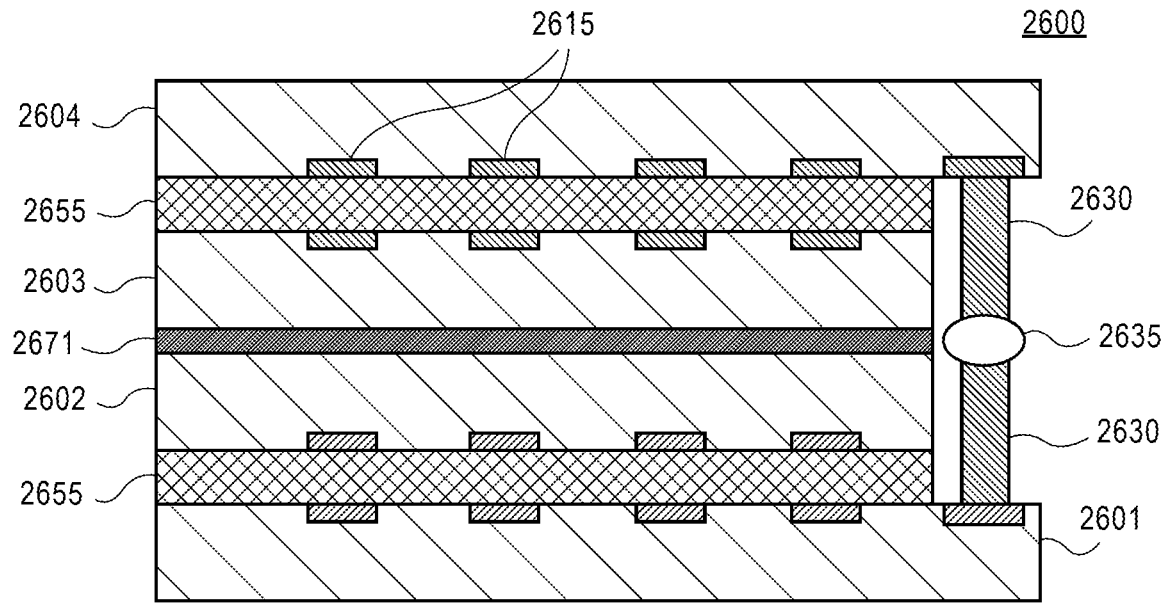

Referring now to FIG. 26, a semiconductor package 2600 may have one or more substrates 2601-2604, one or more interconnects 2655, and plated pillars 2630. For one embodiment, the semiconductor package 2600 may have four substrates (or any number of substrates), where each of the substrates 2601-2604 are dies (note that the substrate may also be organic substrates and MEMs devices). As shown in FIG. 26, the semiconductor package 2600 may have one or more interconnects 2655 formed between the pads 2715 and the substrates 2601-2602 and 2603-2604 using ACF (or any other materials). For one embodiment, each of these interconnects 2655 may be formed with two or more pads of two substrates coupled with an ACF layer (rather than using a solder bump). For example, these systems (e.g., semiconductor package 2600) may generally only need very few interconnects at very low powers (<10) as the interconnects tend to carry very low currents. In addition, the substrates 2602-2603 may be attached with an adhesive layer 2671, while the other substrates 2601 and 2604 are interconnect with the platted pillars 2630 that may have a solder pump 2635 formed between (or joining) the pillars 2630.

Figure 27:
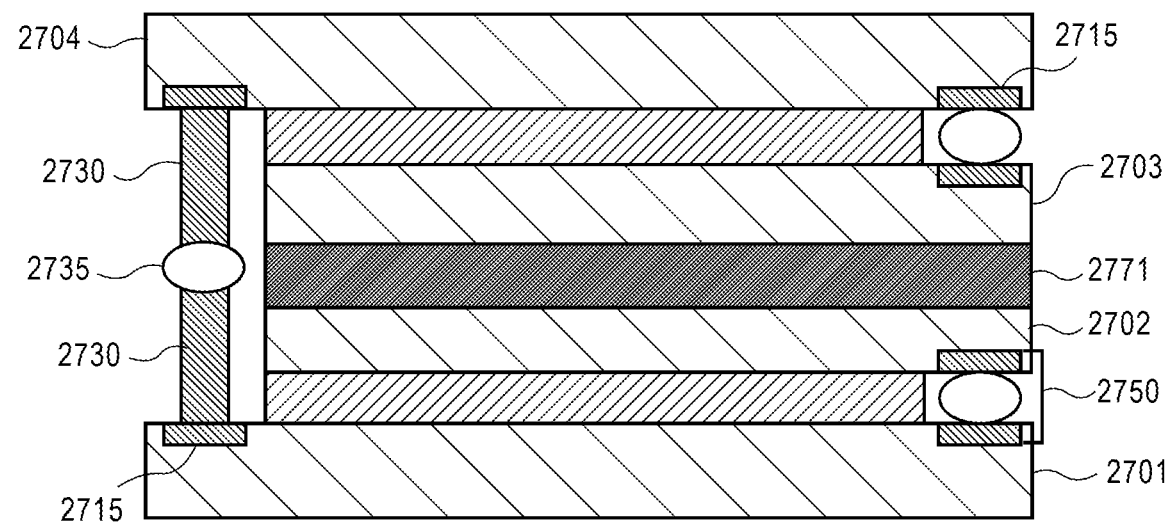

Referring now to FIG. 27, a semiconductor package 2700 may have one or more substrates 2701-2704, one or more interconnects 2750, and plated pillars 2730. For one embodiment, the semiconductor package 2700 may have four substrates (or any number of substrates), where each of the substrates 2701-2704 are dies (note that the substrate may also be organic substrates, MEMs devices, sensors, LEDs and/or solar cells, etc.). As shown in FIG. 27, the semiconductor package 2700 may have a small number of interconnects 2750 as such it may be possible to use one or more adhesive layers 2771 (e.g., DAFs) as the main attach and use the pillars 2730 as the sole interconnects. For example, the substrates 2701-2704 may be stacked/formed with one or more adhesive layers 2771 in between the substrates using one or more solder bumps 2735 to interconnect the one or more interconnects 2750 and pillars 2730. For one embodiment, the interconnects 2750 may include solder bumps 2735 formed in between one or more pads 2715.

Note that the semiconductor packages 2400, 2500, 2600, and 2700 of FIGS. 24-27 may include fewer or additional packaging components based on the desired packaging design, including any combination and number of substrates (dies, MEMS, and/or organic substrates), adhesive layers, interconnects, solder (or ACF), and pillars.

Figure 28:
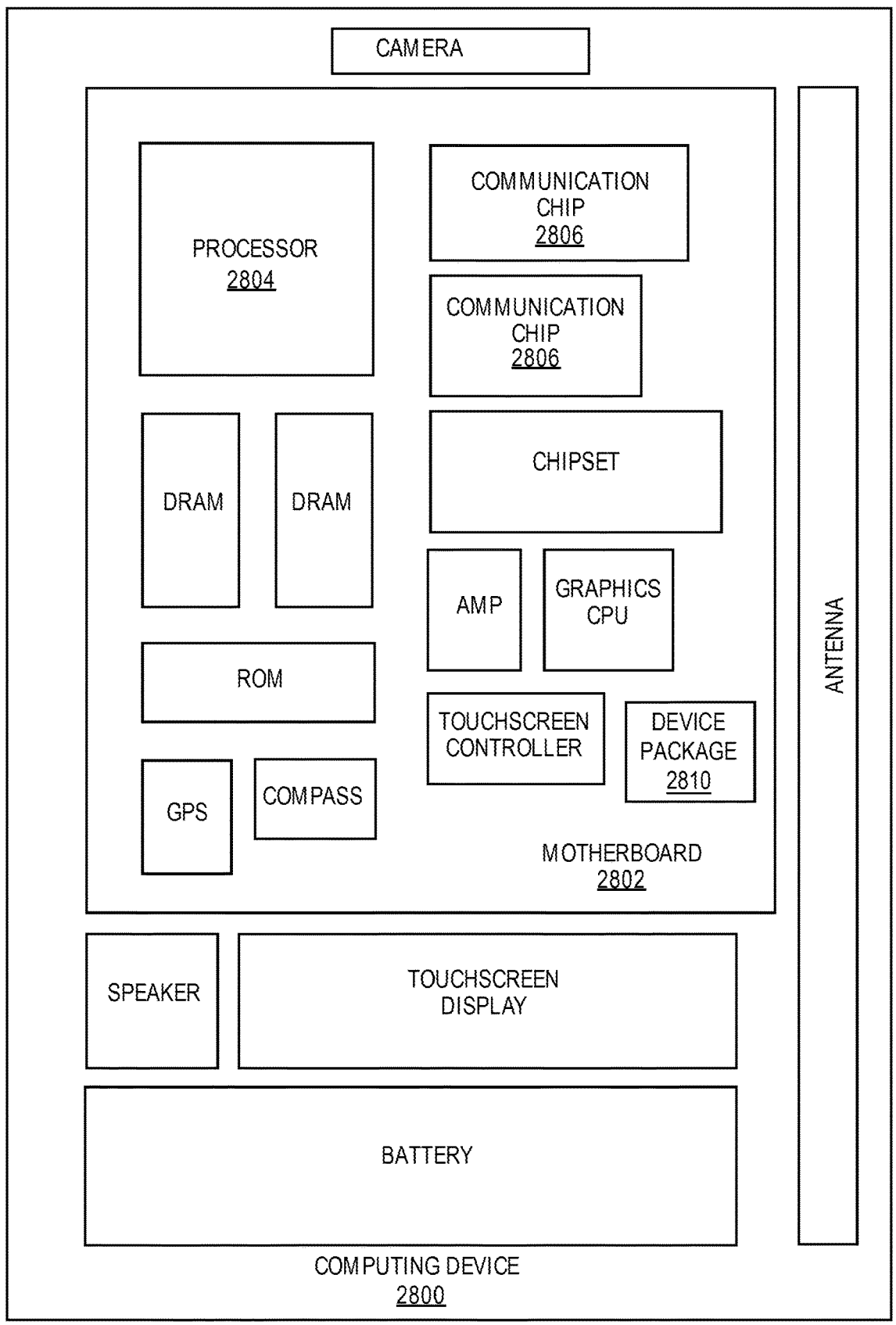
FIG. 28 is a schematic block diagram illustrating a computer system that utilizes a semiconductor package, according to one embodiment.

FIG. 28 is a schematic block diagram illustrating a computer system that utilizes a device package, as described herein. FIG. 28 illustrates an example of computing device 2800. Computing device 2800 houses motherboard 2802. Motherboard 2802 may include a number of components, including but not limited to processor 2804, device package 2810 (e.g., semiconductor packages of FIGS. 1-27), and at least one communication chip 2806. Processor 2804 is physically and electrically coupled to motherboard 2802. For some embodiments, at least one communication chip 2806 is also physically and electrically coupled to motherboard 2802. For other embodiments, at least one communication chip 2806 is part of processor 2804.

Depending on its applications, computing device 2800 may include other components that may or may not be physically and electrically coupled to motherboard 2802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 2806 enables wireless communications for the transfer of data to and from computing device 2800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 2806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 2800 may include a plurality of communication chips 2806. For instance, a first communication chip 2806 may be dedicated to shorter range wireless communications such as Wi-Fi and Bluetooth and a second communication chip 2806 may be dedicated to longer range wireless communications such as GPS, EDGE, GPRS, CDMA, WiMAX, LTE, Ev-DO, and others.

Processor 2804 of computing device 2800 includes an integrated circuit die packaged within processor 2804. Device package 2810 may be, but is not limited to, silicon dies (e.g., dies with an ultra-small form factor), a packaging substrate, and/or a printed circuit board. Device package 2810 may include dies and interconnects that are adjacent to a PCB, where the device package 2810 further includes one or more encapsulation layers over the dies, interconnects, and the PCB. For example, the device package 2810 may be an ultra-small form factor (SFF) system using a printed circuit board (PCB) as an encapsulation base, where the PCB may include plated pillars, multi-encapsulation layers, and double-sided interconnects (as shown in FIGS. 1-27). Note that device package 2810 may be a single component or a subset of components of the computing device 2800, or the device package 2810 may be an entire stand-alone system that operates with the computing device 2800.

For some embodiments, the integrated circuit die may be packaged with one or more devices on the device package 2810 that include a thermally stable RFIC and antenna for use with wireless communications. The term "processor" may refer to any device or portion of a device that processes electronic data from registers and/or memory to transform that electronic data into other electronic data that may be stored in registers and/or memory.

At least one communication chip 2806 also includes an integrated circuit die packaged within the communication chip 2806. For some embodiments, the integrated circuit die of the communication chip may be packaged with one or more devices on the device package 2810, as described herein.

The following examples pertain to further embodiments. The various features of the different embodiments may be variously combined with some features included and others excluded to suit a variety of different applications.

The following examples pertain to further embodiments:

Example 1 is a device package, comprising a plurality of substrates disposed on top of one another to form a stack, wherein each substrate has a top surface and a bottom surface that is opposite from the top surface; a plurality of pads formed on at least one of the top surface and the bottom surface of each of the substrates; a plurality of interconnects electrically coupling at least one of the top surface and the bottom surface of each substrate to at least one of the top surface and the bottom surface of another substrate; one or more pillars disposed between at least one of the top surface and the bottom surface of one or more substrates of the plurality of substrates to at least one of the top surface and the bottom surface of other substrates of the plurality of substrates; and one or more adhesive layers formed between at least one of the top surface and the bottom surface of one or more substrates of the plurality of substrates to at least one of the top surface and the bottom surface of other substrates of the plurality of substrates.

In example 2, the subject matter of example 1 can optionally include each of the interconnects has a solder bump formed between one pad of one substrate and another pad of another substrate.

In example 3, the subject matter of examples 1-2 can optionally include each of the one or more pillars includes a solder bump formed between one pillar of one substrate and another pillar of another substrate.

In example 4, the subject matter of examples 1-3 can optionally include each of the one or more pillars has a first end and a second end that is opposite from the first end. The first end is electrically coupled to one of the pads of one substrate and the second end is electrically coupled to one of the pads of another substrate.

In example 5, the subject matter of examples 1-4 can optionally include each of the one or more pillars is vertically disposed on the periphery of at least two or more substrates of the plurality of substrates.

In example 6, the subject matter of examples 1-5 can optionally include each of the interconnects has a conductive layer formed between one pad of one substrate and another pad of another substrate.

In example 7, the subject matter of examples 1-6 can optionally include the one or more adhesive layers are die attach films.

In example 8, the subject matter of examples 1-7 can optionally include the conductive layer includes an anisotropic conductive film.

In example 9, the subject matter of examples 1-8 can optionally include each of the substrates has a semiconductor device, a micro-electromechanical system device, and an organic substrate.

In example 10, the subject matter of examples 1-9 can optionally include the organic substrate is the bottommost substrate and disposed on a motherboard with a plurality of solder bumps.

Example 11 is a method of forming a package device, comprising disposing a wafer on an adhesive layer; severing the wafer into a plurality of substrates, wherein each substrate has a top surface and a bottom surface that is opposite from the top surface, wherein each substrate may have one or more pads formed on at least one of the top surface and the bottom surface of the substrate; disposing a second substrate on a first substrate from the plurality of substrates, where a first set of interconnects is formed to electrically couple the top surface of the first substrate to the bottom surface of the second substrate; disposing a third substrate with the adhesive layer on the second substrate, where the adhesive layer attaches the bottom surface of the third substrate to the top surface of second substrate; disposing a fourth substrate on the third substrate, where a second set of interconnects is formed to electrically couple the top surface of the third substrate to the bottom surface of the fourth substrate; and disposing a first pillar between the top surface of the first substrate and the bottom surface of the fourth substrate.

In example 12, the subject matter of example 11 can optionally include each of the interconnects includes a solder bump formed between one pad of one substrate and another pad of another substrate.

In example 13, the subject matter of examples 11-12 can optionally include the first pillar includes a solder bump formed between one pillar of the first substrate and another pillar of the fourth substrate.

In example 14, the subject matter of examples 11-13 can optionally include the first pillar has a first end and a second end that is opposite from the first end. The first end is electrically coupled to one of the pads of the first substrate and the second end is electrically coupled to one of the pads of the fourth substrate.

In example 15, the subject matter of examples 11-14 can optionally include the first pillar is vertically disposed on the periphery of the first substrate and the fourth substrate.

In example 16, the subject matter of examples 11-15 can optionally include each of the interconnects includes a conductive layer formed between one pad of one substrate and another pad of another substrate.

In example 17, the subject matter of examples 11-16 can optionally include the adhesive layer is a die attach film.

In example 18, the subject matter of examples 11-17 can optionally include the conductive layer includes an anisotropic conductive film.

In example 19, the subject matter of examples 11-18 can optionally include each of the substrates includes a semiconductor device, a micro-electromechanical system device, and an organic substrate.

In example 20, the subject matter of examples 11-19 can optionally include the organic substrate is the first substrate and disposed on a motherboard with a plurality of solder bumps.

In example 21, the subject matter of examples 11-20 can optionally include disposing a plurality of substrates on top of the fourth substrate and on top of one another to form a stack; disposing one or more pillars between at least one of the top surface and the bottom surface of one or more substrates of the plurality of substrates to at least one of the top surface and the bottom surface of other substrates of the plurality of substrates; and forming one or more adhesive layers between at least one of the top surface and the bottom surface of one or more substrates of the plurality of substrates to at least one of the top surface and the bottom surface of other substrates of the plurality of substrates.

Example 22 is a device package, comprising a plurality of substrates disposed on top of one another to form a stack, wherein each substrate has a top surface and a bottom surface that is opposite from the top surface, wherein the bottommost substrate is an organic substrate; a plurality of pads formed on at least one of the top surface and the bottom surface of each of the substrates, wherein the organic substrate has pads formed on top surface and the bottom surface, wherein the organic substrate has one or more vias electrically coupling the pads of the top surface and the pads of the bottom surface; a plurality of interconnects electrically coupling at least one of the top surface and the bottom surface of each substrate to at least one of the top surface and the bottom surface of another substrate; one or more pillars disposed between at least one of the top surface and the bottom surface of one or more substrates of the plurality of substrates to at least one of the top surface and the bottom surface of other substrates of the plurality of substrates; and one or more adhesive layers formed between at least one of the top surface and the bottom surface of one or more substrates of the plurality of substrates to at least one of the top surface and the bottom surface of other substrates of the plurality of substrates.

In example 23, the subject matter of example 22 can optionally include the organic substrate is disposed on a motherboard with a plurality of solder bumps formed on the bottom surface pads of the organic substrate. The vias of the organic substrate electrically couple the motherboard to at one or more of the substrates.

In example 24, the subject matter of examples 22-23 can optionally include wherein each of the interconnects includes a solder bump formed between one pad of one substrate and another pad of another substrate. Each of the one or more pillars includes a solder bump formed between one pillar of one substrate and another pillar of another substrate. Each of the interconnects includes a conductive layer formed between one pad of one substrate and another pad of another substrate. The one or more adhesive layers are die attach films. The conductive layer includes an anisotropic conductive film. Each of the substrates includes a semiconductor device, a micro-electromechanical system device, and an organic substrate.

In example 25, the subject matter of examples 22-24 can optionally include each of the one or more pillars has a first end and a second end that is opposite from the first end. The first end is electrically coupled to one of the pads of one substrate and the second end is electrically coupled to one of the pads of another substrate. Each of the one or more pillars is vertically disposed on the periphery of at least two or more substrates of the plurality of substrates.

In the foregoing specification, embodiments have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:
1. A device package, comprising:
  a plurality of substrates disposed on top of one another to form a stack, wherein each substrate has a top surface and a bottom surface that is opposite from the top surface, the plurality of substrates comprising a plurality of substrate pairs, each of the plurality of substrate pairs having a staggered arrangement relative to one another along a vertical direction;
  a plurality of pads formed on at least one of the top surface and the bottom surface of each of the substrates;
  a plurality of interconnects electrically coupling at least one of the top surface and the bottom surface of each substrate to at least one of the top surface and the bottom surface of another substrate;
  one or more pillars disposed between at least one of the top surface and the bottom surface of one or more substrates of the plurality of substrates and at least one of the top surface and the bottom surface of other substrates of the plurality of substrates; and one or more adhesive layers formed between at least one of the top surface and the bottom surface of one or more substrates of the plurality of substrates to at least one of the top surface and the bottom surface of other substrates of the plurality of substrates.

2. The device package of claim 1, wherein each of the interconnects includes a solder bump formed between one pad of one substrate and another pad of another substrate.

3. The device package of claim 1, wherein each of the one or more pillars includes a solder bump formed between one pillar of one substrate and another pillar of another substrate.

4. The device package of claim 3, wherein each of the one or more pillars has a first end and a second end that is opposite from the first end, and wherein the first end is electrically coupled to one of the pads of one substrate and the second end is electrically coupled to one of the pads of another substrate.

5. The device package of claim 1, wherein each of the one or more pillars is vertically disposed on the periphery of at least two or more substrates of the plurality of substrates.

6. The device package of claim 1, wherein each of the interconnects includes a conductive layer formed between one pad of one substrate and another pad of another substrate.

7. The device package of claim 1, wherein the one or more adhesive layers are die attach films.

8. The device package of claim 6, wherein the conductive layer includes an anisotropic conductive film.

9. The device package of claim 1, wherein each of the substrates includes a semiconductor device, a micro-electromechanical system device, and an organic substrate.

10. The device package of claim 9, wherein the organic substrate is the bottommost substrate and disposed on a motherboard with a plurality of solder bumps.

11. A device package, comprising:
a plurality of substrates disposed on top of one another to form a stack, wherein each substrate has a top surface and a bottom surface that is opposite from the top surface, wherein the bottommost substrate is an organic substrate, the plurality of substrates comprising a plurality of substrate pairs, each of the plurality of substrate pairs having a staggered arrangement relative to one another along a vertical direction;
a plurality of pads formed on at least one of the top surface and the bottom surface of each of the substrates, wherein the organic substrate has pads formed on top surface and the bottom surface, wherein the organic substrate has one or more vias electrically coupling the pads of the top surface and the pads of the bottom surface;
a plurality of interconnects electrically coupling at least one of the top surface and the bottom surface of each substrate to at least one of the top surface and the bottom surface of another substrate;
one or more pillars disposed between at least one of the top surface and the bottom surface of one or more substrates of the plurality of substrates and at least one of the top surface and the bottom surface of other substrates of the plurality of substrates; and
one or more adhesive layers formed between at least one of the top surface and the bottom surface of one or more substrates of the plurality of substrates to at least one of the top surface and the bottom surface of other substrates of the plurality of substrates.

12. The device package of claim 11, wherein the organic substrate is disposed on a motherboard with a plurality of solder bumps formed on the bottom surface pads of the organic substrate, and wherein the vias of the organic substrate electrically couple the motherboard to at one or more of the substrates.

13. The device package of claim 11, wherein each of the interconnects includes a solder bump formed between one pad of one substrate and another pad of another substrate, wherein each of the one or more pillars includes a solder bump formed between one pillar of one substrate and another pillar of another substrate, wherein each of the interconnects includes a conductive layer formed between one pad of one substrate and another pad of another substrate, wherein the one or more adhesive layers are die attach films, wherein the conductive layer includes an anisotropic conductive film, and wherein each of the substrates includes a semiconductor device, a micro-electromechanical system device, and an organic substrate.

14. The device package of claim 11, wherein each of the one or more pillars has a first end and a second end that is opposite from the first end, and wherein the first end is electrically coupled to one of the pads of one substrate and the second end is electrically coupled to one of the pads of another substrate, and wherein each of the one or more pillars is vertically disposed on the periphery of at least two or more substrates of the plurality of substrates.

* * * * *